United States Patent
Hosono et al.

(10) Patent No.: US 7,859,907 B2
(45) Date of Patent: Dec. 28, 2010

(54) NON-VOLATILE SEMICONDUCTOR MEMORY

(75) Inventors: Koji Hosono, Yokohama (JP); Hiroshi Nakamura, Fujisawa (JP); Ken Takeuchi, Tokyo-to (JP); Kenichi Imamiya, Tokyo-to (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 12/621,134

(22) Filed: Nov. 18, 2009

(65) Prior Publication Data

US 2010/0061149 A1 Mar. 11, 2010

Related U.S. Application Data

(60) Division of application No. 12/257,828, filed on Oct. 24, 2008, now Pat. No. 7,639,544, which is a continuation of application No. 12/123,157, filed on May 19, 2008, now Pat. No. 7,567,463, which is a division of application No. 11/318,524, filed on Dec. 28, 2005, now Pat. No. 7,379,340, which is a division of application No. 10/664,977, filed on Sep. 22, 2003, now Pat. No. 7,009,878, which is a division of application No. 09/800,913, filed on Mar. 8, 2001, now Pat. No. 6,937,510.

(30) Foreign Application Priority Data

Mar. 8, 2000 (JP) .............................. 2000-063798
Oct. 23, 2000 (JP) .............................. 2000-323199

(51) Int. Cl.
*G11C 11/34* (2006.01)
*G11C 16/06* (2006.01)

(52) U.S. Cl. ..................... 365/185.21; 365/185.03; 365/185.25; 365/185.33; 365/204

(58) Field of Classification Search .............. 365/185.03, 365/185.21, 185.25, 185.33, 189.15, 203, 365/204

See application file for complete search history.

(56) References Cited

U.S. PATENT DOCUMENTS 4,547,685 A   10/1985   Wong (Continued)

FOREIGN PATENT DOCUMENTS

JP   57-152586 A   9/1982

(Continued)

OTHER PUBLICATIONS

Takeuchi et al., "Multipage Cell Architecture for High-Speed Programming Multilevel NAND Flash Memories," IEEE J. Solid-State Circuits, Vo. 33, No. 8, Aug. 1998, pp. 1228-1238.
EP Search Report dtd Oct. 4, 2004, EP App 02023090.0.

*Primary Examiner*—VanThu Nguyen
(74) *Attorney, Agent, or Firm*—Banner & Witcoff, Ltd.

(57) ABSTRACT

A non-volatile semiconductor device has a memory cell array having electrically erasable programmable non-volatile memory cells, reprogramming and retrieval circuits that temporarily store data to be programmed in the memory cell array and sense data retrieved from the memory cell array. Each reprogramming and retrieval circuit has first and second latches that are selectively connected to the memory cell array and transfer data. A controller controls the reprogramming and retrieval circuits on a data-reprogramming operation to and a data-retrieval operation from the memory cell array. Each reprogramming and retrieval circuit has a multilevel logical operation mode and a caching operation mode. In the multilevel logical operation mode, re-programming and retrieval of upper and lower bits of two-bit four-level data is performed using the first and the second latches to store the two-bit four-level data in one of the memory cells in a predetermined threshold level range. In the caching operation mode, data transfer between one of the memory cells selected in accordance with a first address and the first latch is performed while data transfer is performed between the second latch and input/output terminals in accordance with a second address with respect to one-bit two-level data to be stored in one of the memory cells.

30 Claims, 49 Drawing Sheets

U.S. PATENT DOCUMENTS

| | | |
|---|---|---|
| 5,163,021 A | 11/1992 | Mehrotra |
| 5,229,965 A | 7/1993 | Inoue |
| 5,521,869 A | 5/1996 | Ishimura et al. |
| 5,602,789 A | 2/1997 | Endoh |
| 5,701,268 A | 12/1997 | Lee et al. |
| 5,724,300 A | 3/1998 | Tanaka et al. |
| 5,748,536 A | 5/1998 | Kwon et al. |
| 5,751,634 A | 5/1998 | Itoh |
| 5,815,436 A | 9/1998 | Tanaka et al. |
| 5,903,495 A | 5/1999 | Takeuchi et al. |
| 5,966,326 A | 10/1999 | Park et al. |
| 5,986,929 A | 11/1999 | Sugiura et al. |
| 6,046,935 A | 4/2000 | Takeuchi et al. |
| 6,064,611 A | 5/2000 | Tanaka et al. |
| 6,259,635 B1 | 7/2001 | Khouri et al. |
| 6,545,909 B2 | 4/2003 | Tanaka et al. |

FOREIGN PATENT DOCUMENTS

| | | |
|---|---|---|
| JP | 57-191890 A | 11/1982 |
| JP | 10-011982 | 1/1998 |
| JP | 10-092186 | 4/1998 |
| WO | 95/34074 | 12/1995 |

|  | BL-POTENTIAL | NODE N1 | NODE N3 | SELECTED WL |
|---|---|---|---|---|
| PROGRAM START |  |  |  |  |
| DATA AFTER LOADED | — | L(LOADED DATA) | — | 0V |
| IN PROGRAMMING | L | L | — | Vpgmi |
| <VERIFY START> |  |  |  |  |
| BL RE-CHARGE BEFORE SENSE | H | L | L(FROM N1) | Vv10 |
| BL POTENTIAL SENSE | L/H | H→L/H | L | Vv10 |
| SENSED NODE RE-CHARGE | L/H | L/H | L | Vv10 |
| DATA STORE | L/H | L(FAIL)/H(PASS) | L | Vv10 |

FIG.32

|  | BL-POTENTIAL | NODE N1 | NODE N3 | SELECTED WL |
|---|---|---|---|---|
| PROGRAM START |  |  |  |  |
| AFTER DATA LOADED | — | H(LOADED DATA) | — | 0V |
| IN PROGRAMMING | H | H | — | Vpgmi |
| <VERIFY START> |  |  |  |  |
| BL PRE-CHARGE BEFORE SENSE | H | H | H(FROM N1) | Vv10 |
| BL POTENTIAL SENSE | L/H | H→L/H | H | Vv10 |
| SENSED NODE RE-CHARGE | L/H | H(FROM N3) | H | Vv10 |
| DATA STORE | L/H | H(PASS) | H | Vv10 |

FIG.33

|  | BL-POTENTIAL | NODE N1 | N3 | N5 | SELECTED WL |
|---|---|---|---|---|---|
| <PROGRAM START> | | | | | |
| AFTER DATA LOADED | — | L (LOADED DATA) | — | L ("11") | 0V |
| IN PROGRAMMING | L | L | — | — | Vpgmi |
| <VERIFY "00" START> | | | | | |
| BL PRE-CHARGE BEFORE SENSE | L (FROM N5) | L | L (FROM N1) | L | Vv00 |
| BL POTENTIAL SENSE | L | H → L | L | L | Vv00 |
| SENSED NODE RE-CHARGE | L | L | L | L | Vv00 |
| DATA STORE | L | L (FAIL) | L | L | Vv00 |
| <VERIFY "01" START> | | | | | |
| BL PRE-CHARGE BEFORE SENSE | H | L | L (FROM N1) | L | Vv01 |
| BL POTENTIAL SENSE | L/H | H → L/H | L (FROM N1) | L | Vv01 |
| SENSED NODE RE-CHARGE | L (FROM N1) | L/H | L | L | Vv01 |
| DATA STORE | L/H | L(FAIL)/ H(PASS) | L | L | Vv01 |

FIG.34

|  | LOADED DATA | NODE N1 | N3 | N5 | SELECTED WL |
|---|---|---|---|---|---|
| <PROGRAM START> | | | | | |
| AFTER DATA LOADED | — | L (LOADED DATA) | — | H ("10") | 0V |
| IN PROGRAMMING | L | L | — | — | Vpgmi |
| <VERIFY "00" START> | | | | | |
| BL PRE-CHARGE BEFORE SENSE | H (FROM N5) | L | L (FROM N1) | H | Vv00 |
| BL POTENTIAL SENSE | L/H | H → L/H | L | H | Vv00 |
| SENSED NODE RE-CHARGE | L/H | L/H | L | H | Vv00 |
| DATA STORE | L/H | L (FAIL) / H (PASS) | L | H | Vv00 |
| <VERIFY "01" START> | | | | | |
| BL PRE-CHARGE BEFORE SENSE | H | ※ H | H (FROM N1) | H | Vv01 |
| BL POTENTIAL SENSE | ※ L | H → ※ L | ※ H | H | Vv01 |
| SENSED NODE RE-CHARGE | ※ L | L (FROM N3) | ※ H | H | Vv01 |
| DATA STORE | ※ L | ※ H (PASS) | ※ H | H | Vv01 |

FIG.35

|  | BL-POTENTIAL | NODE N1 | N3 | N5 | SELECTED WL |
|---|---|---|---|---|---|
| <PROGRAM START> |  |  |  |  |  |
| AFTER DATA LOADED | — | H (LOADED DATA) | — | L ("11") | 0V |
| IN PROGRAMMING | H | H | — | — | Vpgmi |
| <VERIFY "00" START> |  |  |  |  |  |
| BL PRE-CHARGE BEFORE SENSE | L (FROM N5) | H | H (FROM N1) | L | Vv00 |
| BL POTENTIAL SENSE | L | H→L | H | L | Vv00 |
| SENSED NODE RE-CHARGE | L | H (FROM N3) | H | L | Vv00 |
| DATA STORE | L | H (PASS) | H | L | Vv00 |
| <VERIFY "01" START> |  |  |  |  |  |
| BL PRE-CHARGE BEFORE SENSE | H | H | H (FROM N1) | L | Vv01 |
| BL POTENTIAL SENSE | L | H→L/H | H | L | Vv01 |
| SENSED NODE RE-CHARGE | L | H (FROM N3) | H | L | Vv01 |
| DATA STORE | L | H (PASS) | H | L | Vv01 |

FIG.36

|  | LOADED DATA | NODE N1 | N3 | N5 | SELECTED WL |
|---|---|---|---|---|---|
| <PROGRAM START> |  |  |  |  |  |
| AFTER DATA LOADED | — | H (LOADED DATA) | — | H ("10") | 0V |
| IN PROGRAMMING | H | H | — | — | Vpgmi |
| <VERIFY START> |  |  |  |  |  |
| BL PRE-CHARGE BEFORE SENSE | H (FROM N5) | H | H (FROM N1) | H | Vv00 |
| BL POTENTIAL SENSE | L | H→L | H | H | Vv00 |
| SENSED NODE RE-CHARGE | L | H (FROM N3) | H | H | Vv00 |
| DATA STORE | L | H (PASS) | H | H | Vv00 |
| <VERIFY "01" START> |  |  |  |  |  |
| BL PRE-CHARGE BEFORE SENSE | H | H | H (FROM N1) | H | Vv01 |
| BL POTENTIAL SENSE | L | H→L | H | H | Vv01 |
| SENSED NODE RE-CHARGE | L | H (FROM N3) | H | H | Vv01 |
| DATA STORE | L | H (PASS) | H | H | Vv01 |

FIG.37

|  | BL-POTENTIAL | NODE N1 | N3 | SELECTED WL |
|---|---|---|---|---|
| RETRIEVAL "00" START |  |  |  |  |
| BL PRE-CHARGE BEFORE SENSING | H | H | — | Vr 00 |
| BL POTENTIAL SENSING | L/H | H → L/H | — | Vr 00 |
| DATA STORE | L/H | L ("1") / H ("0") | — | Vr 00 |

FIG.38

|  | BL-POTENTIAL | NODE N1 | N3 | SELECTED WL |
|---|---|---|---|---|
| RETRIEVAL "01" START |  |  |  |  |
| BL PRE-CHARGE BEFORE SENSING | H | H | — | Vr 01 |
| BL POTENTIAL SENSING | L/H | H → L/H | — | Vr 01 |
| DATA STORE | L/H | L/H | — | Vr 01 |

FIG.39

|  | BL-POTENTIAL | NODE N1 | N3 | SELECTED WL |
|---|---|---|---|---|
| RETRIEVAL "01" START |  |  |  |  |
| BL PRE-CHARGE BEFORE SENSING | H | H | H (FROM N1) | Vr 10 |
| BL POTENTIAL SENSING | H | H → H | H | Vr 10 |
| SENSED NODE RE-CHARGE | H | L (FROM N3) | H | Vr 10 |
| DATA STORE | H | L ("1") | H | Vr 10 |

FIG.40

|  | BL-POTENTIAL | NODE N1 | N3 | SELECTED WL |
|---|---|---|---|---|
| RETRIEVAL "01" START |  |  |  |  |
| BL PRE-CHARGE BEFORE SENSING | H | L | L (FROM N1) | Vr 10 |
| BL POTENTIAL SENSING | L/H | H → L/H | L | Vr 10 |
| SENSED NODE RE-CHARGE | L/H | L/H | L | Vr 10 |
| DATA STORE | L/H | L ("1") / H ("0") | L | Vr 10 |

FIG.41

| | BL-POTENTIAL | LATCH CONTROL | N4b | N2 | N1 | SELECTED WL |
|---|---|---|---|---|---|---|
| <PROGRAM START> | | | | | | |
| DATA AFTER LOADED | — | | — | H | L (LATCH 1a) | 0V |
| IN PROGRAMMING | L | | — | H | L | Vpgmi |
| <VERIFY "10"> | | | | | | |
| BL PRE-CHARGE | H | | H | H | L | Vv10 |
| RESET | H | NULL | H | H | L | Vv10 |
| BL-POTENTIAL SENSE | L/H | | H→L/H | H | L | Vv10 |
| SENSED DATA RETRIEVAL | L/H | BLSEN1 | L/H | H→L/H | L→L (FAIL) / H (PASS) | Vv10 |

|  | BL-POTENTIAL | LATCH CONTROL | N4b | N2 | N1 | SELECTED WL |
|---|---|---|---|---|---|---|
| <PROGRAM START> |  |  |  |  |  |  |
| DATA AFTER LOADED | — |  | — | L | H (LATCH 1) | 0V |
| IN PROGRAMMING | H |  | — | L | H | Vpgmi |
| <VERIFY "10"> |  |  |  |  |  |  |
| BL PRE- CHARGE | H |  | H | L | H | Vv10 |
| RESET | H | NULL | H | L | H | Vv10 |
| BL- POTENTIAL SENSE | L/H |  | H→L/H | L | H | Vv10 |
| SENSED DATA RETRIEVAL | L/H | BLSEN1 | L/H | L→L/H | H (PASS) | Vv10 |

FIG.49

|  | BL-POTENTIAL | LATCH CONTROL | N4b | N6 | N5 | SELECTED WL |
|---|---|---|---|---|---|---|
| BL PRE- CHARGE | H |  | H | H/L | L/H | Vr10 |
| RESET | H | RST2 | H | H/L→H | L/H→L | Vr10 |
| BL- POTENTIAL SENSE | L/H |  | H→L/H | H | L | Vr10 |
| SENSED DATA RETRIEVAL | L/H | BLSEN2 | L/H | H→L/H | L ("1") / H ("0") | Vr10 |

FIG.50

|  | BL-POTENTIAL | LATCH CONTROL | N4b | N2 | N1 | N5 | SELECTED WL |
|---|---|---|---|---|---|---|---|
| <PROGRAM START> | | | | | | | |
| DATA AFTER LOADED | — | | — | H | L | L ("11" DATA) | 0V |
| IN PROGRAMMING | L | | — | H | L | L | Vpgmi |
| <VERIFY "00"> | | | | | | | |
| BL PRE-CHARGE | L (FROM 5) | | L | H | L | L | Vv00 |
| RESET | L | NULL | L | H | L | L | Vv00 |
| BL-POTENTIAL SENSE | L | | L | H | L | L | Vv00 |
| SENSED DATA RETRIEVAL | L | BLSEN1 | L | H | L (FAIL) | L | Vv00 |
| <VERIFY "01"> | | | | | | | |
| BL PRE-CHARGE | H | | H | H | L | L | Vv01 |
| RESET | H | NULL | H | H | L | L | Vv01 |
| BL-POTENTIAL SENSE | L/H | | H→L/H | H | L | L | Vv01 |
| SENSED DATA RETRIEVAL | L/H | BLSEN1 | L/H | H→L/H | L→L (FAIL) / H (PASS) | L | Vv01 |

FIG.51

|  | BL-POTENTIAL | LATCH CONTROL | N4b | N2 | N1 | N5 | SELECTED WL |
|---|---|---|---|---|---|---|---|
| <PROGRAM START> | | | | | | | |
| DATA AFTER LOADED | — | | — | H | L (LATCH 1a) | L ("10" DATA) | 0V |
| IN PROGRAMMING | L | | — | H | L | H | Vpgmi |
| <VERIFY "00"> | | | | | | | |
| BL PRE-CHARGE | H (FROM 5) | | H | H | L | H | Vv00 |
| RESET | H | NULL | H | H | L | H | Vv00 |
| BL-POTENTIAL SENSE | L/H | | H→L/H | H | L | H | Vv00 |
| SENSED DATA RETRIEVAL | L/H | BLSEN1 | L | H→L/H | L→L (FAIL) / H (PASS) | H | Vv00 |
| <VERIFY "01"> | | | | | | | |
| BL PRE-CHARGE | H | | H | H (L) | L (H) | H | Vv01 |
| RESET | H | NULL | H | H (L) | L (H) | H | Vv01 |
| BL-POTENTIAL SENSE | ※L | | ※H→L | H (L) | L (H) | H | Vv01 |
| SENSED DATA RETRIEVAL | ※L | BLSEN1 | ※L | H (L) | L (H) | H | Vv01 |

FIG.52

|  | BL-POTENTIAL | LATCH CONTROL | N4b | N2 | N1 | N5 | SELECTED WL |
|---|---|---|---|---|---|---|---|
| <PROGRAM START> |  |  |  |  |  |  |  |
| DATA AFTER LOADED | — |  | — | L | H (LATCH 1) | L ("11" DATA) | 0V |
| IN PROGRAMMING | L |  | — | L | H | L | Vpgmi |
| <VERIFY "00"> |  |  |  |  |  |  |  |
| BL PRE- CHARGE | L (FROM 5) |  | L | L | H | L | Vv00 |
| RESET | L | NULL | L | L | H | L | Vv00 |
| BL- POTENTIAL SENSE | L |  | L | L | H | L | Vv00 |
| SENSED DATA RETRIEVAL | L | BLSEN1 | L | L | H (PASS) | L | Vv00 |
| <VERIFY "01"> |  |  |  |  |  |  |  |
| BL PRE- CHARGE | H |  | H | L | H | L | Vv01 |
| RESET | H | NULL | H | L | H | L | Vv01 |
| BL- POTENTIAL SENSE | ※L |  | ※H→L | L | H | L | Vv01 |
| SENSED DATA RETRIEVAL | ※L | BLSEN1 | ※L | L | H (PASS) | L | Vv01 |

FIG.53

|  | BL-POTENTIAL | LATCH CONTROL | N4b | N2 | N1 | N5 | SELECTED WL |
|---|---|---|---|---|---|---|---|
| <PROGRAM START> |  |  |  |  |  |  |  |
| DATA AFTER LOADED | — |  | — | L | H (LATCH 1) | L ("10" DATA) | 0V |
| IN PROGRAMMING | L |  | — | L | H | H | Vpgmi |
| <VERIFY "00"> |  |  |  |  |  |  |  |
| BL PRE- CHARGE | H (FROM 5) |  | H | L | H | H | Vv00 |
| RESET | H | NULL | H | L | H | H | Vv00 |
| BL- POTENTIAL SENSE | ※L |  | ※H→L | L | H | H | Vv00 |
| SENSED DATA RETRIEVAL | ※L | BLSEN1 | L | L | H (PASS) | H | Vv00 |
| <VERIFY "01"> |  |  |  |  |  |  |  |
| BL PRE- CHARGE | H |  | H | L | H | H | Vv01 |
| RESET | H | NULL | H | L | H | H | Vv01 |
| BL- POTENTIAL SENSE | ※L |  | ※H→L | L | H | H | Vv01 |
| SENSED DATA RETRIEVAL | ※L | BLSEN1 | ※L | L | H (PASS) | H | Vv01 |

FIG.54

|  | BL-POTENTIAL | LATCH CONTROL | N4b | N2 | N1 | SELECTED WL |
|---|---|---|---|---|---|---|
| BL PRE-CHARGE | H |  | H | L/H | L/H | Vr00 |
| RESET | H | BLSEN0 | H | H/L →H | L/H→L | Vr00 |
| BL-POTENTIAL SENSE | L/H |  | H→ L/H | H | L | Vr00 |
| SENSED DATA RETRIEVAL | L/H | BLSEN1 | L/H | H→ L/H | L→ L ("1")/H ("0") | Vr00 |

FIG.55

|  | BL-POTENTIAL | LATCH CONTROL | N4b | N2 | N1 | SELECTED WL |
|---|---|---|---|---|---|---|
| BL PRE-CHARGE | H |  | H | H/L | L/H | Vr10 |
| RESET | H | BLSEN0 | H | H/L →H | L/H→L | Vr10 |
| BL-POTENTIAL SENSE | L/H |  | H→ L/H | H | L | Vr10 |
| SENSED DATA RETRIEVAL | L/H | BLSEN1 | L/H | H→ L/H | L→ L ("1")/H ("0") | Vr10 |

FIG.56

|  | BL-POTENTIAL | LATCH CONTROL | N4b | N2 | N1 | SELECTED WL |
|---|---|---|---|---|---|---|
| BL PRE-CHARGE | H |  | H | H | L ("1") | Vr01 |
| RESET | H | NULL | H | H | L | Vr01 |
| BL-POTENTIAL SENSE | ※L |  | ※H →L | H | L | Vr01 |
| SENSED DATA RETRIEVAL | ※L | BLSEN0 | ※L | H | L ("1") | Vr01 |

FIG.57

|  | BL-POTENTIAL | LATCH CONTROL | N4b | N2 | N1 | SELECTED WL |
|---|---|---|---|---|---|---|
| BL PRE-CHARGE | H |  | H | L | H | Vr01 |
| RESET | H | NULL | H | L | H | Vr01 |
| BL-POTENTIAL SENSE | L/H |  | H→ L/H | L | H | Vr01 |
| SENSED DATA RETRIEVAL | L/H | BLSEN0 | L/H | L | H→ L("1") / H ("0") | Vr01 |

FIG.58

NON-VOLATILE SEMICONDUCTOR MEMORY

CROSS REFERENCE TO RELATED APPLICATIONS

This application is a divisional of prior U.S. application Ser. No. 12/257,828, filed Oct. 24, 2008, which is a continuation of prior U.S. application Ser. No. 12/123,157, filed May 19, 2008, now U.S. Pat. No. 7,567,463, issued Jul. 28, 2009, which is a divisional of prior U.S. application Ser. No. 11/318,524, filed Dec. 28, 2005, now U.S. Pat. No. 7,379,340, issued May 27, 2008, which is a divisional of prior U.S. application Ser. No. 10/664,977, filed Sep. 22, 2003, now U.S. Pat. No. 7,009,878, issued Mar. 7, 2006, which is a divisional of prior U.S. application Ser. No. 09/800,913, filed Mar. 8, 2001, now U.S. Pat. No. 6,937,510, issued Aug. 30, 2005, which claims benefit of priority under 35 USC §119 to Japanese Patent Applications Nos. 2000-63798 and 2000-323199 filed on Mar. 8, 2000 and Oct. 23, 2000, respectively, in Japan, the entire contents of which are incorporated by reference herein.

BACKGROUND OF THE INVENTION

The present invention relates to an electrically erasable programmable read-only memory (EEPROM). Particularly, this invention relates to a data-reprogramming/retrieval circuit that temporarily stores data to be programmed or data to be retrieved for a caching function or a multilevel logical function.

Focused on in the semiconductor industry is reduction of cost per bit for high-capacity flash EEPROMs used as a file memory by miniaturization of cell structure with process techniques and also by multilevel logic techniques for high capacity.

FIG. 42 is a circuit block diagram of a data-reprogramming/retrieval circuit (called a page buffer hereinafter) for a multilevel logical operation (four-level logical operation) to store 2-bit data in one non-volatile memory cell in a NAND-type flash EEPROM.

The page buffer is provided with a latch 1 connected to a data input/output terminal I/O via a data input/output buffer 50 and a latch 2 that is not directly connected to the buffer 50.

Provided on a bit line BLs connecting the latch 1 and a flash memory cell 5 are transfer transistors 42 and 62. Provided on a bit line BLo connecting the latch 2 and another flash memory cell 5 are transfer transistors 30 and 61.

Transfer transistors 70 and 71, and 80 and 81 are provided on a line carrying Vdd and a line carrying Vss, respectively.

Provided further are transfer transistors 63 and 64 for transferring a pre-charge potential VA and a shield potential VB to the bit lines BLs and BLo, respectively.

The two bit lines BLs and BLo are selectively connected to, or share the page buffer.

Such a page buffer is disclosed in "A Multipage Cell Architecture for High-Speed Programming Multilevel NAND Flash Memories", IEEE J. Solid-State Circuit Circuits, Vol. 33, pages 1228 to 1238, August 1998, K. Takeuchi et al.

Two bits per cell is realized, as illustrated in FIG. 43A in that a relationship between a threshold level distribution for memory cell and 2-bit logic data is defined for allocation of the first and the second bits to different row addresses, thus achieving programming and retrieval of four-level data to and from one memory cell. The first and the second bits are the upper and the lower bits, respectively, of the two bits, such as, "1" and "0", respectively, of "10".

In programming of the second bit-data, data to be programmed and corresponding to the second multilevel row address is loaded into the latch 1 via the data input/output buffer 50.

When the data to be programmed is "0", programming is performed from a "11"-state to a "10"-state in FIG. 43A. On the other hand, when the data to be programmed is "1", programming is prohibited, so that the "11"-state remains unchanged.

In programming of the first bit-data, as shown in FIG. 44, data to be programmed and corresponding to the first multilevel row address is loaded into the latch 1 via the data input/output buffer 50 while the second bit-data that has been stored in the memory cell 5 is loaded into the latch 2.

When the data to be programmed is "0", programming is performed from the "11"-state to a "01"-state in FIG. 43A when the second-bit data stored in the latch 2 is "1" whereas from the "10"-state to a "00"-state in FIG. 43A when the second-bit data stored in the latch 2 is "0".

On the other hand, when the first-bit data stored in the latch 1 is "1", programming is prohibited, so that the threshold level of the second bit is held as it is and both the "11"- and "10"-states remain unchanged.

In this known structure, a 2-bit logic data is stored in one non-volatile memory cell in which the first-bit data and the second-bit data are handled as data for the first and the second row addresses, respectively, or two addresses (the first and the second row addresses) are allocated for one memory cell.

In retrieval, a word line selection voltage is set in order of Vr00, Vr01 and Vr10, as shown in FIG. 43A.

Data on the voltages Vr00 and Vr01 are loaded into the latches 1 and 2, respectively. Data on the voltage Vr10 is loaded into the latch 1 so that, after the bit line is discharged, it is re-charged or re-discharged with the data in the latches 1 and 2 to meet logically.

Disclosed above is an example of a multilevel logical operation. A page buffer for such an operation, however, requires at least two latches.

Not only high capacity for multilevel logical operation, but also enhancement in programming and retrieval speed for flash EEPROM is required, for example, as illustrated in FIG. 45A.

In FIG. 45A, a memory cell 100 is divided into cells 100a and 100b. After data loading for two pages, the data are programmed in the cells 100a and 100b simultaneously to enhance the programming unit for higher effective programming speed. The programming unit is enhanced to four pages, eight pages, and so on, by dividing the memory cell into a 4-divided array, 8-divided array for further higher effective programming speed.

Increase in the number of cell array division, however, takes a long time to load data for each increase in data unit to be programmed. For example, 1-page (512 bytes) and 4-page data loading at 1-byte data input cycle of 50 ns take about 25 µs and 100 µs, respectively. One programming takes about 200 µs.

The effective programming speed is enhanced with four-fold simultaneous programming unit. On the other hand, the next successive 4-page programming has to wait for about 100 µs that corresponds to 4-page data loading.

Moreover, increase in the number of cell array division requires a large chip and causes high consumption of power.

As discussed above, higher capacity and also higher programming speed are expected for flash EEPROMs.

A programming time in multilevel operation is several times longer than that in two-level operation for storing 1-bit data to one non-volatile memory cell. In multilevel operation, a programming time takes much longer than a data load time, thus increase in the data amount to be programmed at once by cell array division serves to enhance an effective programming speed.

Enhancement in effective programming speed only by cell array division takes a long data load time in two-level operation and is thus inefficient.

SUMMARY OF THE INVENTION

A purpose of the present invention is to provide a non-volatile semiconductor apparatus having a multilevel function for large storage capacity and a caching function for high-speed data load time.

The present invention provides a non-volatile semiconductor device comprising: a memory cell array having electrically erasable programmable non-volatile memory cells; a plurality of reprogramming and retrieval circuits that temporarily store data to be programmed in the memory cell array and sense data retrieved from the memory cell array, each reprogramming and retrieval circuit having a first latch and a second latch that are selectively connected to the memory cell array and transfer data to each other; and a controller that controls the reprogramming and retrieval circuits on data-reprogramming operation to and data-retrieval operation from the memory cell array, wherein each reprogramming and retrieval circuit has a multilevel logical operation mode and a caching operation mode, in the multilevel logical operation mode, re-programming and retrieval of upper and lower bits of two-bit four-level data being performed using the first and the second latches in storing the two-bit four-level data in one of the memory cells in a predetermined threshold level range, in the caching operation mode, data transfer between one of the memory cells selected in accordance with a first address and the first latch being performed while data transfer is being performed between the second latch and input/output terminals in accordance with a second address with respect to one-bit two-level data to be stored in one of the memory cells.

According to the present invention, each reprogramming and retrieval circuit has two latches enabling a caching function for flash EEPROMs for attaining high-speed programming speed and a multilevel function for flash EEPROMs for attaining large storage capacity.

The multilevel logical operation mode and the caching operation mode may be switched by command entry. Or, they may be executed as partially overlapping each other in accordance with an address of the data.

Moreover, the present invention provides a non-volatile semiconductor device comprising: a memory cell array having electrically erasable programmable non-volatile memory cells; a plurality of reprogramming and retrieval circuits that temporarily store data to be programmed in the memory cell array and sense data retrieved from the memory cell array, each reprogramming and retrieval circuit having a first latch and a second latch, the first latch being connected to a selected bit line of the memory cell array via a first transfer switch and a second transfer switch series-connected to each other, the second latch being connected to a connection node of the first and the second transfer switches via a third transfer switch, a data node of the second latch being connected to data input and output lines via column selection switches; and a controller that controls the reprogramming and retrieval circuits on data-reprogramming operation to and data-retrieval operation from the memory cell array.

This connection of the first and the second latches attains both the caching and multilevel functions.

After the data has been programmed in a selected memory cell, the programmed data may be retrieved for programming verification, the retrieved data being sensed and stored in the first latch.

Each reprogramming and retrieval circuit may have a multilevel logical operation mode and a caching operation mode. In the multilevel logical operation mode, re-programming and retrieval of upper and lower bits of two-bit four-level data are performed using the first and the second latches in storing the two-bit four-level data in one of the memory cells in a predetermined threshold level range. In the caching operation mode, data transfer between one of the memory cells selected in accordance with a first address and the first latch is performed while data transfer is being performed between the second latch and input/output terminals in accordance with a second address with respect to one-bit two-level data to be stored in one of the memory cells.

The four-level data may be defined as "11", "10", "00" and "01" from lower level of the threshold level range. Different row addresses may be allocated to the upper and the lower bits of the four-level data for programming and retrieval.

A first and a second data programming operation may be performed in the multilevel logical operation mode. In the first data programming operation, the lower-bit data is loaded into the second latch and then stored in the first latch, programming being performed to a selected memory cell based on the data stored in the first latch. In the second data programming operation, the upper-bit data is loaded into the second latch and then stored in the first latch while lower-bit data already programmed in the selected memory cell is being retrieved and loaded into the second latch, programming being performed to the selected memory cell based on the data stored in the first latch in accordance with the data stored in the second latch.

Moreover, a first, a second and a third retrieval operation may be performed in the multilevel logical operation mode. In the first retrieval operation, "0" or "1" of the upper bit is judged using a retrieval voltage applied at a control gate of a selected memory cell, the retrieval voltage being set in a threshold level range of "10" and "00" as the four-level data. In the second retrieval operation, "0" or "1" of the lower bit when the upper bit is "0" is judged using a retrieval voltage applied at the control gate of the selected memory cell, the retrieval voltage being set in a threshold level range of "00" and "01" as the four-level data. In the third retrieval operation, "0" or "1" of the lower bit when the upper bit is "1" is judged using a retrieval voltage applied at the control gate of the selected memory cell, the retrieval voltage being set in a threshold level range of "11" and "10" as the four-level data.

Each reprogramming and retrieval circuit may be selectively connected to a plurality of bit lines of the memory cell array via a bit line selection switch.

Each reprogramming and retrieval circuit may have a common signal line connected to the connection node of the first and the second transfer switches via a fourth transfer switch. Or, each reprogramming and retrieval circuit may have a temporal storing node for temporarily storing a potential at a data node of the first latch and a fifth transfer switch provided between the fourth transfer switch and the common signal line, the fifth transfer switch being controlled by the potential at the temporal storing node.

Furthermore, the present invention provides a non-volatile semiconductor device comprising: a memory cell array having electrically erasable programmable non-volatile memory cells; a plurality of reprogramming and retrieval circuits that temporarily store data to be programmed in the memory cell array and sense data retrieved from the memory cell array, each reprogramming and retrieval circuit having a first latch and a second latch that are selectively connected to the memory cell array and transfer data each other; and a controller that controls the reprogramming and retrieval circuits on data-reprogramming operation to and data-retrieval operation from the memory cell array, wherein each reprogramming and retrieval circuit has a caching operation mode in which data transfer between one of the memory cells selected in accordance with a first address and the first latch being performed while data transfer is being performed between the second latch and input and output terminals in accordance with a second address with respect to two-level data to be stored in one of the memory cells.

The cooperation of the first and the second latches offers a high-speed EEPROM having a caching function.

A data programming cycle for a selected memory cell of the memory cell array may be performed by repeated programming pulse application and retrieval for programming verification, in a test mode, a cell current flowing in the selected memory cell being retrieved to the input and output terminals while the data programming cycle being interrupted during which the data retrieved by the retrieval for programming verification is being stored in the first latch and the second latch is being inactive.

A test mode for measuring the cell current during programming can be used for various analyses.

Moreover, the present invention provides a non-volatile semiconductor device comprising: a memory cell array having non-volatile memory cells, data being stored in a selected non-volatile memory cell in accordance with existence of a current flowing through the selected cell or a level of the current; and a sense amplifier circuit for retrieving the data on the selected bit line, the sense amplifier circuit including: a sense node connected to the selected bit line via a clamp transistor; a pre-charging circuit for pre-charging the bit line via the clamp transistor connected to the sense node; an inverter having an input terminal connected to the sense node via transfer transistor; and a boosting capacitor, one of terminals thereof being connected to the sense node, the capacitor boosting a potential at the sense node using the other terminal as a drive terminal.

The boosting capacitor controls the potential at the sense node while data on a bit line is being sensed, thus precisely adjusting two-level data "HIGH" and "LOW" retrieved at the sense node with respect to the threshold level of the sense amplifier for attaining wide margin of sensing.

The sense amplifier circuit may perform bit line-data sensing with sense node-potential boosting by the boosting capacitor as follows: (a) pre-charging the bit line through the pre-charging circuit while the clamp transistor is being turned on, (b) continuously pre-charging the sense node while the clamp transistor is being turned off and the pre-charging circuit is being turned on during which a potential on the pre-charged bit line is varying in accordance with data stored in a selected non-volatile memory cell, (c) turning off the pre-charging circuit to drive the boosting capacitor, while applying a first potential to the drive terminal, to boost the potential at the sense node, and (d) applying a retrieval voltage to a gate of the clamp transistor to transfer the data on the bit line to the sense node. After (d), it is preferable to (e) lower the retrieval voltage but higher than a threshold level of the clamp transistor and then stop boosting the sense node by applying a second potential to the drive terminal of the boosting capacitor, the second potential being lower than the first potential.

These sequential sensing operations with potential boosting achieve accurate data judgment with no relation to variation in sense amplifier-threshold level by lowering data level "LOW" retrieved at the sense if it is not sufficiently low due to high turn-on resistance of a selected memory cell. Furthermore, lowering a retrieval voltage at the clamp transistor after data transfer prevents the potential at the sense node from going to a negative level, as a result of potential boosting, for retrieving originally sufficiently low level "LOW".

Moreover, the present invention provides a non-volatile semiconductor device comprising: a memory cell array having non-volatile memory cells, data being stored in a selected non-volatile memory cell in accordance with existence of a current flowing through the selected cell or a level of the current; and a sense amplifier circuit for retrieving the data on the selected bit line, the sense amplifier circuit including: a sense node connected to the selected bit line via a clamp transistor; a pre-charging circuit for pre-charging the bit line via the clamp transistor connected to the sense node; a sense transistor, a source thereof being supplied with a reference potential; a latch having a data node connected to a drain of the sense transistor via a transfer transistor; and a boosting capacitor, one of terminals thereof being connected to the sense node, the capacitor boosting a potential at the sense node using the other terminal as a drive terminal.

The sense amplifier circuit having the sense transistor provided between the latches and sense node and connected to the sense node is provided with the boosting capacitor also connected to the sense node. The boosting capacitor controls the potential at the sense node during bit line-data sensing, thus attaining wide margin of sensing. The sensing operation may be executed with the sequential sensing operations (a) to (d) or (a) to (e), as disclosed above.

BRIEF DESCRIPTION OF DRAWINGS

FIG. 32 shows potential change in "0"-programming at the second (lower) bit in which "11"-stored cells are programmed with "10", the same for 1 bit-stored cells in the first embodiment;

FIG. 33 shows potential change in "1"-programming at the second (lower) bit in which "11"-stored cells are programmed with "11" (programming prohibition), the same for 1 bit-stored cells in the first embodiment;

FIG. 34 shows potential change in "0"-programming to the first (upper) bit in which "11"-stored cells are programmed with "01" in the first embodiment;

FIG. 35 shows potential change in "0"-programming to the first (upper) bit in which "10"-stored cells are programmed with "00" in the first embodiment;

FIG. 36 shows potential change in "1"-programming to the first (upper) bit in which "11"-stored cells are programmed with "11" in the first embodiment;

FIG. 37 shows potential change in "1"-programming to the first (upper) bit in which "10"-stored cells are programmed with "10" in the first embodiment;

FIG. 38 indicates potential change in the first (upper) bit retrieval in multilevel operation (in which a selected word line level is Vr0 not Vr00 for two-level operation with the second latch 2a as a cache memory) in the first embodiment;

FIG. 39 shows potential change in the first time-second (lower) bit retrieval in multilevel operation in the first embodiment;

FIG. 40 shows potential change in the second time-second (lower) bit retrieval when the node N1 is at "HIGH" in the first time-retrieval in multilevel operation in the first embodiment;

FIG. 41 shows potential change in the second time-second (lower) bit retrieval when the node N1 is at "LOW" in the first time-retrieval in multilevel operation in the first embodiment;

FIG. 49 shows potential change in "1"-programming to the second (lower) bit in which "11"-stored cells are programmed with "11" (programming prohibition, the same for 1-bit cell) in multilevel operation in the sixth embodiment;

FIG. 50 shows potential change in internal data loading in multilevel operation in the sixth embodiment;

FIG. 51 shows potential change in "0"-programming to the first bit in which "11"-stored cells are programmed with "01" in multilevel operation;

FIG. 52 shows potential change in "0"-programming to the first (upper) bit in which "10"-stored cells are programmed with "00" in multilevel operation in the sixth embodiment, in which the singe ":X:" indicates that cells failed in "Verify00" will be failed in "Verify01";

FIG. 53 shows potential change in "1"-programming to the first (upper) bit in which "11"-stored cells are programmed with "11" in multilevel operation in the sixth embodiment, in which the singe ":X:" indicates that a selected bit line will be discharged through "11"-programmed cell;

FIG. 54 shows potential change in "1"-programming to the first (upper) bit in which "10"-stored cells are programmed with "10" in multilevel operation in the sixth embodiment, in which the singe ":X:" indicates that a selected bit line will be discharged through "11"-programmed cell;

FIG. 55 shows potential change in the first (upper) bit retrieval in multilevel operation (in which a selected word line level is Vr0 not Vr00 for two-level operation with the second latch 2a as a cache memory) in the sixth embodiment;

FIG. 56 shows potential change in the first time-second (lower) bit retrieval in multilevel operation in the sixth embodiment;

FIG. 57 shows potential change in the second time-second (lower) bit retrieval when the node N1 is at "LOW" for "11"-programmed cell in the first time-retrieval in multilevel operation in the sixth embodiment;

FIG. 58 shows potential change in the second time-second (lower) bit retrieval when the node N1 is at "HIGH" for "10"-"00"- or "01"-programmed cells in the first time-retrieval in multilevel operation in the sixth embodiment;

DETAILED DESCRIPTION OF PREFERRED EMBODIMENTS

One of the concepts of the present invention is to mask a long data load time taken for known EEPROMs, which is caused in enhancing effective programming speed only by cell array division as has been discussed.

Figure 45A:
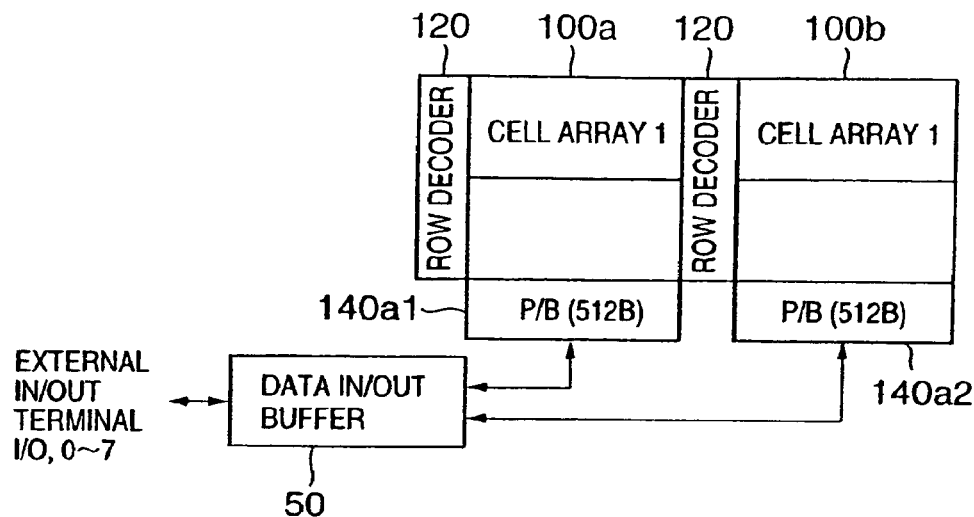
FIG. 45A illustrates a known relationship between memory cell array and page buffer.
Figure 45B:
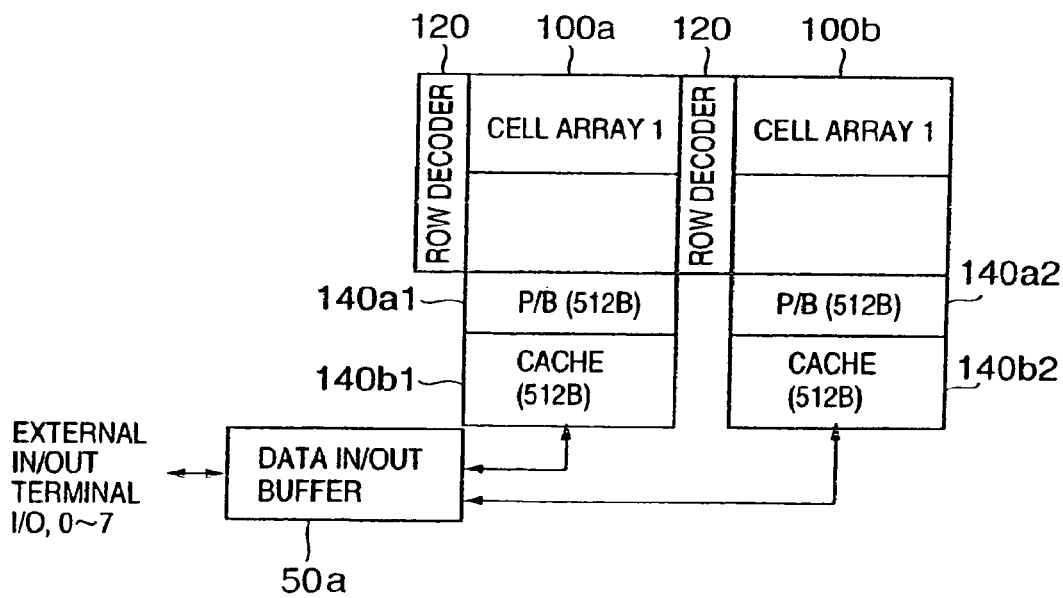
FIG. 45B illustrates the relationship between memory cell array and page buffer in the present invention.

For example, the present invention uses two caches as illustrated in FIG. 45B for masking such a long data load time.

FIG. 45B illustrates caches (data registers) 140*b*1 and 140*b*2 connected to page buffers 140*a*1 and 140*a*2, respectively, for loading the next data to be programmed during programming of the preceding data.

The caches 140*b*1 and 140*b*2 may have functions of data transfer to and from the data input/output terminal I/O while the page buffers 140*a*1 and 140*a*2 are performing data programming or retrieval, storing data stably and also data transfer to and from the page buffers 140*a*1 and 140*a*2.

The other concept of the present invention is to realize multilevel function for large storage capacity.

Figure 42:
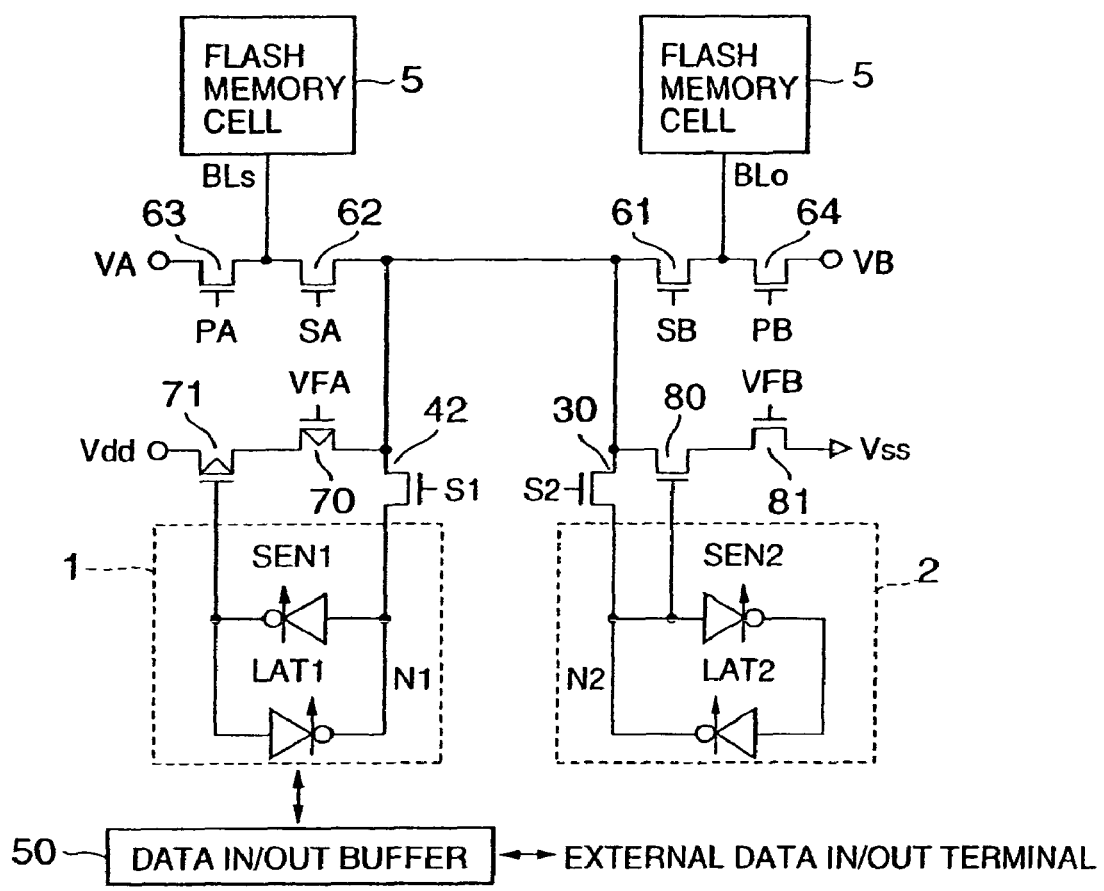
FIG. 42 shows a known flash memory.

As shown in FIG. 42, two latches are required for each data-reprogramming/retrieval circuit for multilevel function.

In order to realize the caching function as one of the purposes of the present invention, since a cache is connected to each page buffer, each data-reprogramming/retrieval circuit has two latches. The present invention provides a non-volatile semiconductor memory including data-reprogramming/retrieval circuit each having two latches to realize both multilevel and caching functions and further large storage capacity and high-speed reprogramming/retrieval performance.

Several preferred embodiments to attain the basic structure illustrated in FIG. 45B according to the present invention will be disclosed with reference to the attached drawings.

First Preferred Embodiment

Figure 1:
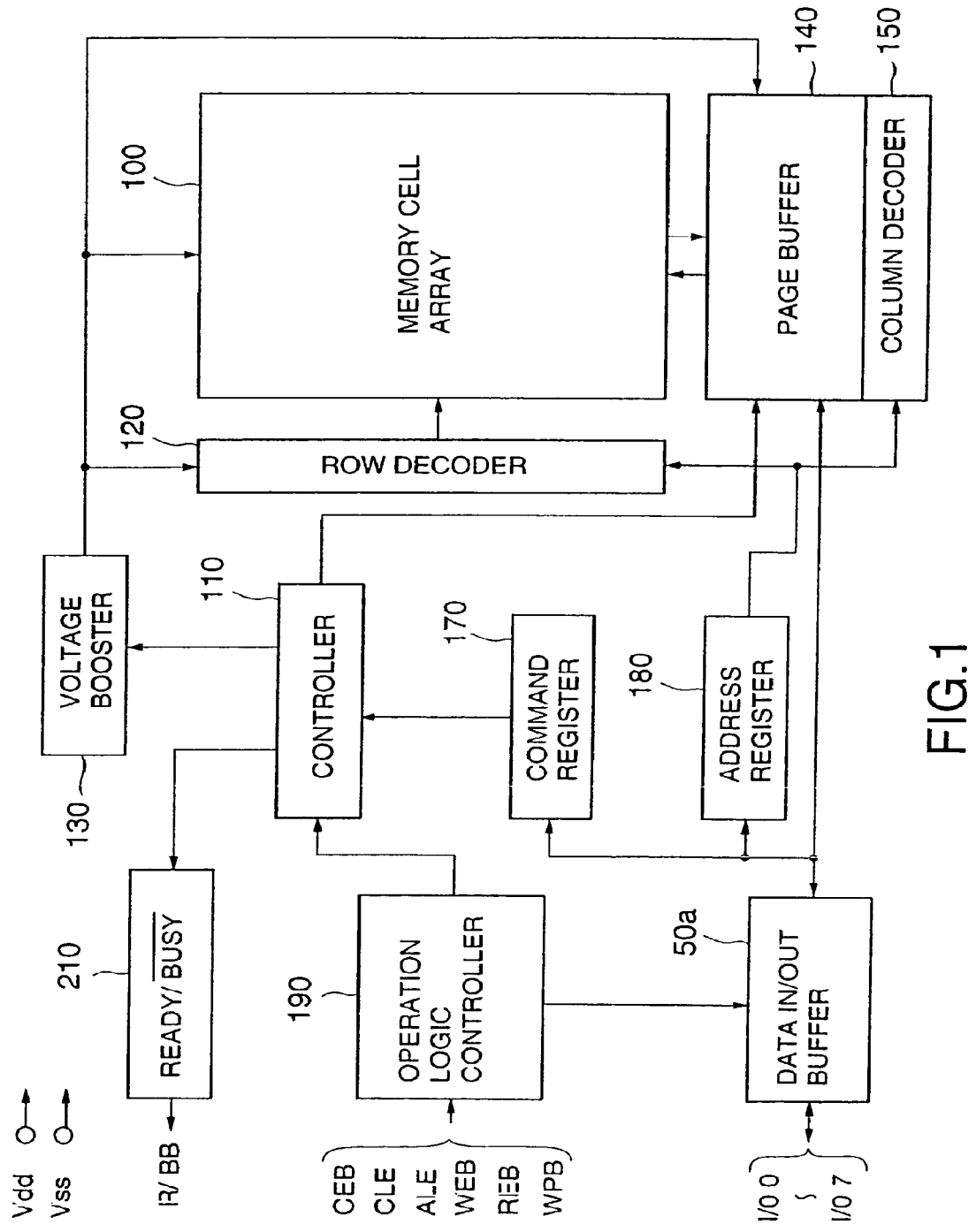
FIG. 1 is a block diagram of the first preferred embodiment of a NAND-type flash EEPROM according to the present invention.

FIG. 1 is a block diagram of the first preferred embodiment of a NAND-type flash EEPROM according to the present invention.

A memory cell array 100 is provided with NAND cell units NU0, NU1, NU2, ..., and NUn each having a plurality of (16 in FIG. 3) series-connected electrically erasable programmable non-volatile memory cells MC0 to MC15 having a stacked gate structure.

For each NAND cell unit NU, the drain is connected to a bit line BL via a gate selection transistor SG1 and the source is connected to a common source line CELSRC via a gate selection transistor SG2.

The control gates of the memory cells MC aligned in the row direction are all connected to a word line WL. The gate electrodes of the gate selection transistors SG1 and SG2 are connected to gate selection lines SGD and SGS, respectively, provided in parallel to the word lines WL.

A region of memory cells selected through one word line WL corresponds to one page, a unit of data programming and retrieval. Moreover, a region of NAND cell units NU corresponding to one page or integral multiples of one page is one block, a unit of data erasure.

A data reprogramming/retrieval circuit 140 (called a page buffer hereinafter) is provided with a sense-amplifier (SA)/latch (DL) for each bit line BL, for data programming/retrieval per page.

Figure 3:
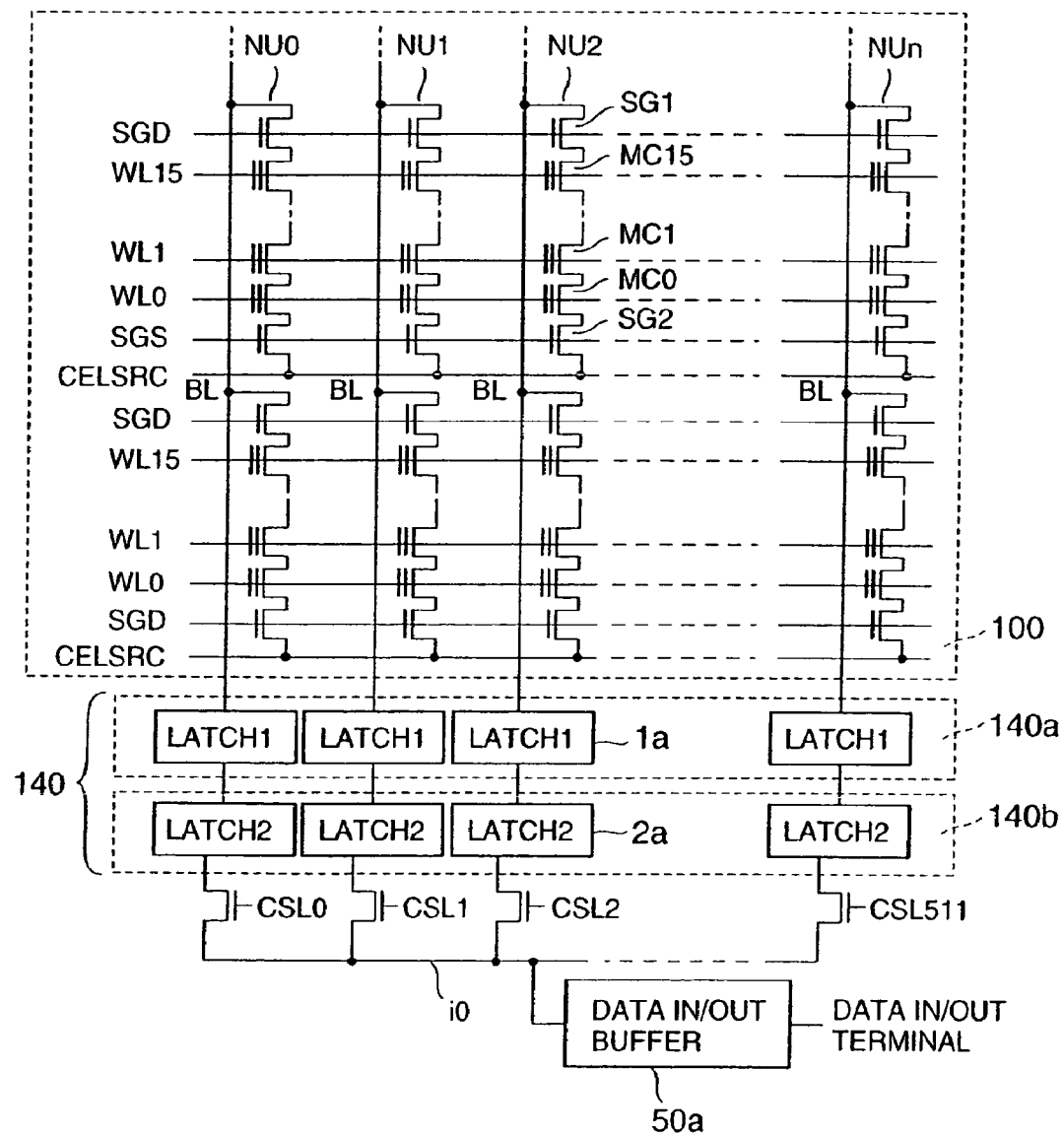
FIG. 3 illustrates the connection between the page buffer and the memory cell array in the first embodiment.

A memory cell array 100 shown in FIG. 3 has a simple structure in which the page buffer can be shared by a plurality of bit lines BL for which the number of bit lines BL that are selectively connected to the page buffer for data programming/retrieval corresponds to the unit of one page.

FIG. 3 illustrates the region of cell arrays to and from which data transfer is performed between one data input/output terminal I/O.

In FIG. 1, a row decoder 120 and a column decoder 150 are provided for selection of word lines WL and bit lines BL, respectively, of the memory cell array 100. A controller 110 performs sequence control of data programming, retrieval and erasure. A voltage booster 130 controlled by the controller 110 generates boosted high or intermediate voltages for data programming, retrieval and erasure.

A data input/output buffer 50a is used for input/output of data and address signals. In detail, data transfer is performed between the input/output terminals I/O0 to I/O7 and the data programming/retrieval circuit 140. An address signal input via terminals I/O is once stored in an address register 180 and then sent to the row and column decoders 120 and 150 for decoding.

An operation control command is also input via the terminals I/O. The command is decoded by the data input/output buffer 50a and stored in a command register 170 for control of the controller 110.

External command signals, such as, a chip enable signal CEB, a command latch enable signal CLE, an address latch enable signal ALE, a programming enable signal WEB and a retrieval enable signal REB, are sent to an operation logic controller 190 for generation of internal control signals according to operation modes. The internal control signals are sent to the input/output data buffer 50a for data latch, transfer, and so on, and also to the controller 110 for operation control.

A ready/busy register 210 generates a R/BB signal that indicates whether the EEPROM chip is in a ready or busy state.

The page buffer 140 has a multilevel function and also a caching function both being switched.

The page buffer 140 may be switched to the caching function for storing 1-bit two-level data to one memory or even when restricted by addresses. Or, it is switched to the multilevel function for storing 2-bit four-level data to one memory cell.

Figure 2:
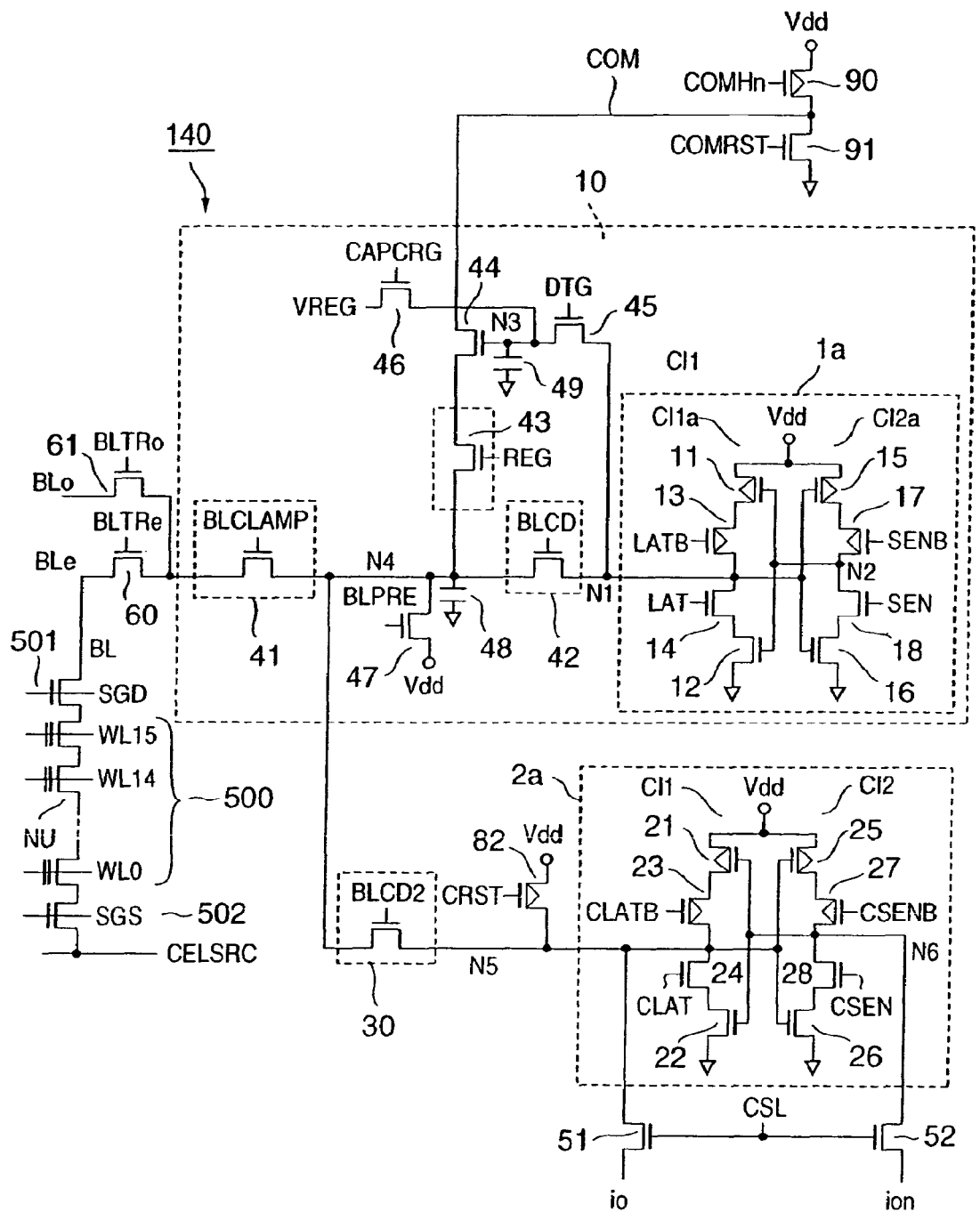
FIG. 2 shows a circuit diagram of a page buffer (a reprogramming and retrieval circuit) in the first embodiment.

FIG. 2 shows a circuit diagram of the page buffer 140 for the multilevel and caching functions.

In FIG. 2, two bit lines BLe and BL0 are selectively connected to the page buffer 140. In detail, a bit selection signal BLTRe or BLTRo turns on an NMOS transistor 60 or 61 (bit line selection transistor) to connect either the bit line BLe or BL0 to the page buffer 140.

While one of the bit line BLe or BL0 is being selected, the other bit line (not selected) is grounded to a GND potential or clamped at a Vdd potential for suppressing noises generated between bit lines adjacent to each other.

Not only NAND-type flash memories, the page buffer 140 is applicable to EEPROMs that are capable of serial input/output of 1-page data corresponding to a row address and a batch processing for data programming to and retrieving from memory cells. A narrow bit line pitch causes difficulty in circuit layout of such EEPROMs because these memories have a fixed layout size for data programming and retrieval circuits. The page buffer 140 that is shared by a plurality of bit lines overcomes such difficulty and increases flexibility in layout while decreasing page buffer layout area.

The page buffer 140 shown in FIG. 2 is provided with a main reprogramming/retrieval circuit 10 having a first latch 1a. The page buffer 140 also includes a second latch 2a. The main circuit 10 mainly serves to program data. The latch 2a is a secondary latch for a caching function in two-level operation. While not working as a cache, the latch 2a supports the main circuit 10 for a multilevel operation.

The first latch 1a of the main reprogramming/retrieval circuit 10 has CMOS clocked-inverters CI1a and CI2a, the components of each inverter being connected in series but in reverse order over the two inverters.

A bit line BL for the memory cell array is connected to a sense node N4 via an NMOS transistor 41 (a transfer switching device). The sense node N4 is connected to a data latch node N1 of the latch 1a via an NMOS transistor 42 (a transfer switching device). Also connected to the sense node N4 is a pre-charging NMOS transistor 47.

The node N1 is connected to a node N3 for storing data at the node N1 temporarily via an NMOS transistor 45 (a transfer switching device). Also connected to the node N3 are a pre-charging NMOS transistor 46 and a capacitor 49 for clamping the level at the node N3, one of the terminals of the capacitor 49 being grounded.

A common signal line COM is shared by page buffers 140 each for one byte in one column. The line COM is connected to the sense node N4 via an NMOS transistor 44 (a transfer switching device) controlled by a potential at the node N3 and also an NMOS transistor 43 (a transfer switching device) controlled by a control signal REG. The line COM is used as a signal line for carrying a supply voltage Vdd for selectively charging the node N4 and also for pass/fail judgment (disclosed later) in a programming/erasure-verifying operation.

The second latch 2a has clocked-inverters CI1 and CI2, the components of each inverter being connected in series but in reverse order over the two inverters, like the first latch 1a. The latch 2a has two data nodes N5 and N6. The node N5 is connected to a data signal line "io" via a column-gate NMOS transistor 51. The node N6 is connected to a data line "ion" via a column-gate NMOS transistor 52. The transistors 51 and 52 are controlled by a column selection signal CSL.

A pre-charging PMOS transistor 82 is connected to the node N5 for charging Vdd to the node N5. The node N5 is further connected to the node N4 of the main reprogramming/retrieving circuit 10 via an NMOS transistor 30 (a transfer switching device).

Illustrated in FIG. 3 is the connection between the page buffer 140 and the data input/output buffer 50a.

Programming to and retrieving from the NAND-type flash EEPROM is performed for each 512 bytes for one page simultaneously selected by a row address.

The number of bits allocated to one of the eight data input/output terminals I/O is 512, which is illustrated in FIG. 3.

When the cell array is divided into several arrays, as shown in FIG. 45B (two in this figure), a portion 140a having the first latch 1a in the page buffer 140 corresponds to a plurality of page buffers (two buffers 140a1 and 140a2 in FIG. 45B), and a portion 140b corresponds to a plurality of caches (two caches 140b1 and 140b2 in FIG. 45B).

A programming operation requires 512 page buffers for simultaneously programming 512-bit data, each data corresponding to a column address. Column addresses are decoded to be signals CSL0 to CSL511 for selecting one of the 512 page buffers in data transfer between the data signal line "io" via NMOS transistor 51 (a column selection device), as shown in FIG. 2.

Basic operations of the page buffer 140 are illustrated in FIGS. 4 to 8. In these figures, some of the components in FIG. 2 are simplified for easy understanding of the operations.

Programming data in the memory cell 100 (FIG. 1) starts with loading data to be programmed to the second latch 2a through the data lines io and ion.

A programming operation requires the data to be programmed in the first latch 1a, so that the data stored in the second latch 2a is transferred to the first latch 1a.

On the other hand, a retrieving operation requires a retrieved data in the second latch 2a for outputting to the data input/output terminals I/O, so that the data stored in the first latch 1a is transferred to the second latch 2a.

Figure 4:
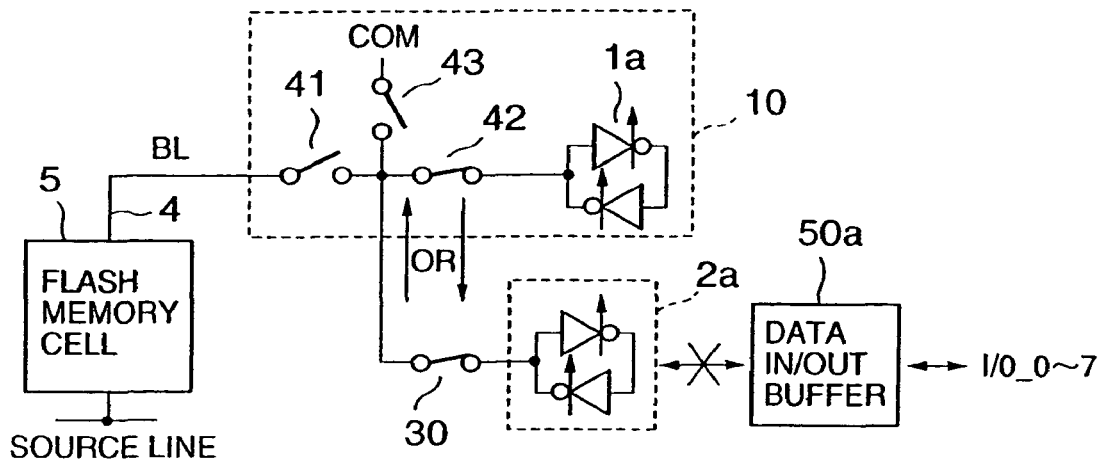
FIG. 4 illustrates data transfer performed by the page buffer in the first embodiment.

As shown in FIG. 4, the switching devices 42 and 30 (the transfer transistors 42 and 30 in FIG. 2) are turned on for data transfer between the first and the second latches 1a and 2a.

One of the latches 1a and 2a that has accepted data is deactivated before data transfer and then activated to store the data.

Figure 5:
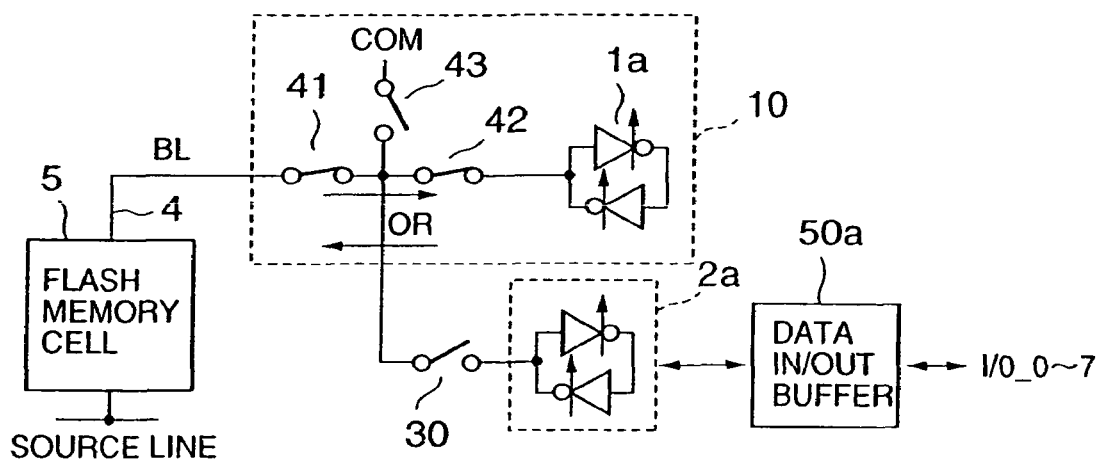
FIG. 5 illustrates programming and retrieval performed by the page buffer in the first embodiment.

Illustrated in FIG. 5 is data transfer in which data is being programmed to and retrieved from the memory cell 100.

Except a multilevel operation, the main reprogramming/retrieving circuit 10 having the first latch 1a performs programming/retrieving operation control. In detail, the switching device 30 is tuned off while the switching devices 41 and 42 are turned on for data transfer between the first latch 1a and the bit line BL of the memory cell 100.

Figure 6:
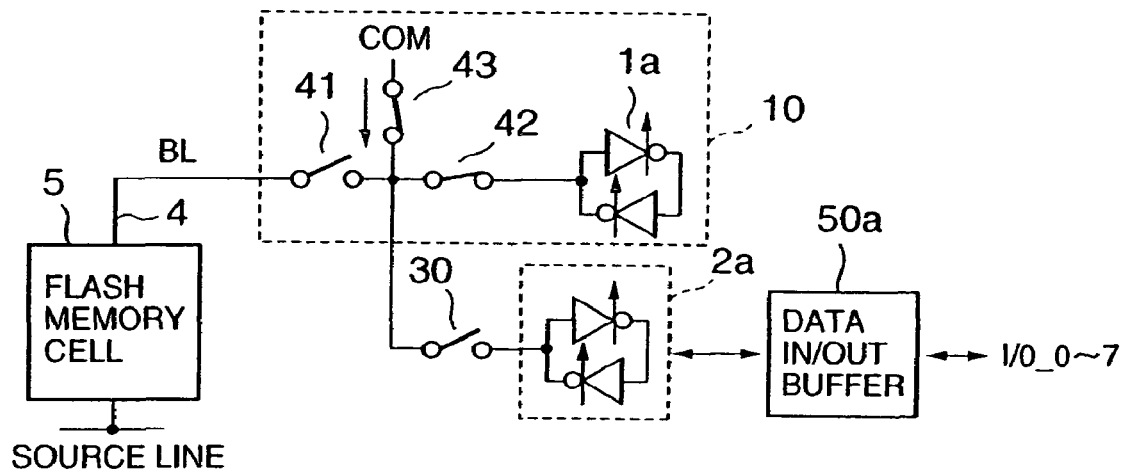
FIG. 6 illustrates re-charging in retrieval for programming verification performed by the page buffer in the first embodiment.

FIG. 6 illustrates that the switching devices 42 and 43 (the NMOS transistor 43 in FIG. 2) are only turned on during retrieval for a programming verification operation.

This is a verifying function for each bit in a programming operation. Programming of "1" in a cell in a "1"-state (erased state) is prohibited no matter how many times the programming is performed in which a selected bit line is discharged in verification to retrieve data "1", which is a programming failure. Programming is passed by discharging the bit line BL and then turning on the switching devices 42 and 43 for re-charging a level "HIGH" to the first latch 1a. Here, "pass" means completion of a data programming while "failure" means incompleteness of a data programming.

Figure 7:
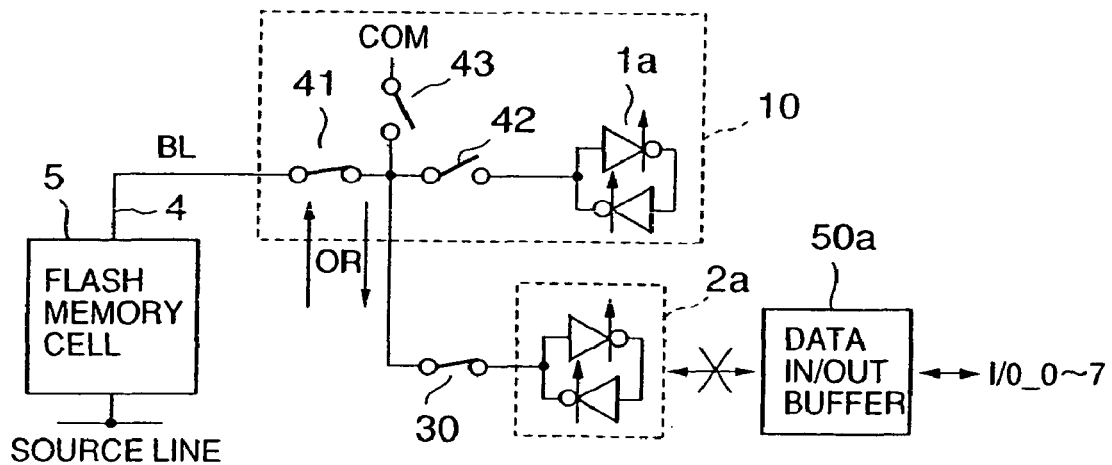
FIG. 7 illustrates internal data loading in multilevel operation mode and bit line pre-charging in Verify00 performed by the page buffer in the first embodiment.

FIG. 7 illustrates a state in a multilevel operation-mode programming operation.

The first and the second latches 1a and 2a may temporarily store a first bit-data to be programmed and a second-bit data to be programmed, respectively, for programming. For retrieving the second-bit data from the memory cell 100, the switching device 42 is turned off so that the first latch 1a stores the first-bit data, and then the switching devices 41 and 30 are turned on to retrieve data from the memory cell 100 to the second latch 2a.

The switching devices 41 and 30 are also turned on for pre-charging the bit line BL from the second latch 2a in retrieval for programming verification after application of programming pulses during programming.

Figure 8:
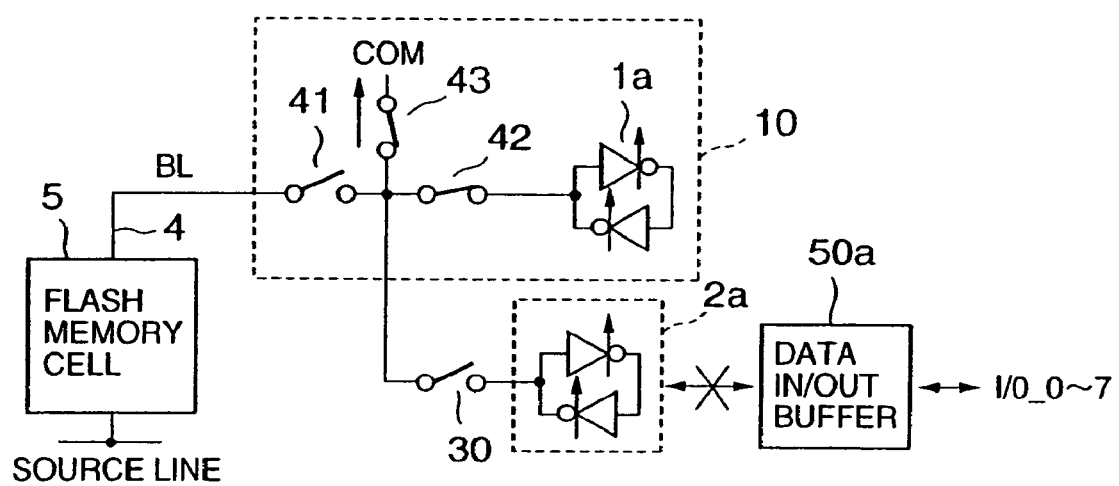
FIG. 8 illustrates second retrieval in multilevel operation mode performed by the page buffer in the first embodiment.

FIG. 8 illustrates a state in a retrieval operation when the second multilevel row address (explained later) is selected in a multilevel operation mode. The switching devices 42 and 43 are turned so that the common signal line COM is grounded to a GND potential for forcibly updating data that has been retrieved through the bit line BL, thus data can be correctly retrieved with respect to the relationship between a threshold level Vt of the memory cell 100 and 2-bit data, as illustrated in FIG. 43B.

A multilevel logic operation in the first embodiment is disclosed in detail.

Figure 43A:
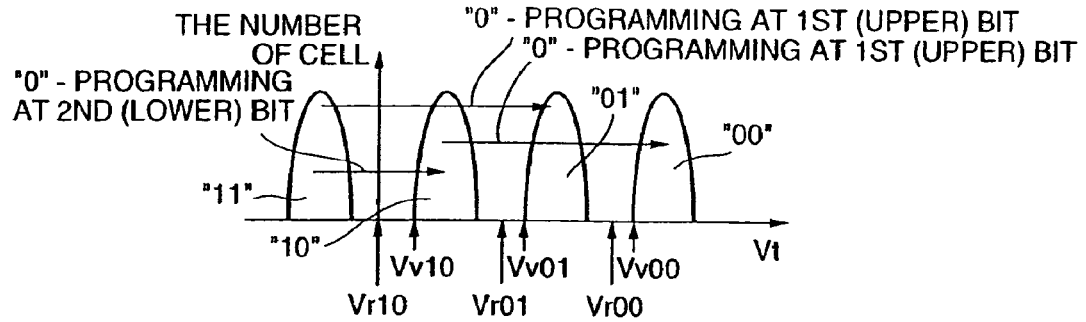
FIG. 43A illustrates data and threshold level distribution.
Figure 43B:
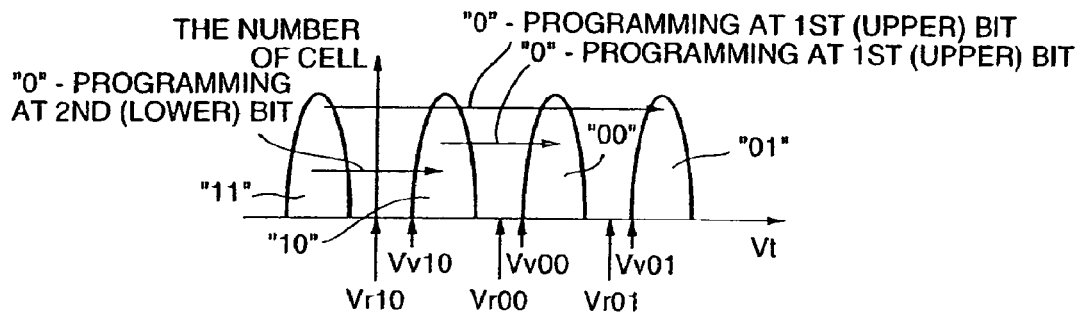
FIG. 43B illustrates data and threshold level distribution in the present invention.
Figure 44:
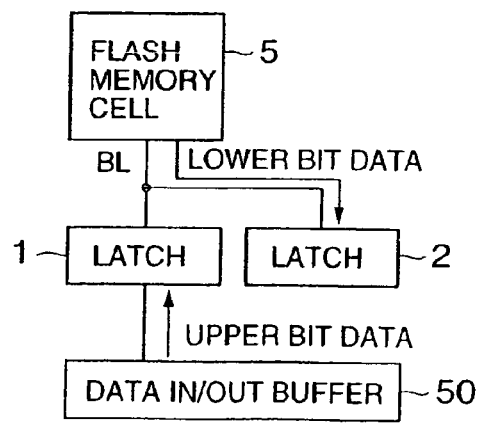
FIG. 44 illustrates known data loading in multilevel operation.

The first embodiment performs a multilevel logical operation under the relationship between a threshold level Vt of the memory cell 100 and 2-bit data, as illustrated in FIG. 43B.

The Vt-data relationship in FIG. 43B is different from that in FIG. 43A. The same fact in FIGS. 43A and 43B is that the upper-bit data and the lower-bit data correspond to different row addresses. In detail, only in a multilevel operation, two addresses are prepared for the same cell to be selected.

Row addresses allocated to the upper and the lower bits are called the first row address for multilevel operation and a second row address for multilevel operation, respectively.

In FIG. 43B, the first (upper) bit and the second (lower) bit are the data in selection of the first row address and the second row address for multilevel operation, respectively. For example, the data "10" is composed of the first (upper) bit "1" and the second (lower) bit "0".

Disclosed first is programming and retrieval for programming verification in selection of the second row address for multilevel operation.

Figures 9A, 9B:
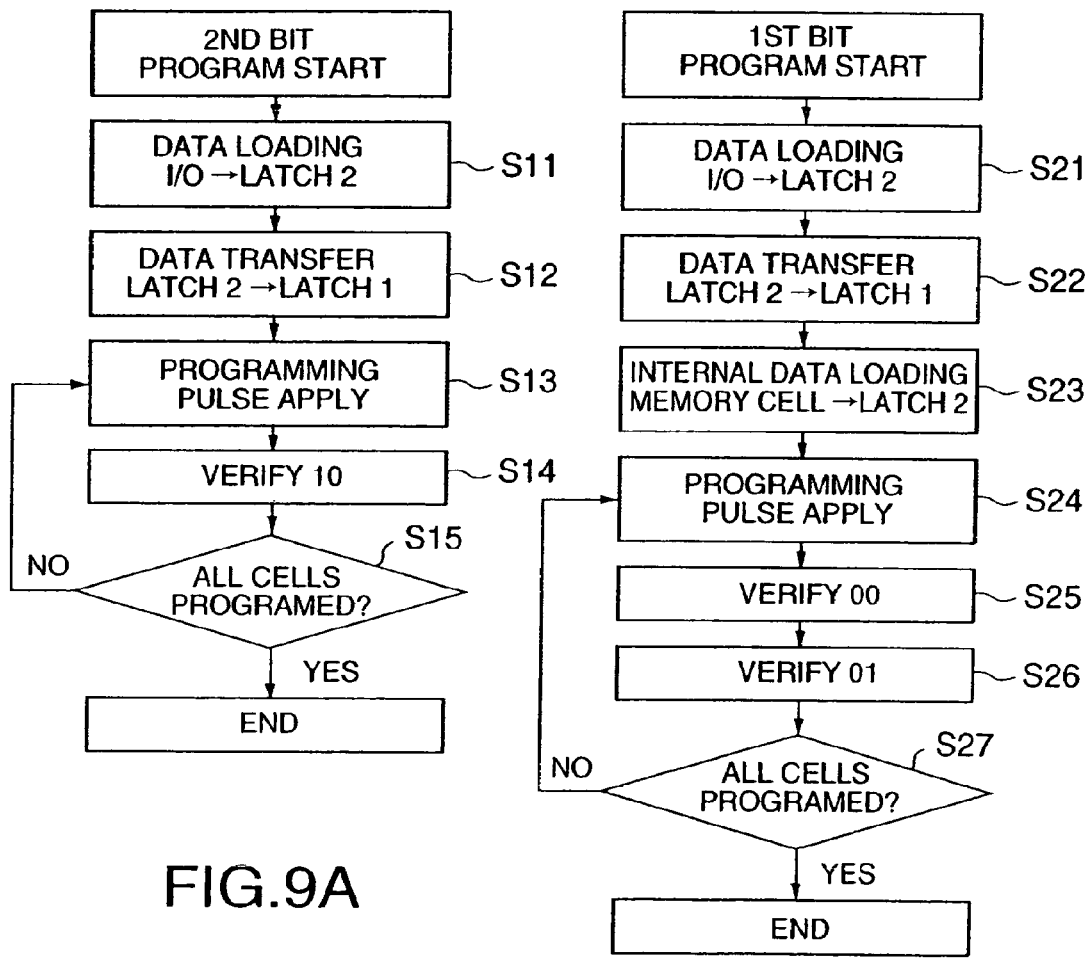
FIG. 9A is a flow chart of the second-bit data programming in multilevel operation in the first embodiment.
FIG. 9B is a flow chart of the first-bit data programming in multilevel operation in the first embodiment.

FIG. 9A is a flow chart of a programming operation in selection of the second row address for multilevel operation.

Data to be programmed in selection of the second row address for multilevel operation is loaded into the second latch 2a (FIG. 2) through the data signal line io/ion (step S11). Data corresponding to a column address is also loaded into the second latch 2a while 512-byte data for one page are being serially input.

Figure 10A:
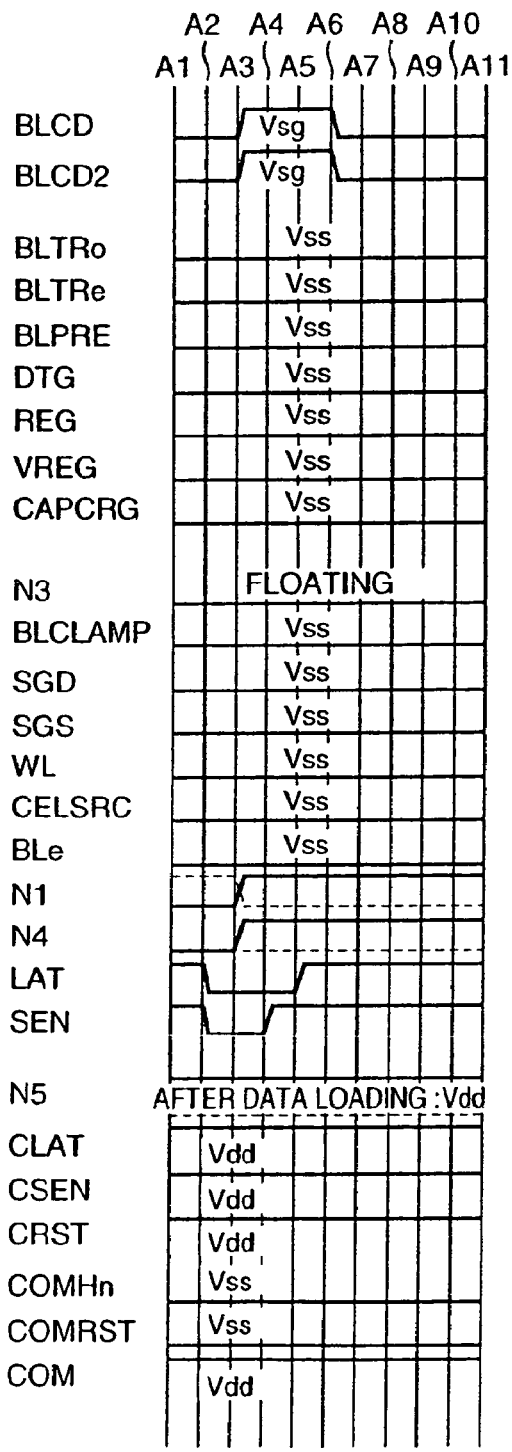
FIG. 10A illustrates timing of data transfer from the second latch 2a to the first latch 1a in the first embodiment.

On completion of one-page data loading, the data in the second latch 2a is transferred to the first latch 1a (step S12), as illustrated in FIG. 10A.

In FIG. 2, a potential BLCD at the gate of the NMOS switching transistor 42 and a potential BLCD2 at the gate of the NMOS switching transistor 30 are set at a level "HIGH" for carrying Vdd to transfer the data from the second latch 2a to the first latch 1a. In FIG. 10A, data "HIGH" is stored in the second latch after data loading, thus the node N5 being set at the level "HIGH" (Vdd).

A programming operation starts after the data transfer described above (step S13).

Figure 11:
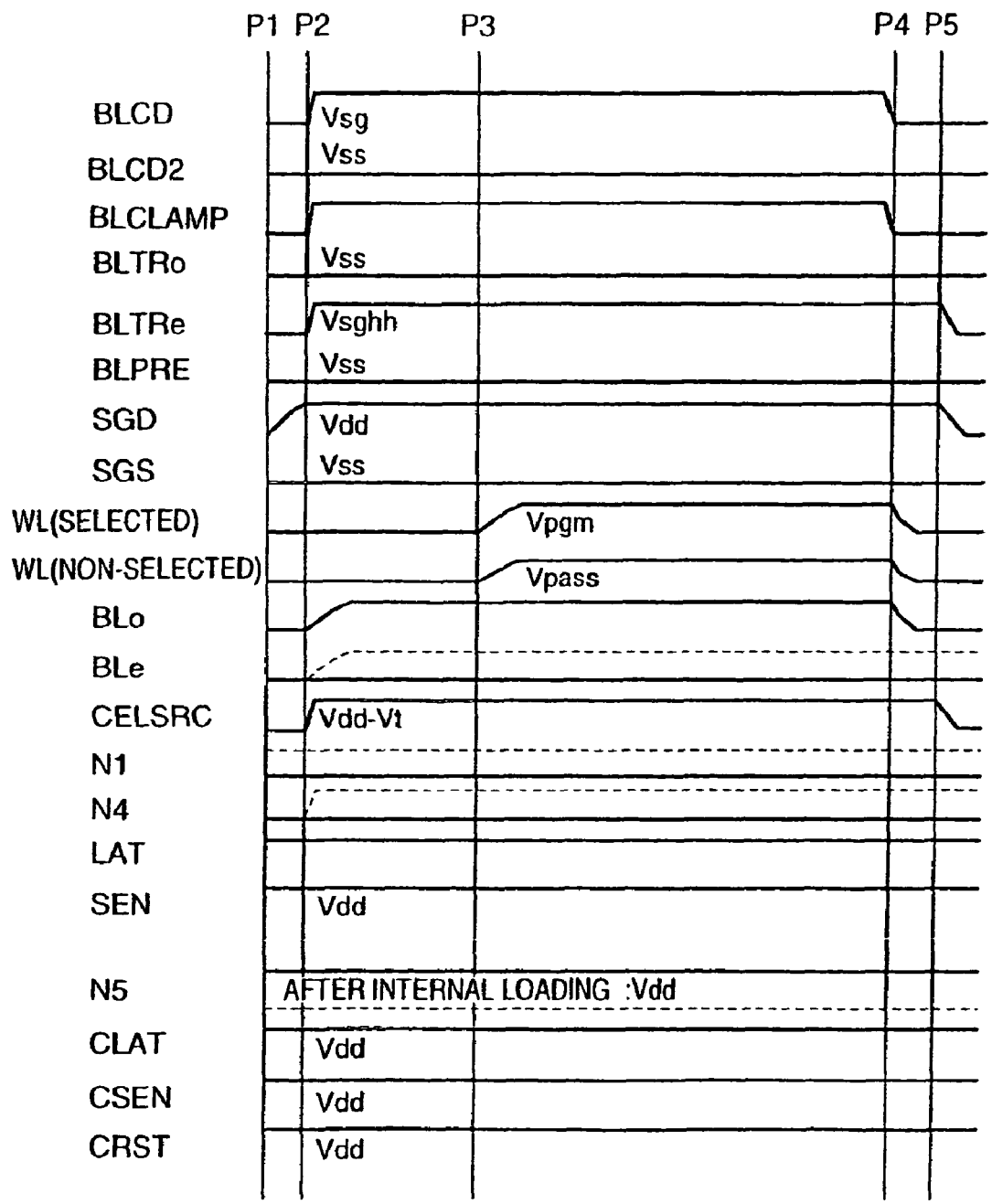
FIG. 11 illustrates timing of programming pulse application in which the solid line indicates "0"-programming to "1"-programmed cell in the first embodiment.

Illustrated in FIG. 11 is an example of timing in programming pulse application.

In FIG. 2, data to be programmed in the first latch 1a is transferred to a selected bit line via the NMOS transistors 42 and 41, and the bit line selection transistor 60. A voltage high enough for transferring VDD to the bit line BLe has been supplied to the gates of the transistors located between the first latch 1a and the bit line BLe. In this example, the bit line BLe, one of the two bit lines BLo and BLe that share the one page buffer 140, has been selected, which is the same for the following disclosure.

The level "HIGH" at the node N1, one of the terminals of the first latch 1a, allows the level "HIGH" to be transferred to the bit line BLe so that a selected cell is brought into a programming-prohibited state in which data "1" has been programmed. On the other hand, the level "LOW" at the node N1 brings the selected cell into a state in which data "0" has been programmed.

In FIG. 11, the level "LOW" is transferred to the selected bit line BLe, as indicated by the solid line, to program the data "0" in "11"-programmed cell, so that "10" is programmed in the cell.

The NAND-type flash EEPROM is at a negative threshold level Vt, such as, in "11"-programmed state illustrated in FIG. 43B, in an erased state before programming.

Figure 12A:
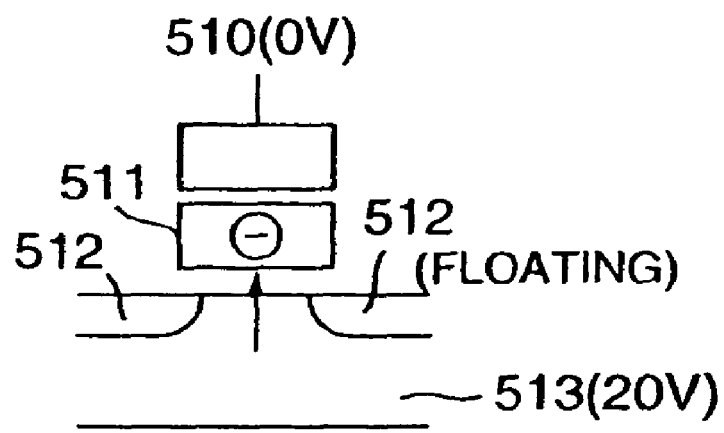
FIG. 12A illustrates erasure in a memory cell in the first embodiment.

In an erasure operation, as illustrated in FIG. 12A, electrons are pulled out from a floating gate 511 of a memory cell at 0V for all the word lines 510 of a selected block and a positive high erasure voltage (about 20V) for a p-well 513 of the memory cell, and in a state a source/drain 512 of the memory cell is floating.

Figure 12B:
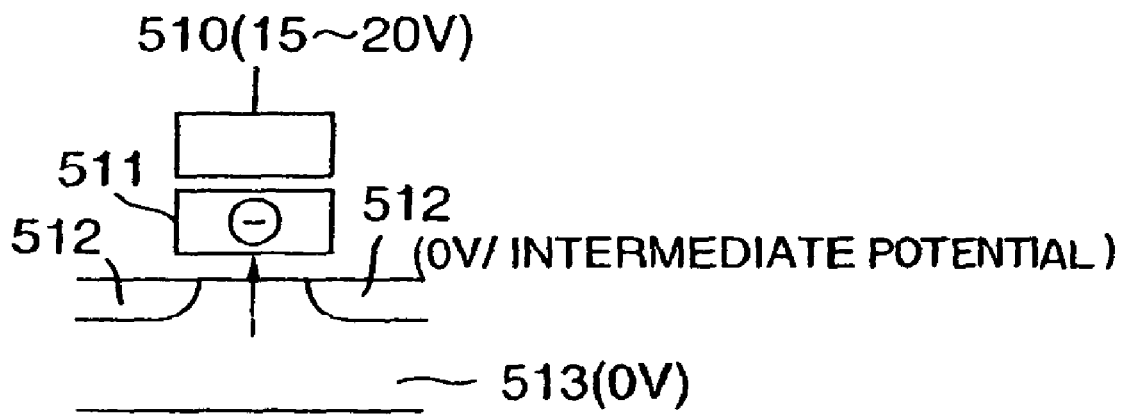
FIG. 12B illustrates programming in a memory cell in the first embodiment.

In a programming pulse applying operation, as illustrated in FIG. 12B, selected word line 510 is set at a positive high programming voltage Vpgm (15 to 20V) while the p-well 513 is grounded to 0V so that electrons are injected into the floating gate 511.

Electrons are injected into the floating gate 511 while 0V is transferred from the first latch 1a to the bit line BLe due to the fact that a potential difference enough for programming occurs between the channel and the floating gate 511 of the memory cell. Such a potential difference occurs when 0V is transferred to the n-type diffusion layer 512 via the bit line, bit line-side selection transistors and also non-selected cells in the NAND cell unit.

On the other hand, electrons are not injected into the floating gate 511 while the level "HIGH" is transferred to from the first latch 1a to the selected bit line BLe due to a small potential difference between the channel and the floating gate 511 caused by a high channel potential of a selected memory cell.

An intermediate potential Vpass (about 8V) has been supplied to word lines of non-selected memory cells to raise channel potential for a state in which the non-selected cells cannot be programmed. The potential Vpass has been supplied to non-selected word lines of the NAND cell unit in which several word lines have been selected.

Figure 13:
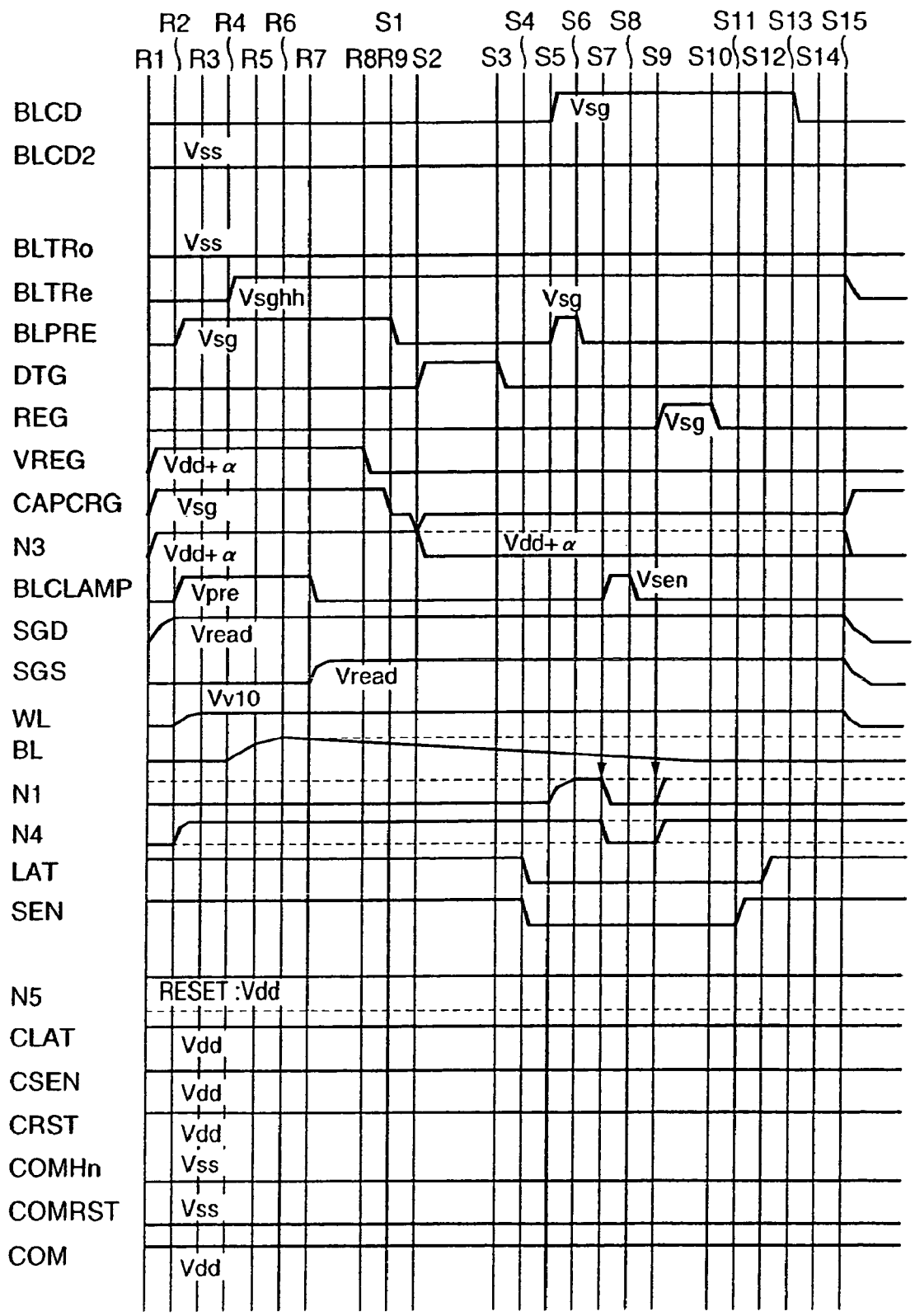
FIG. 13 illustrates timing of retrieval "Verify10" for programming verification in which the solid line indicates programming failure in a "10"-programming to "11"-programmed cell in the first embodiment.

In FIG. 9A, retrieval for programming verification VERIFY 10 is executed after application of the programming pulses (step S14), the timing being shown in FIG. 13. The retrieval VERIFY 10 is executed at a potential Vv10 (FIG. 43B) for selected word lines. A "pass" voltage Vread is supplied to non-selected word lines in the same NAND cell unit to allow non-selected cells to be "pass" transistors for judgment only as to whether the memory cells connected to selected word lines have been turned on or off.

During a bit line pre-charging period from a moment R4 to R7 (FIG. 13), in FIG. 2, the NMOS transistors 47 and 41, and the bit selection transistor 60 are turned on to pre-charge the bit line BLe. In detail, a voltage Vpre is supplied to the gate of the NMOS transistor 41 while a voltage (Vpre−Vt), lower than Vdd, is pre-charged to the bit line BLe (Vt: a threshold voltage).

At the moment R7 (FIG. 13), a source-side selection transistor SG2 (FIG. 3) of a NAND cell unit NU is turned on to start discharging from the bit line BLe in accordance with a state of threshold level Vt of selected cells.

In detail, selected memory cells are turned on, when the threshold level Vt is lower than Vv10, to discharge the pre-charged potential (Vpre−Vt) from the bit line Ble.

On the other hand, the selected memory cells are not turned on, when the threshold level Vt is higher than Vv10, to clamp the pre-charged potential (Vpre−Vt) on the bit line BLe.

Data to be programmed is then stored at the node N3 before amplifying and sensing the potential on the bit line BLe. In detail, a voltage (Vdd+α) is charged at the node N3 to a floating state by a moment 51, and then a potential DTG at the gate of the NMOS transistor 45 is set at Vdd at a moment S2. A capacitor 49 (FIG. 2) is connected to the node N3 for suppressing noises generated due to decrease in potential caused by current leak or coupling between wiring while the node N3 is being brought into a floating state.

In FIG. 2, the level "HIGH", at the node N1 that has stored data to be programmed, turns off the NMOS transistor 45, so that the node N3 has been set at the level "HIGH" whereas the level "LOW" at the node N1 turns on the NMOS transistor 45, so that the node N3 is set at the level "LOW".

Then, the first latch 1a is deactivated for amplifying and sensing the potential on the bit line BLe. In detail, potentials LAT and SEN at the gates of NMOS transistors 14 and 18, respectively, are set at "LOW" while potentials LATB and SENB (the reverse potential of LAT and SEN, respectively) at the gates of NMOS transistors 13 and 17, respectively, are set at "HIGH".

After the first latch 1a has been deactivated, the potential BLCD is set at the level "HIGH" to turn on the switching device 42 to bring the nodes N1 and N4 to the same potential, thus the NMOS transistor 47 is turned on to set these nodes at the level "HIGH".

At the moment S7, a potential BLCLAMP at the gate of the NMOS transistor 41 is set at a sensing potential Vsen. The NMOS transistor 41 turns on when the potential on the bit line BLe has been discharged from (Vpre−Vt) to (Vsen−Vt), so that the potentials at the nodes N1 and N4 are lowered from Vdd to the level almost equal to the potential on the bit line BLe. Electric charges stored at the node N1 and N4 are instantaneously discharged due to the fact that the bit line capacity is extremely larger than the node capacity.

On the other hand, the NMOS transistor 41 does not turn on when the potential on the bit line BLe has not been discharged to (Vsen−Vt), so that the potentials at the nodes N1 and N4 are clamped at Vdd.

When the potential at the node N1 is lowered, it is lowered to the potential on the bit line BLe, not any further. Clamping the potential at the node N1 at Vdd is like amplification of the potential on the bit line BLe because Vdd is higher than the potential (Vpre−Vt) pre-charged on the bit line BLe. In FIG. 13, the solid line for BL (the potential on the bit line BLe) represents discharging which indicates the memory cell is not programmed enough or not programmed.

At a moment S9, the control signal REG is set at the level "HIGH" to turn on the switching transistor 43.

A level "LOW" at the node N3, or a "0"-programmed state in programming pulse applying operation, does not allow the NMOS transistor 44 to turn on, which causes no change in potential at the nodes N1 and N4, so that the potential on the bit line BLe has appeared at the node N1 until a moment S11.

The potential SEN at the gate of the NMOS transistor 18 and the potential SENB at the gate of the NMOS transistor 17 are set at the levels "HIGH" and "LOW", respectively, at the moment S11 to activate the clocked inverters in the first latch 1a for sensing the potential at the node N1 (functioning as the gate of the latch 1a).

At a moment S2, the potential LAT at the gate of the NMOS transistor 14 and the potential LATB at the gate of the NMOS transistor 13 are set at the levels "HIGH" and "LOW", respectively, to activate the first latch 1a for retrieving the potential at the node N1 as two-level data "LOW" or "HIGH". The data "LOW" at the node N1 is transferred again to a selected bit line in the succeeding programming pulse applying operation, thus the selected cell being programmed in a "0"-state.

When the pre-charged potential on the bit line Ble is clamped as indicated by a dashed line for BL in FIG. 13 with no flow of a cell current, data "HIGH" is stored in the first latch 1a after sensing for completion of programming to the selected memory cell.

The data "HIGH" stored in the first latch 1a after retrieval for programming verification allows the level "HIGH" to be transferred to the selected bit line Be, thus the cell being programmed with "1" for programming prohibition.

On the other hand, a level "HIGH" at the node N3, or data "1" being programmed in programming pulse applying operation, allows the common signal line COM to transfer the level "HIGH" to the nodes N1 and N4. The level "HIGH" is stored again at the node N1 at the moment 512, thus the level "HIGH" being stored at the node N1 in "1"-programming state without respect to the result of programming verification, to keep "1"-programmed state for programming prohibition.

FIGS. 32 and 33 indicate the potential change at the nodes and on the bit and word lines for the operations disclosed so far.

The node N1 (FIG. 2) is changed into the "1"-programming state at the level "HIGH" in page buffers for which programming is completed. Detection of the state at the node N1 or the node N2 (the reversed state) for all page buffers in one page allows the judgment as to whether one-page programming has been completed or not (step S15 in FIG. 9A). The process returns to steps S13 and S14 when the node N1 has been at the level "LOW" for at least any of the page buffers, to perform programming pulse applying operation and retrieval for programming verification.

As disclosed above, in the NAND-type flash EEPROM, page buffers connected to memory cells, for which programming has been completed according to retrieval for programming verification, are changed to the "1"-programmed state, thus threshold level-distribution being narrowly controlled even though the programming pulse applying operation is continuously performed until all memory cells for one page has been programmed. This programming control for each page buffer in one page is called per-bit verification.

Figure 14:
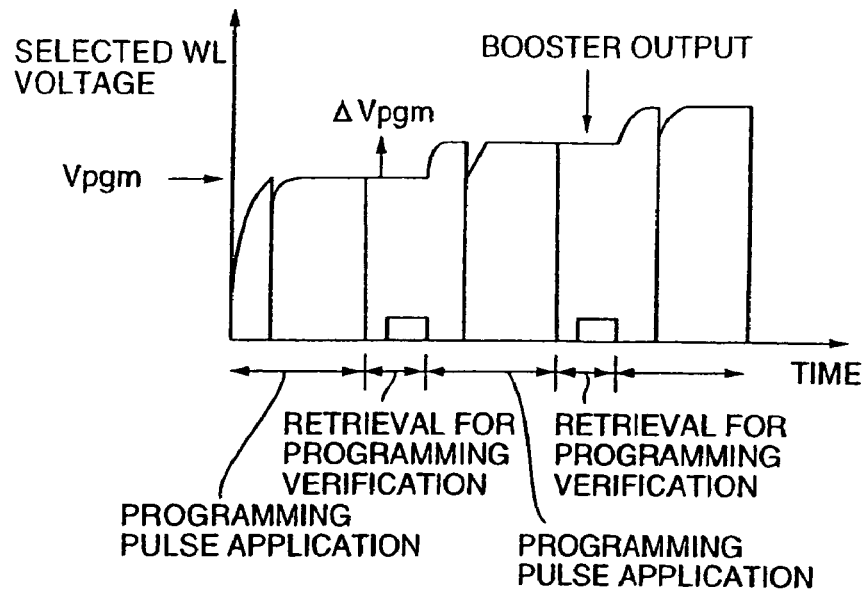
FIG. 14 illustrates a programming voltage waveform on a selected word line in the first embodiment.

The programming pulse applying operation is performed for attaining a higher programming speed in such a way that a programming voltage Vpgm is raised step by step for each programming pulse applying operation and retrieval for programming verification. This is shown in FIG. 14 in which the potential on a selected word line WL varies as indicated by the solid line.

Disclosed next is programming and retrieval for programming verification in selection of the first address for multilevel operation.

FIG. 9B is a flow chart of a programming operation for the upper bit (in selection of the first row address for multilevel operation).

Data to be programmed in selection of the first row address for multilevel operation is loaded into the second latch 2a (FIG. 2) through an external data input/output terminal (step S21). The data in the latch 2a is transferred to the first latch 1a (step S22) in accordance with the timing shown in FIG. 10A. The steps S21 and S22 are illustrated in FIG. 15A.

Figures 15A, 15B:
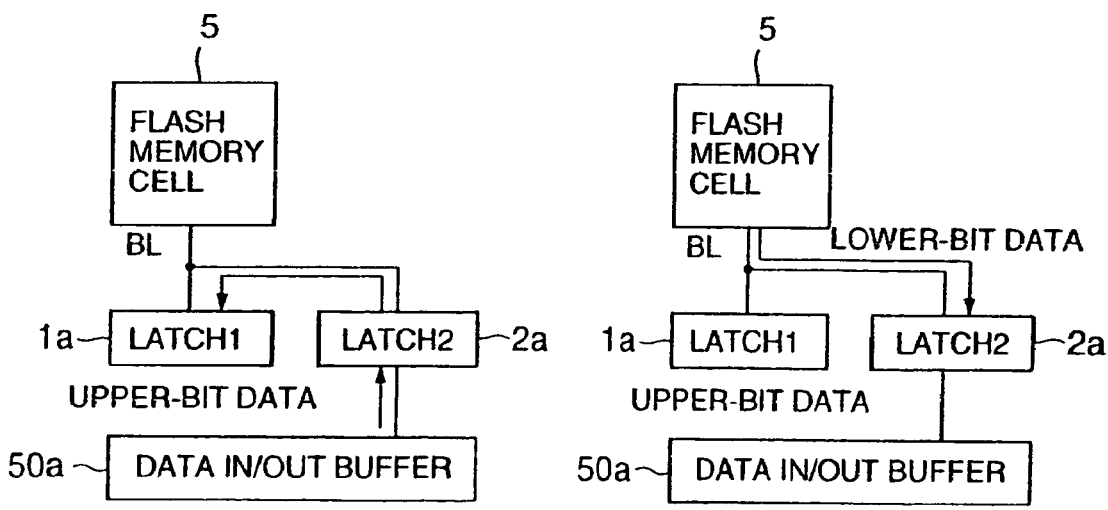
FIG. 15A illustrates data transfer from the second latch 2a to the first latch 1a in the first embodiment.
FIG. 15B illustrates internal data loading in the first embodiment.

Next, as illustrated in FIG. 15B, the lower-bit data (in selection of the second row address for multilevel operation) is stored in the second latch 2a (step S23 in FIG. 9B). This operation is called internal data loading and performed in accordance with the timing shown in FIG. 16. The node N1 (FIG. 2) is changed to the level "LOW" after the data is stored in the latch 2a, as indicated by the solid line in FIG. 16.

Retrieval is performed after a selected word line is set at Vr10 (FIG. 43B) in which the same word line is selected for both the first and the second row addresses for multilevel operation.

For a bit line pre-charging period from a moment R4 to R7 (FIG. 16), the NMOS transistors 47 and 41 and also the bit line selection transistor 60 are turned on to pre-charge the bit line BLe. In detail, a potential Pre is supplied to the gate of the NMOS transistor 41 to pre-charge the potential (Vpre−Vt) to the bit line BLe.

Figure 16:
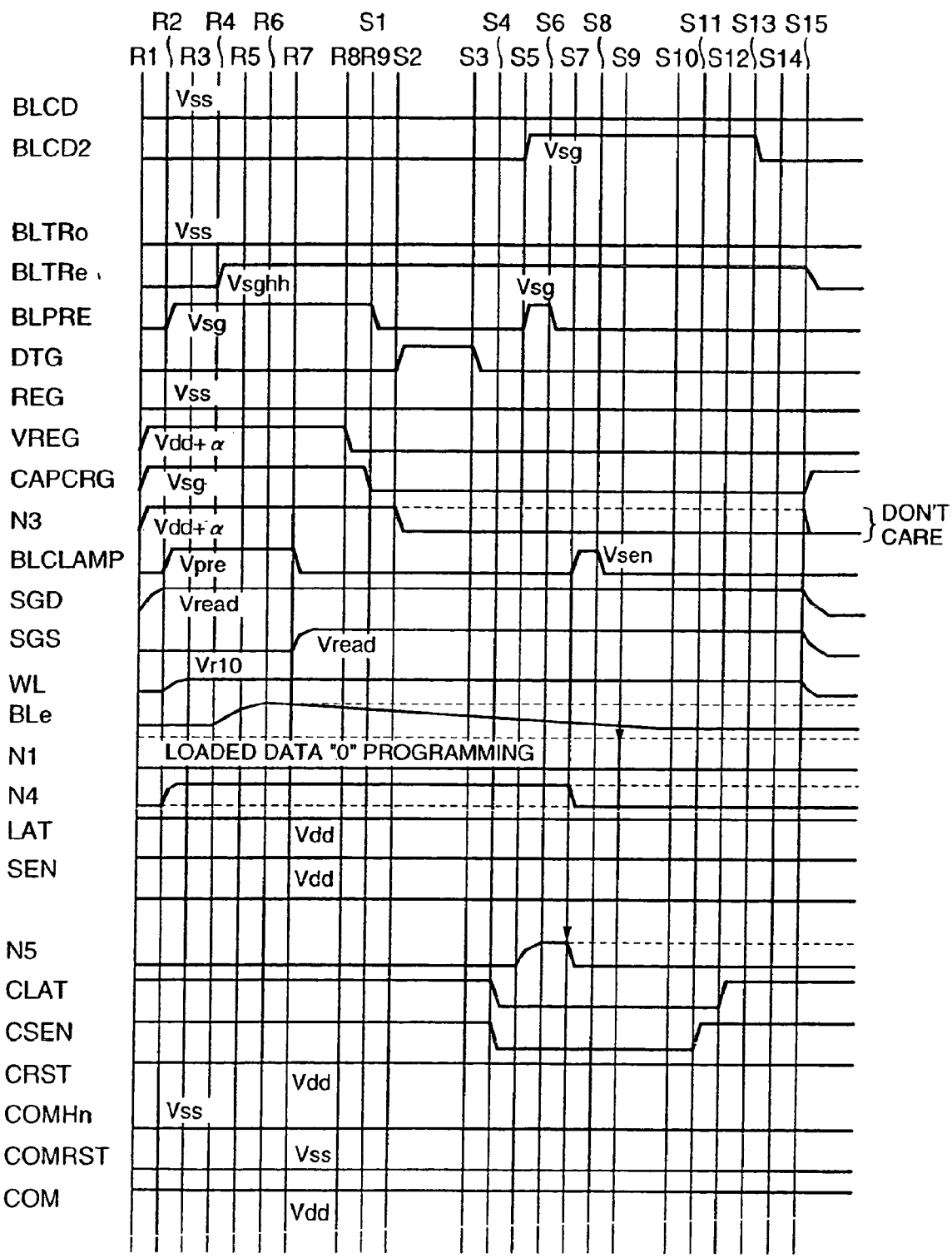
FIG. 16 illustrates timing of internal data loading in which the solid line indicates retrieval from a "11"-programmed cell in the first embodiment.

At the moment R7, the source-side selection transistor SG2 (FIG. 3) in a NAND cell unit NU is turned on to start discharging the bit line BLe according to the state of cells. In FIG. 16, the solid line for BLe indicates discharging therefrom in the "11"-stored cells. Only in this retrieval operation, retrieved data is stored in the second latch 2a. Before sensing the bit line potential, at the moment S4, signals CLAT and CSEN at the gates of NMOS transistors 24 and 28, respectively, have been set at the level "LOW" for deactivating the latch 2a. Signals CLATB and CSENB are the reversal of the signals CLAT and CSEN, respectively.

At a moment S5, a signal BLCD2 at the gate of the NMOS transistor 30 is set at the level "HIGH" to turn on the transistor 30 while the nodes N4 and N5 are pre-charged to Vdd via the NMOS transistor 47.

At the moment S7, the potential BLCLAMP at the gate of the NMOS transistor 41 is set at the sensing potential Vsen so that the bit line potential appear at the nodes N4 and N5 in accordance with the clamping operation already disclosed with reference to FIG. 13 (the moment S7).

At a moment S11, the signals CSEN and CSENB at the gates of NMOS transistors 28 and 27, respectively, are set at the levels "HIGH" and "LOW", respectively, to activate the clocked inverters in the second latch 2a for which the node N5 functions as the input gate. The potential at the node N5 is sensed by the clocked inverters.

At a moment S12, the signals CLAT and CLATB at the gates of NMOS transistors 24 and 23, respectively, are set at the levels "HIGH" and "LOW", respectively, to activate the second latch 2a for data retrieval (step S23 in FIG. 9B). The potential BLCD at the gate of the NMOS transistor 42 has been at the level "LOW" during this operation so that the transistor 42 has been turned off, thus externally input data to be programmed is stored in the first latch 1a.

As disclosed, data to be programmed for the first row address for multilevel operation is stored in the first latch 1a and the data to be programmed for the second row address for multilevel operation is retrieved from the memory cell and stored in the second latch 2a, and then the programming pulse applying operation starts (step S24 in FIG. 9B).

The programming pulse applying operation is performed in accordance with the timing shown in FIG. 11, like the operation described already for the selection of the second address for multilevel operation, with the transfer of data to be stored in the first latch 1a to a selected bit line.

In programming for the selection of the first row address for multilevel operation, the threshold level (Vt) distribution is varied, as shown in FIG. 43B.

In detail, a "11"-programmed cell is programmed with "01" and a "10"-programmed cell is programmed with "00" when the level "LOW" has been clamped at the node N1 connected to the first latch 1a. On the other hand, when the level "HIGH" has been clamped at the node N1, which indicates "1"-programming for programming prohibition, the "11"- and "10"-programmed cells continuously store "11" and "10", respectively.

There are four states for the memory cells as disclosed above, the corresponding operations are indicated in FIGS. 34 to 37.

Programming from "11" to "01" and "10" to "00" are simultaneously performed with applying the same programming voltage to selected word lines. This operation requires VERIFY00 (step S25 in FIG. 9B) for retrieval for "00"-programming verification and also VERIFY01 (step S26 in FIG. 9B) for retrieval for "01"-programming verification, after one programming pulse applying operation.

For these operations, programming should not be completed in "00"-programming verification for the memory cells that are being programmed with "01". This is because the retrieval for "00"-programming verification (VERIFY00) is performed with supplying Vv00 (FIG. 43B) to selected word lines whereas, for the memory cells that are being programmed with "01", a threshold level raises at the level of "00" does not allow discharging the potential on the bit line in VERIFY00, thus it seems that programming is completed for the memory cells that are still being programmed with "01".

In order to overcome such a problem, the first embodiment performs retrieval control for programming verification based on data corresponding to the second row address for multilevel operation stored in the second latch 2a (FIG. 2).

Figure 17:
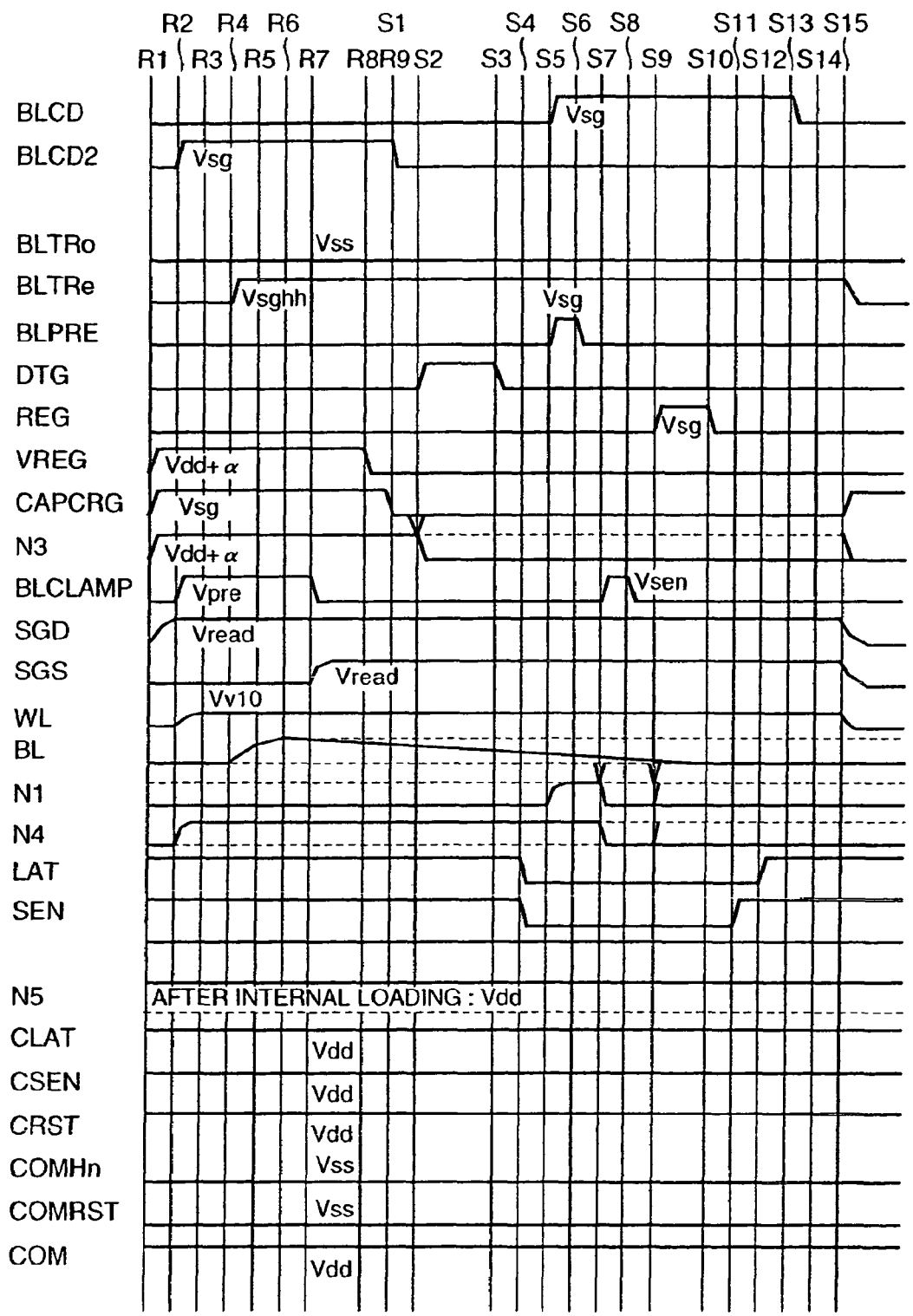
FIG. 17 illustrates timing of retrieval "Verify00" for programming verification in which the solid line indicates programming failure in "0"-programming to the first (upper) bit in which "00"-programmed cell are programmed with "00" in the first embodiment.

FIG. 17 shows an example of the timing for VERIFY00 (step S25 in FIG. 9B) for retrieval for "00"-programming verification.

In a pre-charging period from a moment R4 to R7, the NMOS transistors 30 and 41, and the bit selection transistor 60 are turned on to pre-charge the bit line BLe from the node 5 of the second latch 2a.

During the programming of "01" in the "11"-stored cells, the node 5 of the second latch 2a has been set as the level "LOW" after internal loading for loading data corresponding to the second row address for multilevel operation. This is because the internal loading requires the voltage Vr10 (FIG. 43B) on the selected word lines, so that the "11"-stored memory cells are turned on to discharge pre-charged voltage on the bit line for retrieving "LOW" after sensing.

This results in "LOW"-pre-charging in the page buffers for which "01"-programming has been proceeding. Pre-charging which will be failed is initially performed for the memory cells to be programmed with "01" because these cells require failure for retrieval for programming verification in VERIFY00 (FIG. 9B).

On the other hand, in page buffers for which "00"-programming is to be performed to the "10"-stored memory cells, the node N5 of the second latch 2a has been set at the level "HIGH", thus performing bit line pre-charging like other retrieval. The latch 2a is included in each page buffer in a page as a unit of programming. Thus, regular pre-charging is performed to selected bit lines for page buffers that have conducting "00"-programming whereas pre-charging which will be failed is performed for page buffers that have conducting "01"-programming (selective pre-charging).

Setting 0V on the bit line before VERIFY00 (FIG. 9B) serves to consume a small current because no unnecessarily pre-charging current will not flow for a period of the selective pre-charging described above from the second latch 2a after starting VERIFY00.

In FIG. 17, for the node N5 and the bit line BLe (indicated as BL in the figure), a wave form indicated by the solid line represents "00"-programming while the dashed line (at the GND level) represents "01"-programming.

After the moment R7 (FIG. 17), the process the same as the retrieval for programming verification described above is performed. In the page buffers for performing "00"-programming, the bit line BLe is pre-charged for the period up to the moment R7 as indicated by the solid line for BL. Depending on the selected cells that have been turned on or off, the bit line BLe is discharged or not. Then, after the moment R7, the sensing potential Vsen supplied at the gate of the NMOS transistor 41 (FIG. 2) amplifies and senses the potential on the bit line BLe, thus the result of programming is stored in the first latch 1a.

In "1"-programming for clamping "10"-state in which the level "HIGH" has been stored in the second latch 2a, the level "HIGH" has been clamped at the node N1, thus the node N1 is charged to the level "HIGH" at a moment R9 by the per-bit verification described above with the data clamped at the node N3 for clamping the "1"-programmed state.

Figure 18:
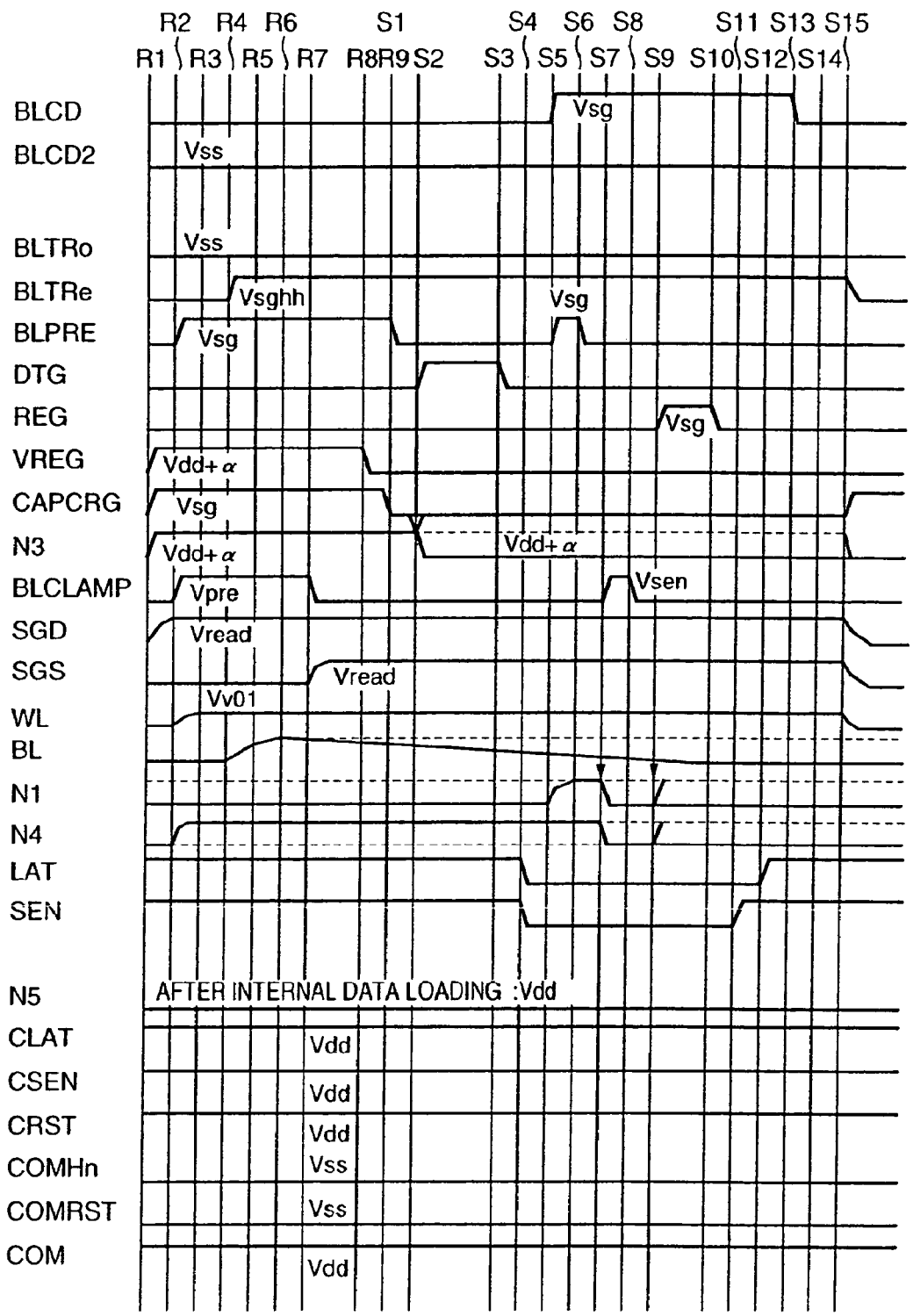
FIG. 18 illustrates timing of retrieval "Verify01" for programming verification in which the solid line indicates programming failure in "0"-programming to the first (upper) bit in which "11"-stored cells are programmed with "01" in the first embodiment.

Disclosed next is retrieval VERIFY01 (step S26 in FIG. 9B) for "01"-programming verification with reference to FIG. 18 that shows an example of the timing for VERIFY01.

The difference between VERIFY00 and VERIFY01 is that, in the latter, a selected word line is set at Vv01 (FIG. 43B) for retrieval for programming verification.

For page buffers performing "01"-programming from "11", a bit line potential is sensed at the selected word line potential Vv01, while for "1"-programming for clamping the "11"-state, the node N1 is re-charged to clamp the "1"-programmed state.

On the other hand, for page buffers performing "00"-programming from "10", programming will always be failed for the memory cells for which programming has been failed in VERIFY00. This is because a threshold level Vt for the memory cells for which programming will be failed in VERIFY00 is lower than Vv00, which results in that failure will often occur for retrieval at Vv01 on the selected word line in VERIFY01.

For page buffers for programming "1" for clamping the "00"-programmed state, the per-bit verification described above is performed for clamping the "1"-programmed state without failure.

As disclosed above, retrieval for programming verification in VERIFY00 and VERIFY01 is realized. A programming cycle having the programming pulse applying operation and the retrieval for programming verification is repeated until programming is completed for all page buffers in a page (step S27 in FIG. 9B) to execute programming in selection of the first row address for multilevel operation.

Figure 19A:
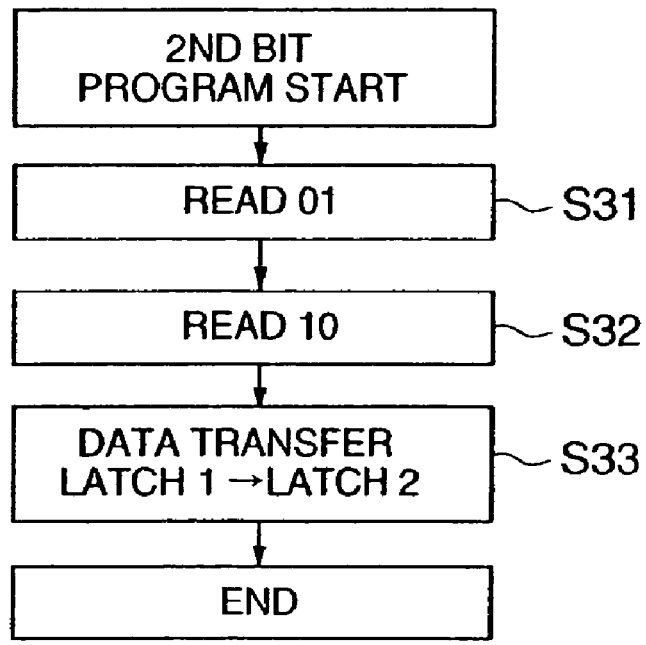
FIG. 19A is a flow chart of the second-bit data retrieval in multilevel operation in the first embodiment.
Figure 19B:
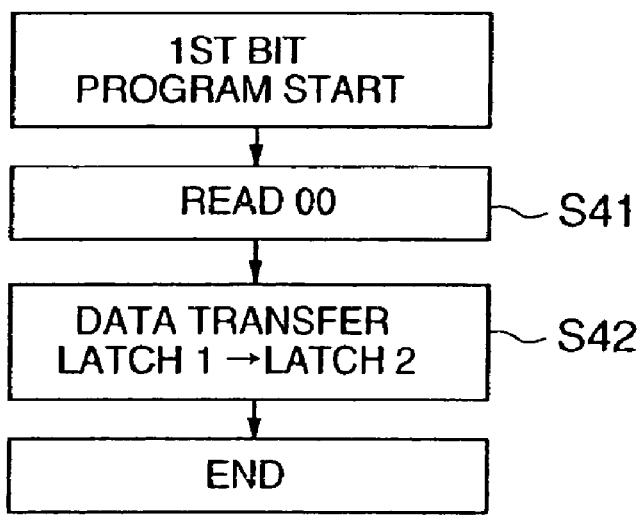
FIG. 19B is a flow chart of the first-bit data retrieval in multilevel operation in the first embodiment.

Disclosed next with reference to FIGS. 19A and 19B is a retrieval operation.

Retrieval depends on row addresses because, as illustrated in FIG. 43B, 2-bit data in multilevel operation is allocated in such a way that the upper and the lower bits are used as data in selection of the first and the second row addresses, respectively, in multilevel operation.

In retrieval of the upper bit at which the first row address for multilevel operation has been stored, a retrieval operation READ00 (step S41 shown in FIG. 19B) is performed only once at the potential Vr00 (FIG. 43B) on the selected word line, to retrieve 2-bit data of "0" or "1".

On the other hand, in retrieval of the lower bit at which the second row address for multilevel operation has been stored, two retrieval operations READ00 and also READ10 (steps S31 and S32 shown in FIG. 19A) are performed at the potentials Vr01 and Vr10 (FIG. 43B), respectively, on the selected word line.

Figure 20:
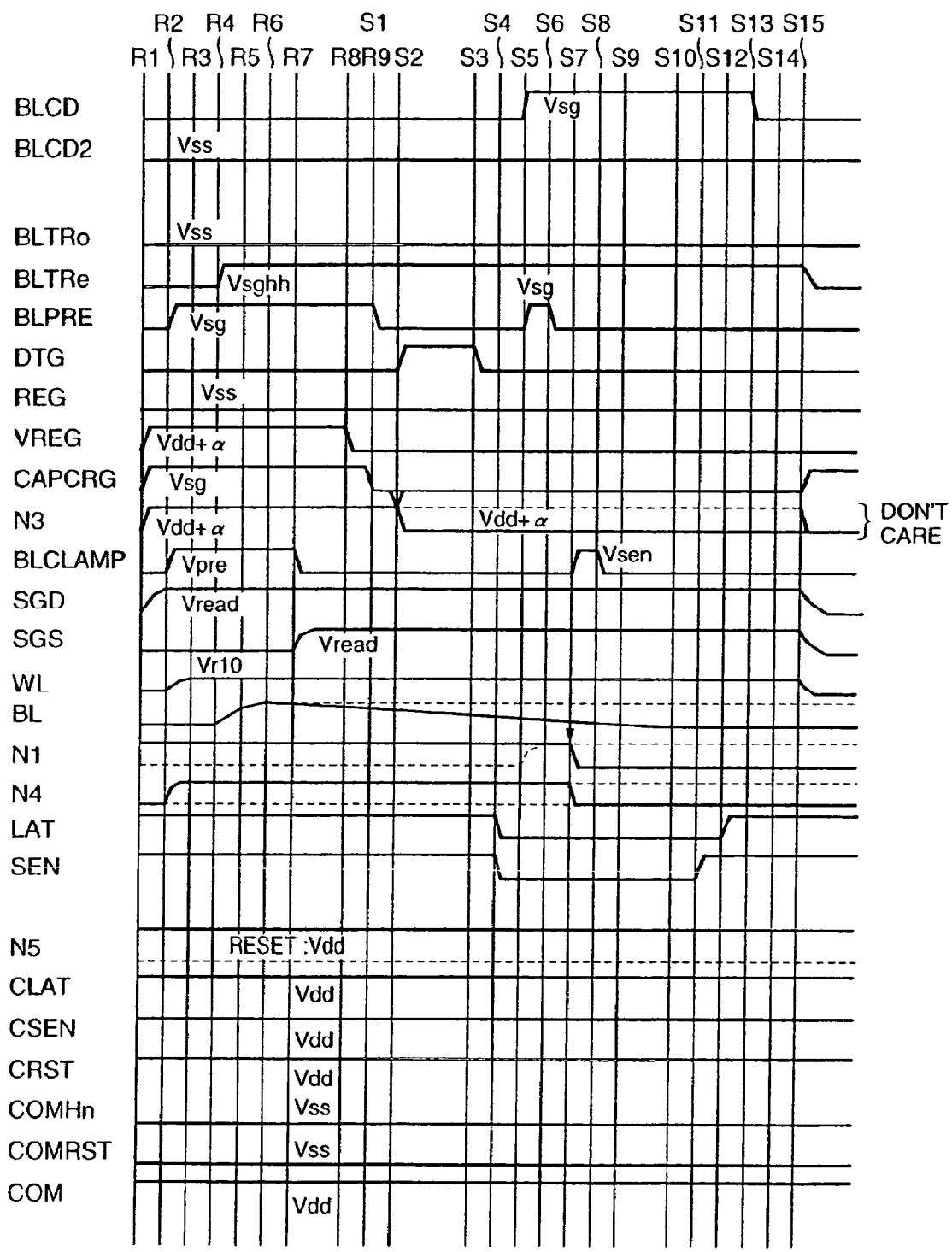
FIG. 20 illustrates timing of retrieval "Read00" in which the solid line indicates retrieval from "10"- or "11"-programmed cell in the first embodiment.

Disclosed first is the retrieval operation READ00 in selection of the first row address for multilevel operation with respect to an example of the timing of READ00 in FIG. 20.

For a pre-charging period up to a moment R7, in FIG. 2, the NMOS transistors 47 and 41, and the bit line selection transistor 60 are turned on. The potential Pre is supplied to the gate of the NMOS transistor 41 to pre-charge (Vpre−Vt) on the bit line BLe. The source-side transistor SG2 (FIG. 3) in a NAND cell unit NU is turned on at the moment R7 to start discharging from the selected bit line.

At a moment S4, the potentials LAT and SEN at the gates of the NMOS transistors 14 and 18, respectively, are set at the level "LOW" to turn on the NMOS transistor 42 for setting the nodes N1 and N4 at the same potential and also turn on the NMOS transistor 47 to be charged at Vdd.

At the moment S7, the potential CLAMP at the gate of the NMOS transistor 41 is set at Vsen to clamp the bit line potential for retrieval, thus a small bit line potential (Vpre−Vse) of about 0.4V being amplified and retrieved at the node N1.

At moments S11 and 512, the potentials LAT and SEN are set at the level "HIGH" in this order to successively activate the clocked inverters of the first latch 1a to retrieve the data at the node N1.

After the data has been stored in the latch 1a, data for one page that have already been stored in the latch 1a are simultaneously transferred to the second latch 2a (step S42 in FIG. 19B). For pages each having 512 bytes, data are simultaneously transferred from the latch 1a to the second latch 2a in each 512-byte page buffer in accordance with the timing shown in FIG. 10B.

Each second latch 2a is connected to the data input/output buffer 50a via the column selection transistors 51 and 52 through the data lines io/ion, as shown in FIG. 3. A "HIGH" level-column decode signal CSL allows data to be retrieved out from the latch 2a via the data input/output buffer 50a through the data lines io/ion.

In the cell array divided into two arrays as shown in FIG. 45B, simultaneous retrieval described above in selection of one page of the two arrays with one row address allows simultaneous data transfer in 2-page page buffer under the control of the data input/output buffer 50a such that 1-page data of the cell 100a is output by the second latch 2a after data transfer, and then 1-page data of the cell 100b is output.

As disclosed, data in selection of the first row address for multilevel operation can be output with one retrieval and data transfer operation.

Disclosed next is a retrieval operation in selection of the second row address for multilevel operation.

This retrieval operation is performed twice as READ01 and READ10 in steps S31 and 32, as shown in FIG. 19A.

Figure 21:
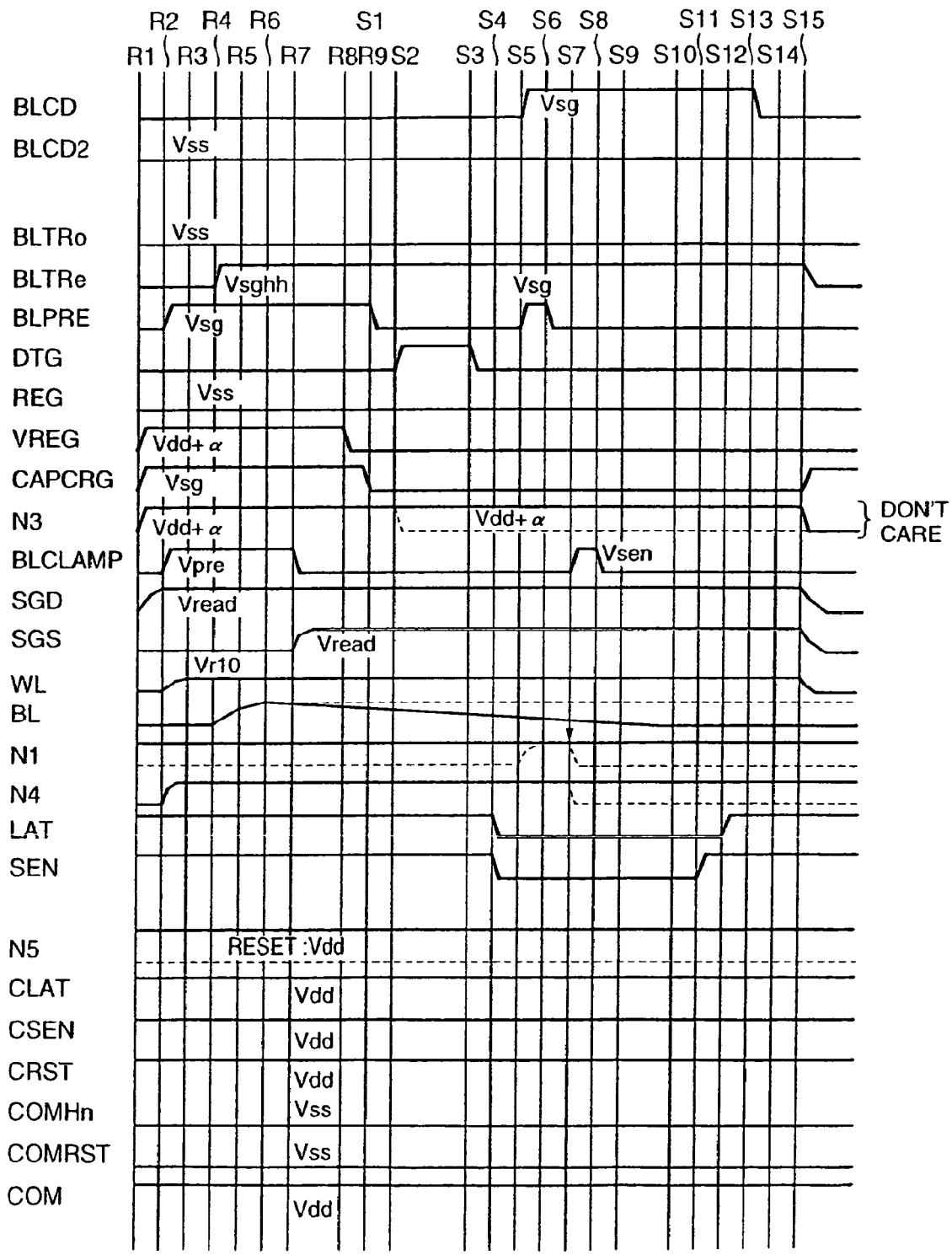
FIG. 21 illustrates timing of retrieval "Read01" in which the solid line indicates retrieval from a "00"-, "10"- or "11"-programmed cell in the first embodiment.

FIG. 21 is an example of the timing for READ01. The difference between READ00 (FIG. 19B) and READ01 is only that the latter has a selected word line potential Vr01 (FIG. 43B), thus the detailed description of READ01 being omitted.

Figure 22:
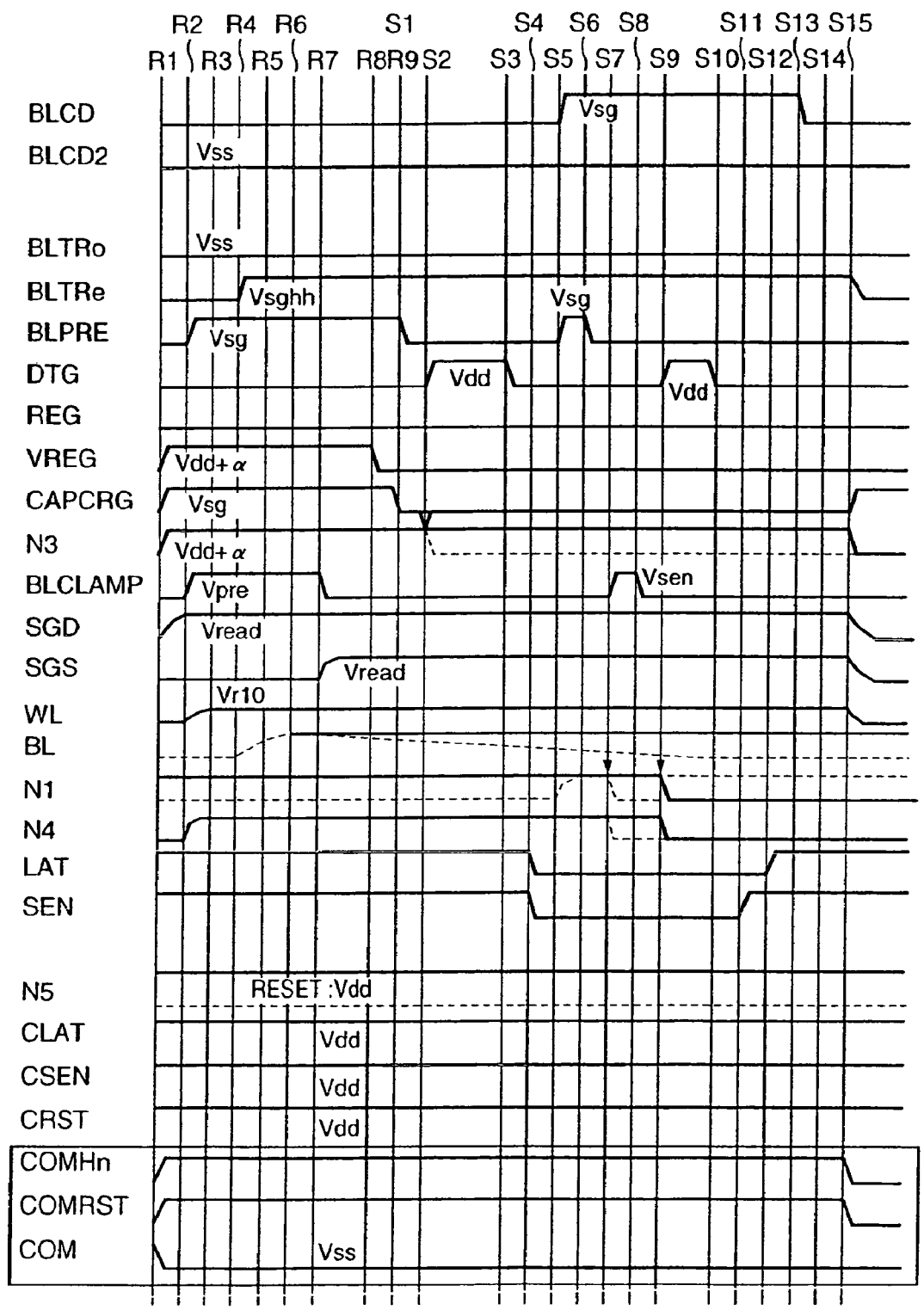
FIG. 22 illustrates timing of retrieval "Read10" in which the solid line indicates retrieval from a "01"-programmed cell in the first embodiment.

After READ01, a retrieved data is stored in the first latch 1a (FIG. 2), followed by READ10, an example of the timing for READ10 being shown in FIG. 22.

Retrieval is performed at the selected word line potential Vr10 (FIG. 43B). The retrieval operation in READ10 is almost the same as READ01 from bit line pre-charging to the moment S9, the differences between READ10 and READ00 (and READ01) being that, in the former, a potential COMRST at the gate of an NMOS transistor 91 and a potential at a node COM (the common signal line COM) are set at the levels "HIGH" and "LOW", respectively.

In READ10 following READ01, the data retrieved in READ01 has been stored in the first latch 1a until the moment S4.

The potential at the node N3 is not related to the retrieval operation in READ00 and READ01, however, related in READ10. In detail, the node N3 is charged to (Vdd+α) to be floating by a moment S2. A Vdd-level DTG at the gate of the NMOS transistor 45 at the moment S2 allows the node N3 to clamp (Vdd+α) when the node N1 connected to the first latch 1a is clamped at the level "HIGH" whereas the node N3 is discharged to 0V when the node N1 is at the level "LOW".

At a moment S7, the bit line potential is amplified and then, at a moment S9, the control signal REG is set at the level "HIGH" to turn on the NMOS transistor 44 because the node N3 has been at the level "HIGH" when the node N1 has been clamped at the level "HIGH" in READ01 (FIG. 19A). This results in discharging from the nodes N1 and N4 to the node COM, and then, at a moment S12, the node N1 is clamped at the level "LOW". In other words, the level "LOW" as data "1" is stored at the node N1 when the memory cell is in the "01"-state shown in FIG. 43B.

When the level "LOW" is stored at the node N1 in READ01, the NMOS transistor 44 is not turned on at the moment S9, thus no discharging from the nodes N1 and N4, and the potential at the node N1 that is the amplified bit line potential being sensed and stored at moments S11 and S12.

Figure 10B:
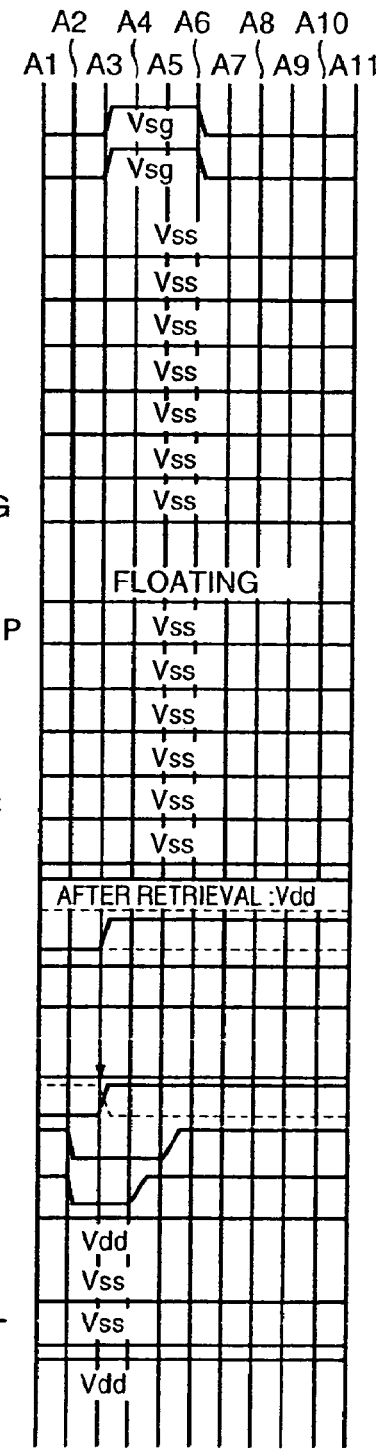
FIG. 10B illustrates timing of data transfer from the first latch 1a to the second latch 2a in the first embodiment.

On completion of READ01 and READ10, the data retrieved for the second row address for multilevel operation and stored in the first latch 1a is transferred to the second latch 2a (step S33 in FIG. 19A) in accordance with the timing shown in FIG. 10B, the process (FIG. 19A) being completed in which the latch 2a being ready for data output.

The potential change in the retrieval operation disclosed above is shown in FIGS. 38 to 41. FIG. 38 shows the first (upper) bit retrieval while FIGS. 39 to 41 show the second (lower) bit retrieval. Particularly, FIGS. 40 and 41 shown the second time-lower bit retrieval when the potential at the node N1 has been "HIGH" and "LOW", respectively, as the result of the first time-lower bit retrieval.

Disclosed next is usage of the second latch 2a (FIG. 2) as a cache memory for enhancing effective programming speed.

Figure 23:
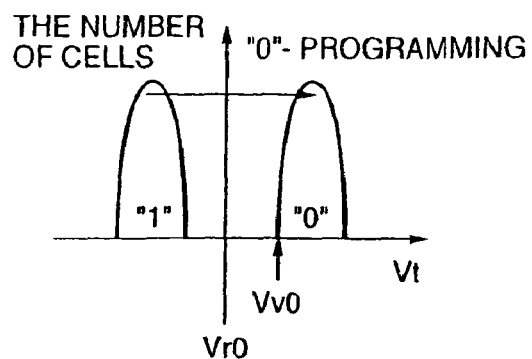
FIG. 23 illustrates data and threshold level in a 1-bit cell in a two-level operation.

The relationship between data and distribution of threshold level Vt for 1-bit memory cell in two-level operation mode is illustrated in FIG. 23.

Retrieval with the second latch 2a as a cache memory is performed like READ00 (FIG. 19B) already described except that a selected word line is set at Vr0 in FIG. 23 because this retrieval operation is performed only once.

Figure 24A:
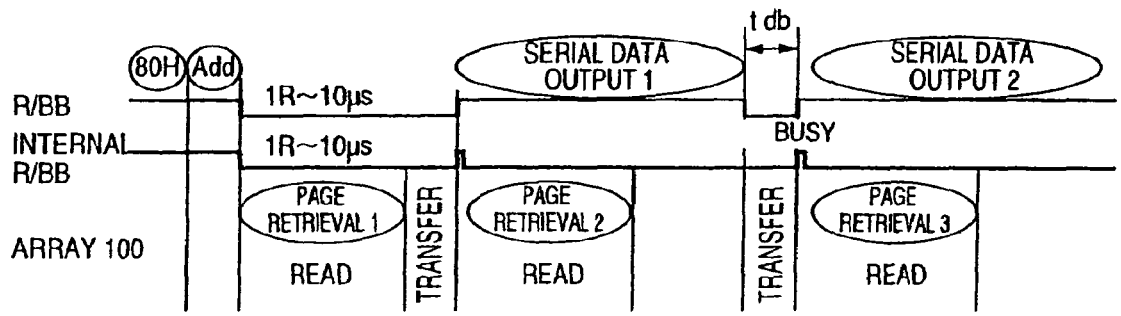
FIG. 24A illustrates retrieval from one memory cell array using cache memory in the first embodiment.
Figure 24B:
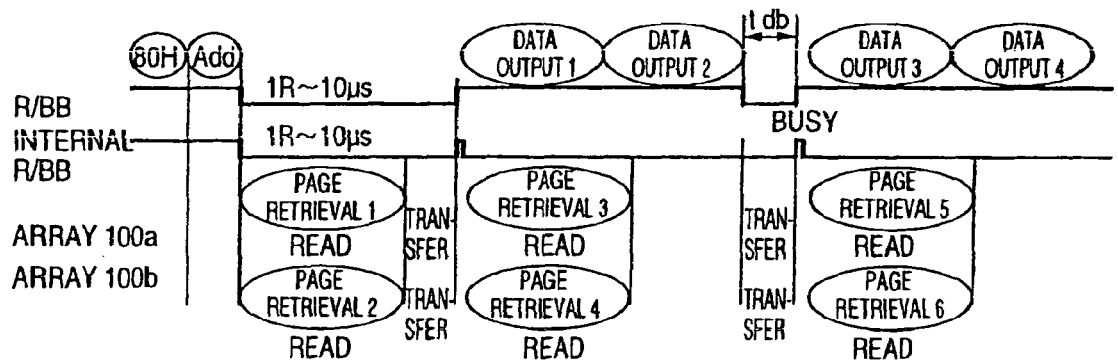
FIG. 24B illustrates retrieval from two memory cells array using cache memory in the first embodiment.

FIGS. 24A and 24B illustrate examples of timing for retrieval with the second latch 2a as a cache memory.

In detail, FIG. 24A illustrates retrieval using one memory cell array. On reception of a retrieval command "00H" and entry of the first row address, READY//BUSY (abbreviated to R/BB hereinafter) is set at the level "LOW", or a busy-state is output to perform PAGE RETRIEVAL 1 (the same as READ00 in FIG. 19B).

On completion of PAGE RETRIEVAL 1, 512-byte data that correspond to the retrieved first row address and have been stored in the first latch 1a (FIG. 2) of each page buffer are transferred to the second latch 2a the same as in step S33 in FIG. 19A.

Then, R/BB is set at the level "HIGH" (a ready state) to allow SERIAL DATA OUTPUT 1 with a retrieval enable signal READ-ENABLE. In detail, the data corresponding to the first row address is output from the second latch 2a to the data input/output terminal I/O (FIG. 3) in synchronism with the signal READ-ENABLE while the second row address is being selected for execution of PAGE RETRIEVAL 2 with R/BB set at the level "LOW" (a bust state BUSY).

Completion of SERIAL DATA OUTPUT 1 is detected to set R/BB at the level "LOW" (BUSY) for performing data transfer from the first latch 1a to the second latch 2a. In other words, the data stored in the latch 1a (the result of PAGE RETRIEVAL 2) cannot be transferred to the latch 2a until SERIAL DATA OUTPUT 1 from the latch 2a is completed.

On completion of the data transfer, R/BB is set again at the level "HIGH" (a ready state) to start SERIAL DATA OUTPUT 2 while the third row address is being selected to execute PAGE RETRIEVAL 3.

The retrieval operation as disclosed above serves to shorten a period "tdb" between SERIAL DATA OUTPUTs 1 and 2 for the second row address retrieval during data output corresponding to the first row address.

When one page capacity is 512 bytes, a page-retrieval time is 10 μs and a serial data output cycle is 50 ns, an effective retrieval time is generally 14 Mbytes/s, however, in this embodiment, the maximum effective retrieval time reaches 19 Mbytes/s at tdb=1 μs.

Here, R/BB is a READY//BUSY signal for a user to determine whether data input/output is enable or not whereas INTERNAL R/BB shown in FIG. 24A is a flag signal for the controller 110 (FIG. 1) to judge the control sequence, the same as in the following disclosure.

FIG. 24B illustrates simultaneous retrieval from a 2-array memory cell.

After entry of retrieval command "00H" and address, PAGE RETRIEVAL 1 is performed for the input first row address to the cell array 100a (FIG. 45B) and also PAGE RETRIEVAL 2 for the same input first row address to the cell array 100b (FIG. 45B). In other words, two pages are selected for the first row address, which seems to be double page capacity when looked from outside the EEPROM chip.

Like shown in FIG. 24A, R/BB has been set at the level "LOW" (BUSY) until each retrieval and data transfer is completed.

For data output, DATA OUTPUT 1 from the cell array 100a and DATA OUTPUT 2 from the cell array 100b are performed in this order. On data output, the second row address is selected to execute PAGE RETRIEVALs 3 and 4 from the cell arrays 100a and 100b, respectively.

The maximum effective retrieval speed reaches 20 Mbytes at tdb=1 μs in this retrieval operation whereas 17 Mbytes in general.

Figure 25A:
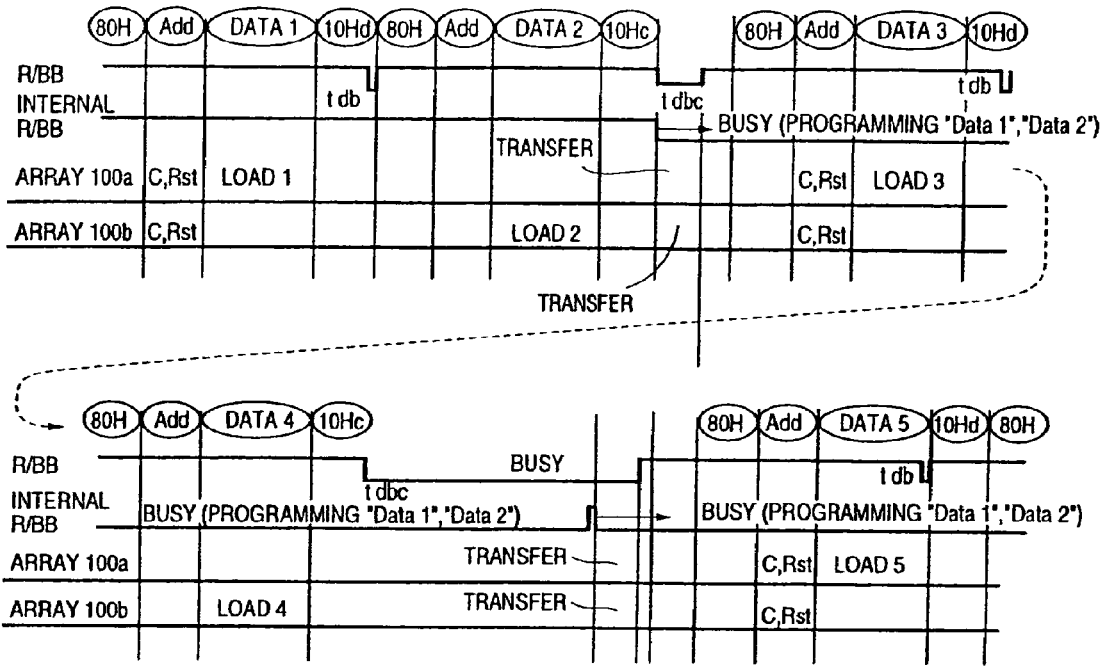
FIG. 25A illustrates programming using cache memory in the first embodiment.
Figure 25B:
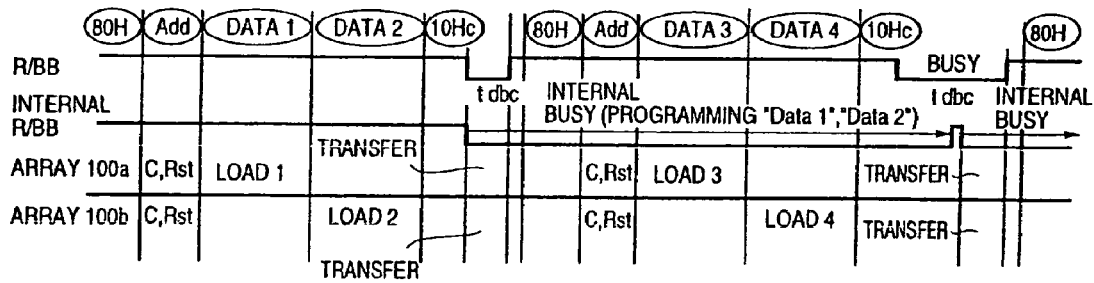
FIG. 25B illustrates programming from two memory cell array (double in page capacity) using cache memory in the first embodiment.
Figure 25C:
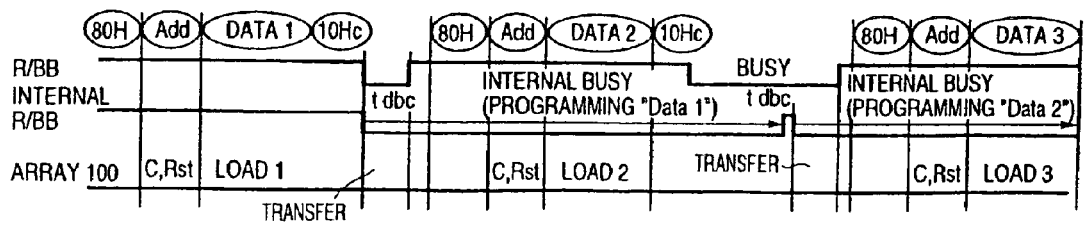
FIG. 25C illustrates programming from one memory cell array using cache memory in the first embodiment.

Disclosed next with reference to FIGS. 25A to 25C are programming operations with the second latch 2a as a cache memory for simultaneous programming to the cell arrays 100a and 100b.

After entry of data input command 80H and address, data to be programmed "Data 1" corresponding to the first row address is input (Load 1) to the cell array 100a. And then, after entry of data input command 80H and address, data to be programmed "Data 2" corresponding to the second row address is input (Load 2) to the cell array 100b.

A programming command "10Hd" is a dummy command under which no programming operation is performed for simultaneous programming to two cell arrays.

For enabling sequential data loading "load 3" and "Load 4", R/BB is set at the level "LOW" (a busy signal) and instantaneously set at the level "HIGH" (a quasi-ready signal).

After entry of the initial data input command "80H", the second latches 2a used as a cache memory in all page buffers are reset (C, Rst in FIGS. 25A to 25C) by switching the PMOS transistor 82 (FIG. 2).

A programming execution command "10Hc" (FIG. 25A) following "Load 2" starts simultaneous programming to two cell arrays. Data is transferred from the second latch 2a to the first latch 1a in each page buffer, followed by the programming pulse applying operation and the retrieval for programming verification as already described.

The data transfer is executed in accordance with the timing shown in FIG. 10A. The programming pulse applying operation is executed in accordance with the timing shown in FIG. 11. Moreover, the retrieval for programming verification is executed in accordance with the timing like VERIFY 1 shown in FIG. 13 at the selected word line voltage Vv0.

The internal R/BB is set at the level "LOW" (a busy state) while the programming is being executed. After data transfer, R/BB is set at the level "HIGH" (a quasi-ready state) to allow data loading to the second latch 2a because all latches 2a are free from the programming pulse applying operation after data loading as already discussed.

After data loading "Load 4", the programming execution command "10Hc" is entered again. When simultaneous programming of data "Data 1" and "Data2" has not been completed, data "Data 3" and "Data 4" stored in the second latch 2a cannot be transferred to the first latch 1a. Such data transfer is performed after the programming of the data "Data 1" and "Data 2" is completed and the internal R/BB is set at the level "HIGH" (a ready state). Then, programming of the data "Data 3" and "Data 4" is executed and R/BB is set at the level "HIGH" (a ready state), to enable the succeeding data loading to the latch 2a.

Like the retrieval operation, also in this programming operation, selection can be performed one page by one page on two or more arrays to one row address, as illustrated in FIG. 25B using the second latch 2a as a cache memory.

Following the data loading "Load 1" for the cell array 100a (FIG. 45B), the data loading "Load 2" for the cell array 100b is executed with the programming execution command "10Hc" under which programming of the data "Data 1" and "Data 2" starts while enabling the succeeding data loading.

FIG. 25C illustrates the timing of the programming operation using the second latch 2a as a cache memory for 1-array cell memory. The programming execution command "10Hc" enables both data programming operation and data loading.

The same for the timing shown in FIGS. 25A to 25C is that the transfer of data loaded into the cache memory (the second latch 2a) to the first latch 1a is allowed after the internal R/BB is set in a ready state.

The following are effective programming speeds achieved in this embodiment using the second latch 2a as a cache memory under the requirement that a serial data input cycle and a 1-page programming-completion time are 50 ns and 200 μs, respectively, at 512 bytes per page.

In 2-array memory cell simultaneous programming, compared to 4.1 Mbytes with no cache memory, the embodiment using a cache memory achieves 5.1-Mbyte effective programming speed because a 2-page data loading time is masked behind the programming time.

Moreover, in 4-array memory cell simultaneous programming, compared to 6.8 Mbytes with no cache memory, the embodiment using a cache memory achieves 10-Mbytes.

Accordingly, the present invention achieves a very high effective programming speed by using a cache memory for both 2- and 4-array memory cell simultaneous programming.

As disclosed, the page buffer 140 shown in FIG. 2 offers a multilevel operation, moreover, in two-level operation, offers a caching function for higher effective programming and retrieval speed.

Moreover, the page buffer 140 functions like the one for two-level operation when the second latch 2a and the NMOS transistor 30 are omitted. A PMOS transistor 90 and the NMOS transistor 91, both connected to the node COM, can be shared by a plurality of page buffers, for example, one for each per 8 page buffers the same number of I/Os.

Therefore, the page buffer 140 offers both the multilevel operation (function) and caching function in a simple way as disclosed above. Both functions are switched with changing programming and retrieval control performed by the controller 110 (FIG. 1). Thus, the present invention achieves switching the multilevel operation and the caching function in two-level function by changing control and address space under command entry.

Second Preferred Embodiment

The first embodiment with 2-array memory cell in caching operation has several advantages as discussed above.

The second latch 2a (FIG. 2) functioning as a cache memory is reset at entry of an address before 2-page data loading, for example, at entry of an address before "Load 1" and "Load 3" in FIG. 25A. The latch 2a must be reset before data loading, however, the resetting after execution of a data load command during programming after data transfer could be performed at any timing during programming due to unstable data load command timing. This further could cause affection of noise from power supply to the resetting operation to the second latch 2a while sensing the retrieval for programming verification.

Figure 26:
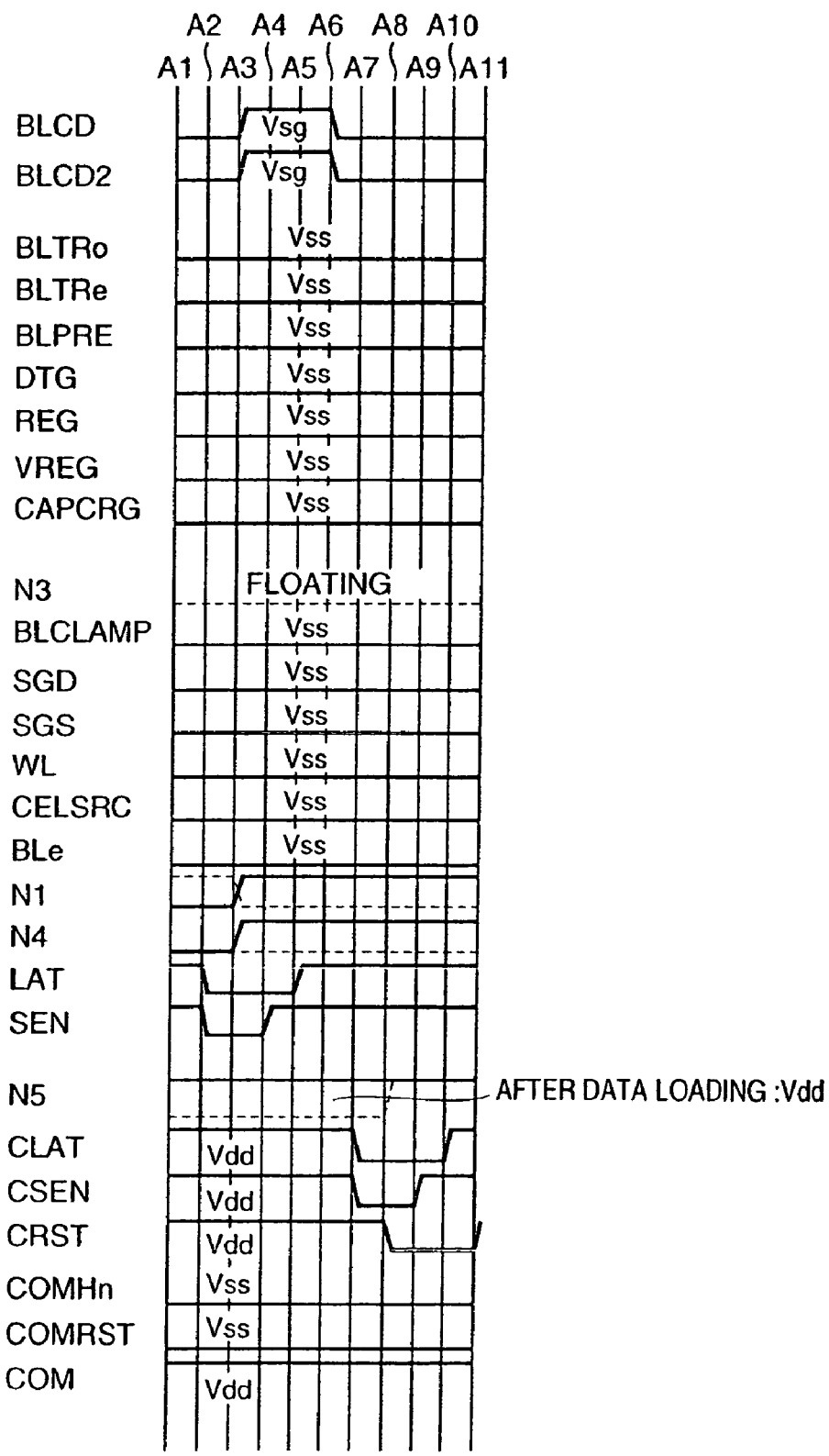
FIG. 26 illustrates timing of data transfer with latch (2a) resetting in the second embodiment.

To overcome such a problem, the second embodiment performs resetting of the second latch 2a just after data transfer from the latch 2a to the first latch 1a, as shown in FIG. 26, or performs the resetting always before programming operation.

The resetting of the second latch 2a is required before the initial data loading. However, resetting at unstable timing to the latch 2a during programming can be eliminated with no resetting at entry of "80H" and address during programming.

Figure 27:
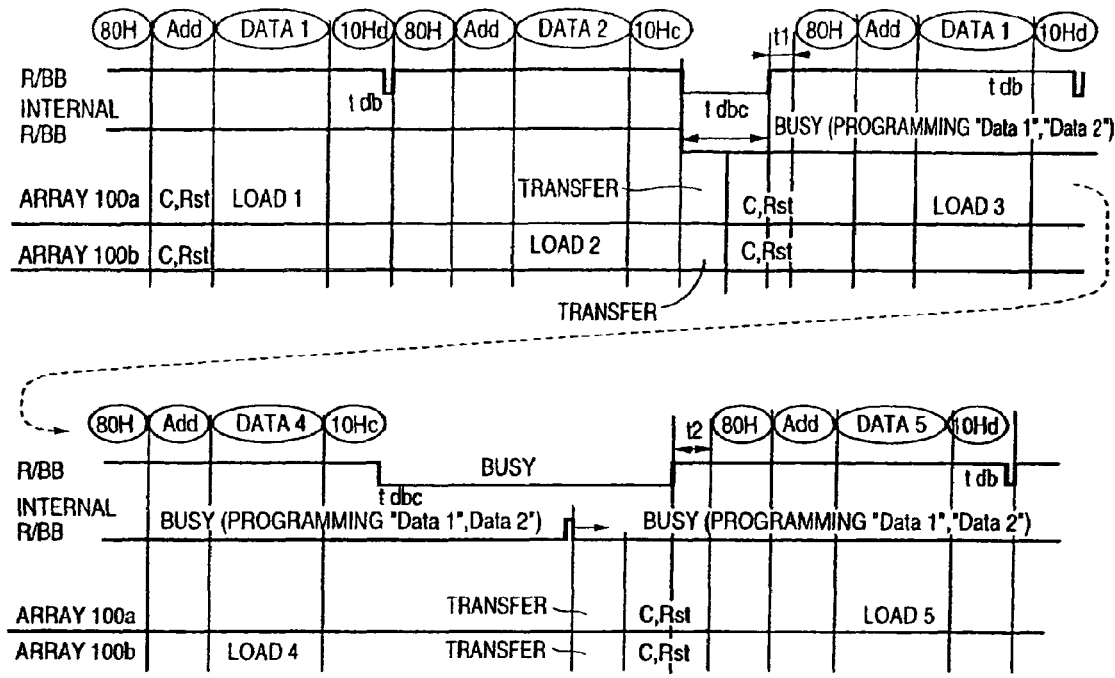
FIG. 27 illustrates programming using cache memory in the second preferred embodiment of a NAND-type flash EEPROM according to the present invention.

FIG. 27 illustrates a programming operation using a cache memory for eliminating such resetting at unstable timing, which is applicable to the operations FIG. 25A to 25C.

In detail, 2-page simultaneous programming starts after 2-page data loading "Load 1" and "Load 2", and then, on completion of data transfer from the second latch 2a to the first latch 1a and latch (2a)-resetting (C. Rst), R/BB is set to a quasi-ready state "HIGH".

This sequence allows resetting the latch 2a only before programming no matter how the timing t1 varies for succeeding data load command entry during programming of the data "Data 1" and "Data 2" or the following timing t2, thus suppressing noise from the power supply in programming using a cache memory.

Third Preferred Embodiment

Disclosed in the first embodiment is switching between the multilevel operation for storing 2-bit data to one non-volatile memory cell and the caching operation in two-level operation using the page buffer 140 (FIG. 2).

Figures 28A, 28B:
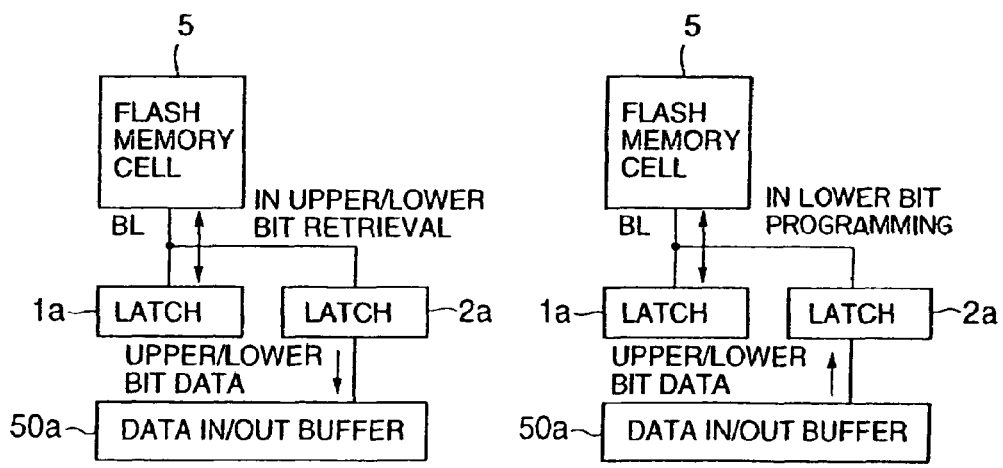
FIG. 28A illustrates data transfer using cache memory in multilevel operation.
FIG. 28B illustrates data transfer using cache memory in multilevel operation.

A caching operation using the second latch 2a is also possible in multilevel operation while the latch 2a is free, for example, during a retrieval operation. As shown in FIG. 28A, data output from the latch 2a is allowed while the main page buffer having the first latch 1a is being connected to a selected bit line for retrieval.

The second latch 2a is also free from programming in selection of the second row address for multilevel operation. The succeeding data to be programmed thus can be loaded into the latch 2a during programming, as shown in FIG. 28B.

The caching function is, however, prohibited in programming in selection of the first row address for multilevel operation because the programming is executed while the data in selection of the second row address for multilevel operation has been stored in the second latch 2a by the internal data loading already described.

Figure 29:
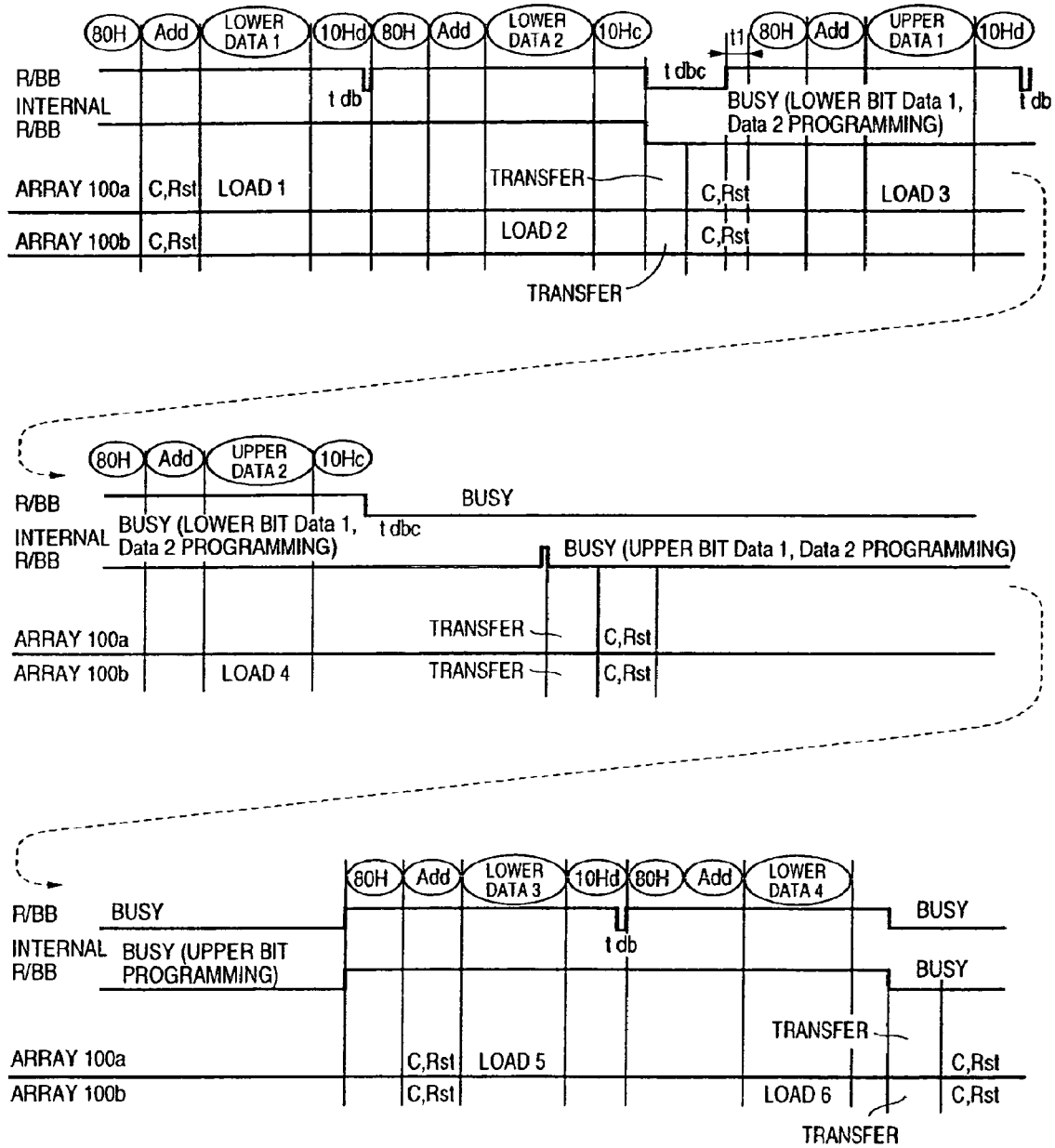
FIG. 29 illustrates programming using cache memory in multilevel operation.

FIG. 29 illustrates a programming operation in a multilevel operation mode using a cache memory. In the drawing, "Lower Data" and "Upper Data" represents data to be programmed for the second row address and the first row address, respectively, for multilevel operation.

In FIG. 29, "Lower Data 1" and "Lower Data 2" for the second address for multilevel operation are successively input at data loading "Load 1" and "Load 2", respectively. On entry of the first programming execution command "10Hc", data is transferred from the second latch 2a to the first latch 1a simultaneously for two memory cell arrays and programming is executed for the second row address for multilevel operation during the succeeding data loading "Load 3" and "Load 4" for entry of data "Upper Data 1" and "Upper Data 2" to be programmed, respectively, for the first row address for multilevel operation.

On completion of the programming for the second row address for multilevel operation, the data to be programmed for the first row address for multilevel operation is transferred from the second latch 2a to the first latch 1a to start programming.

Although not indicated in FIG. 29 for the programming for the first row address for multilevel operation, the data corresponding to the second row address for multilevel operation has been retrieved from a selected memory cell and stored in the second latch 2a by the internal data loading already described.

This prohibits the succeeding data loading until completion of upper-bit programming in selection of the first row address for multilevel operation. Although, whether the sequential programming is allowed or not depends on row address for programming, a data loading time can be shortened by half with the caching operation.

The third embodiment thus also achieves high effective programming speed although programming in the multilevel mode takes long compared to usual two-level mode for storing 1-bit data to one non-volatile memory cell.

Fourth Preferred Embodiment

Elements in this embodiment that are the same as or analogous to elements in the first embodiment are referenced by the same reference numbers and will not be explained in detail.

Figure 30:
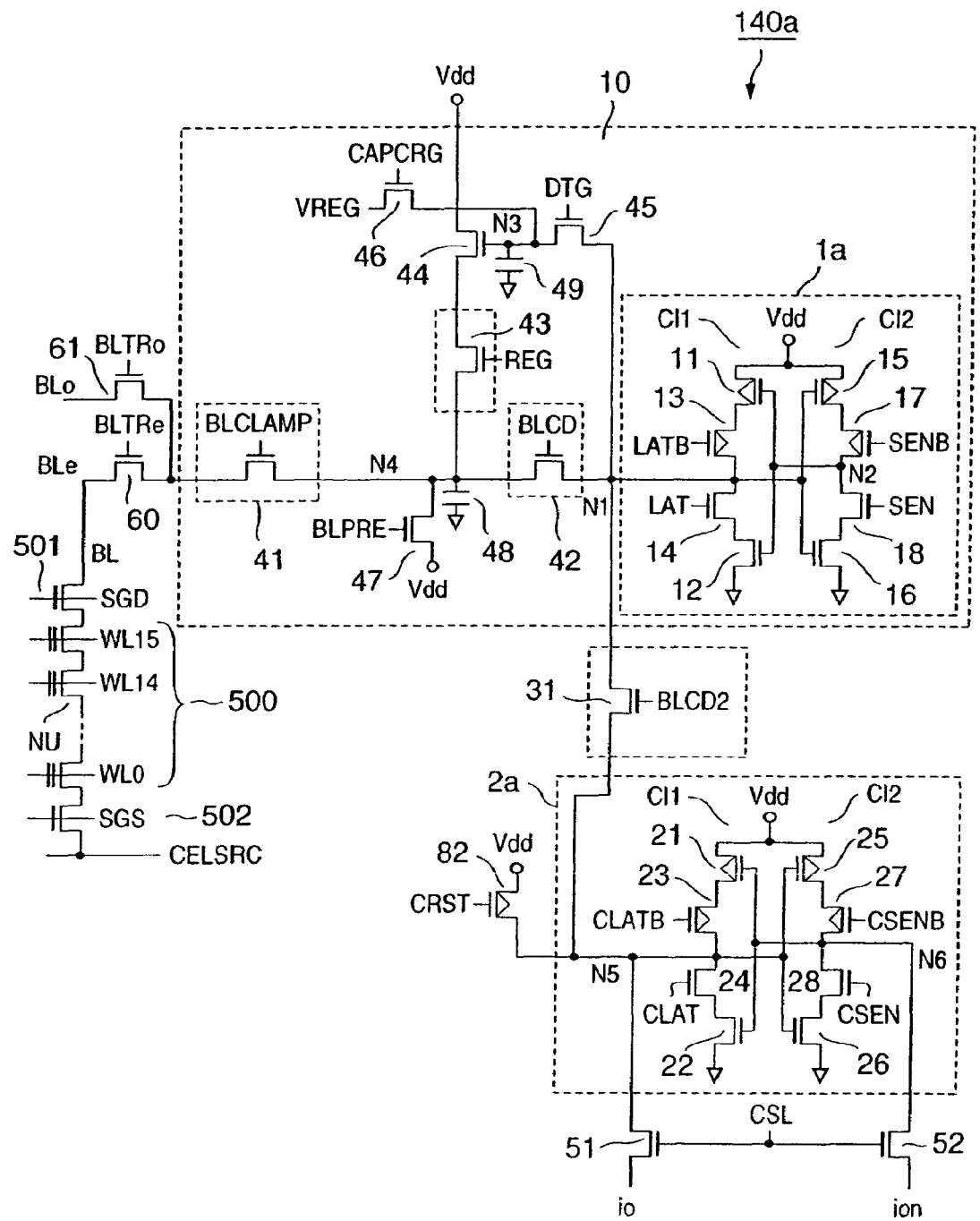
FIG. 30 shows a circuit diagram of a page buffer (a reprogramming and retrieval circuit) in the fourth preferred embodiment of a NAND-type flash EEPROM according to the present invention.

In a page buffer 140a shown in FIG. 30, the switching NMOS transistor 31 is provided between the nodes N1 and N5 for the first latch 1a and the second latch 2a, respectively. This circuit arrangement achieves the caching function discussed above although without multilevel function. Data transfer between the latches 1a and 2a is allowed under control of the NMOS transistor 31 for transferring the level "HIGH" or "LOW".

Fifth Preferred Embodiment

NAND-type flash EEPROMs repeat the programming pulse applying operation and the retrieval operation for programming verification until programming of all 512-byte memory cells in one page is completed.

FIG. 14 illustrates a voltage waveform applied to a selected word line in step-up pulse-programming in which a programming voltage Vpgm is increased step by step during the repetition of programming pulse applying and retrieval for programming verification cycle.

The step-up pulse-programming is automatically executed by a controller; however, the control can be interrupted for measurement of cell current with the page buffer 140 shown in FIG. 2.

As disclosed, a two-level programming verification operation is controlled by the main reprogramming/retrieval circuit 10 and the retrieved data after verification is stored in the first latch 1a. Therefore, on completion of one cycle of programming pulse applying operation and retrieval operation for programming verification, a usual programming control for executing the succeeding programming pulse applying operation is prohibited in accordance with the result of verification, for measurement of cell current, with securing the data stored in the latch 1a under programming.

The cell current measurement is performed in a way that, in FIG. 2, the potential BLCD is set at the level "LOW" to turn off the switching NMOS 42 to clamp data in the first latch 1a while the potentials CLAT and CSEN are set at the level "LOW" and the potentials CLATB and CSENB are set at the level "HIGH" simultaneously, to deactivate the second latch 2a to turn on the bit line selection transistor 60, the transfer transistors 41 and 30, and also the column gate transistor 51 located between a selected bit line and the data line "io", to turn on from the line "io" to the data input/output terminals I/O.

Figure 31A:
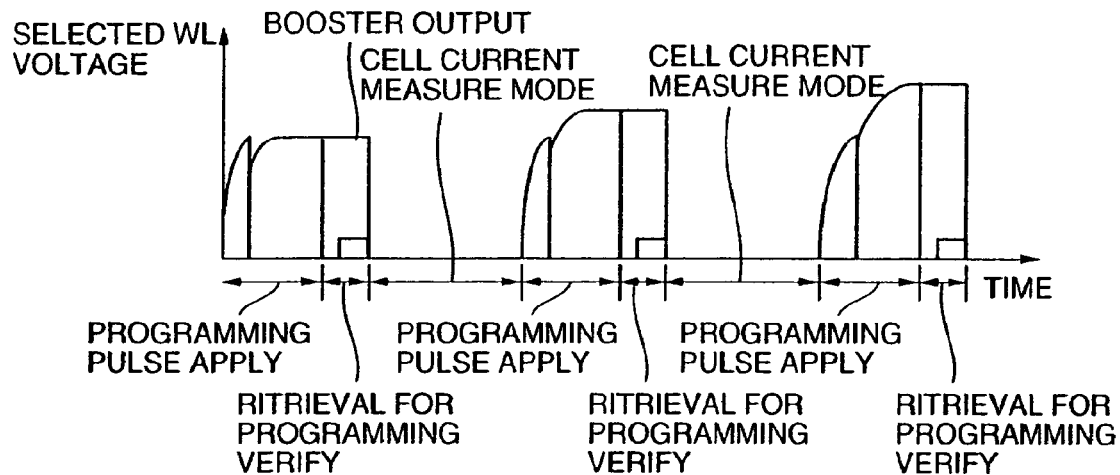
FIG. 31A illustrates signal waveforms in known test mode.
Figure 31B:
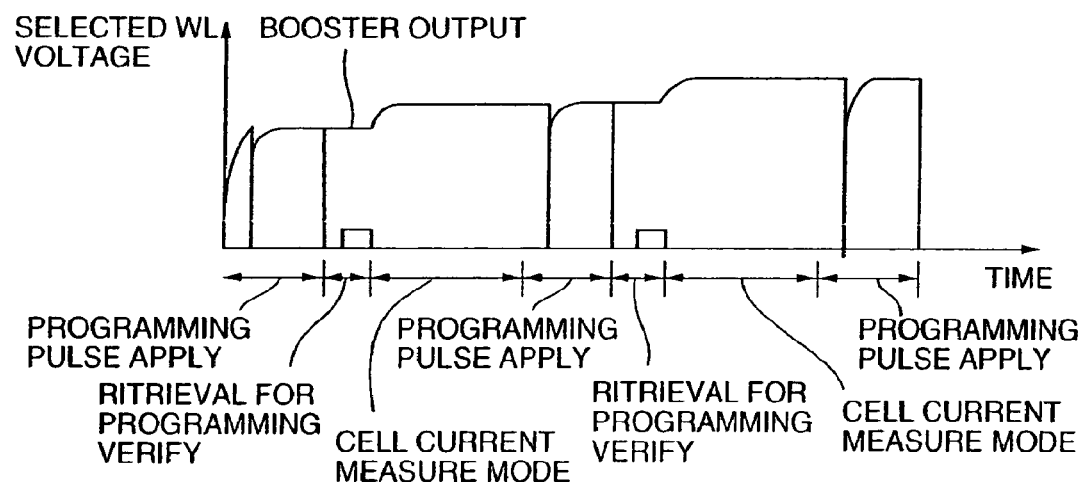
FIG. 31B illustrates signal waveforms in test mode (cell current measurement during programming) in the fifth preferred embodiment of a NAND-type flash EEPROM according to the present invention.

Measurement of cell current is illustrated in FIGS. 31A and 31B. FIG. 31A teaches a known test mode with a mode for programming voltage setting or programming or cell current measurement mode whereas FIG. 31B shows the test mode according to the present invention.

The known mode requires complex control in which a verify result is retrieved from a latch, and, after completion of cell current sensing, the verify result is retrieved again for the succeeding programming, for judgment of cell current/verify result relationship, otherwise, the cell current measurement mode will damage the verify result stored in a latch.

Moreover, as indicated in FIG. 31A, the rising characteristics of a voltage booster affects that of a selected word line voltage and also its waveform.

Contrary to this, in the present invention shown in FIG. 31B, a programming cycle is interrupted once for cell current measurement while a verify result in programming is being stored. On completion of the cell current measurement, the succeeding programming cycle starts.

Sixth Preferred Embodiment

Elements in this embodiment that are the same as or analogous to elements in the first embodiment are referenced by the same reference numbers and will not be explained in detail.

Figure 46:
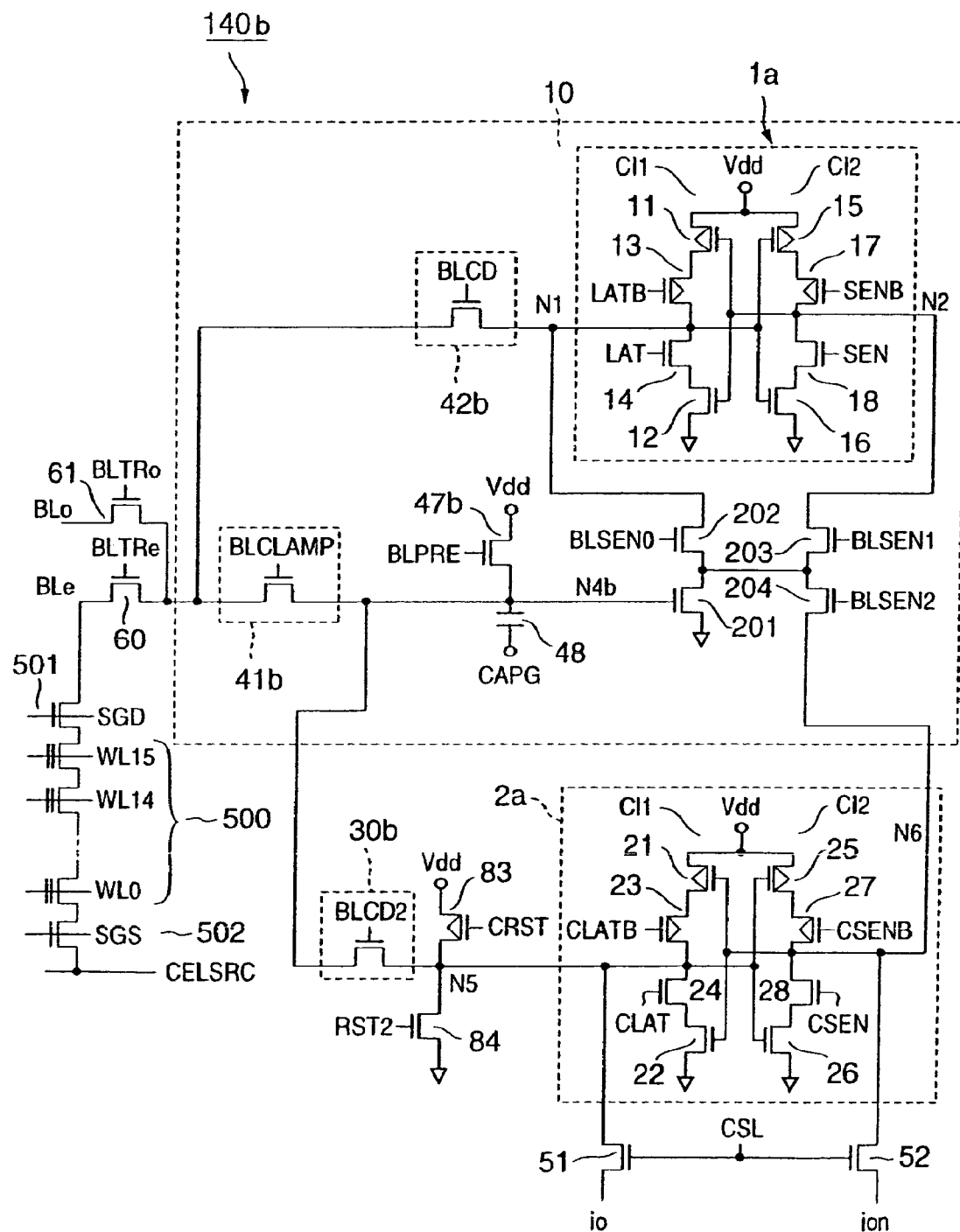
FIG. 46 shows a circuit diagram of a page buffer (a reprogramming and retrieval circuit) in the sixth preferred embodiment of a NAND-type flash EEPROM according to the present invention.

FIG. 46 is a circuit diagram of a page buffer 140*b* for multilevel operation and caching function.

Different from the page buffer 140 shown in FIG. 2, the page buffer 140*b* performs data transfer between the first and the second latch 1*a* and 2*a* with switching of NMOS transistors 203 and 204 series-connected between the nodes N2 and N6 of the latches 1*a* and 2*a*, respectively.

The page buffer 140*b* has a clamp NMOS transistor 41*b* provided between a selected bit line and a sense node N4*b*. The node N4*b* is connected to the gate of an NMOS transistor 201 for sensing, not directly connected to the node N1 (FIG. 2). The source of the NMOS transistor 201 is grounded and its drain is connected to the nodes N1 and N2 via the NMOS transistors 202 and 203, respectively.

The data retrieved at the sense node N4*b* via the clamp NMOS transistor 41*b* turns on or off the NMOS transistor 201. The switched state of the NMOS transistor 201 is transferred to the node N1 or N2 via the NMOS transistor 202 or 203, respectively, selectively activated by a signal BLSEN0 or BLSEN1, which allows the sensed data to be stored in the first latch 1*a*.

Data transfer between the latches 1*a* and 2*a* are performed between the nodes N2 and N6 via the NMOS transistors 203 and 204 activated by signals BLSEN1 and BLSEN1, respectively.

The page buffer 140*b* is also provided with an NMOS transistor 42*b* for transferring a potential at the node N1 to a selected word line.

The node N5 of the second latch 2*a* is connected to the sense node N4*b* via an NMOS transistor 30*b* that will be turned on for pre-charging a selected bit line in accordance with data stored in the latch 2*a* in a multilevel mode.

Also connected to the sense node N4*b* is a capacitor 48 having a control terminal CAPG, for controlling the potential at the node N4*b* with capacitance-coupling.

Disclosed next is a multilevel operation using the page buffer 140*b* under the relationship between data and threshold level in memory cell for multilevel operation, as shown in FIG. 43B.

The programming of the first (upper) and the second (lower) bits are performed in accordance with the flow chart shown in FIGS. 9A and 9B.

Figures 47A, 47B, 48:
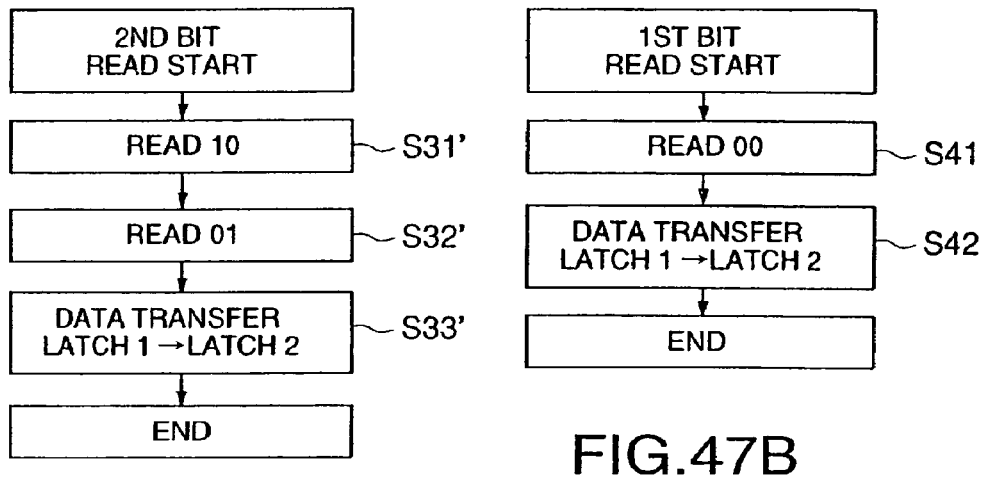
FIG. 47A is a flow chart of the second-bit data retrieval in multilevel operation in the sixth embodiment.
FIG. 47B is a flow chart of the first-bit data retrieval in multilevel operation in the sixth embodiment.
FIG. 48 shows potential change in "0"-programming to the second (lower) bit in which "11"-stored cells are programmed with "10" (the same for 1-bit cell) in multilevel operation in the sixth embodiment.

On the other hand, a retrieval operation for the second bit shown in FIG. 47A is different from FIG. 19A. In detail, the difference is that "Read 10" for applying Vr10 to a selected bit line is executed (step S31') before "Read 01" for applying Vr01 to a selected bit line is executed (step S32').

The programming operation and the retrieval operation for programming verification are disclosed with reference to FIGS. 9A and 9B.

For the lower (second) bit, data to be programmed is loaded into the second latch 2*a* from the data input/output terminal I/O through the data signal lines "io" and "ion" (step S11). The data is then transferred from the second latch 2*a* to the first latch 1*a* (step S12), like the foregoing embodiment.

The control signals SEN and LAT (FIG. 46) of the first latch 1*a* are set at the level "HIGH" while the signals SENB and LATB at the level "LOW", to deactivate the clocked converters CI1 and CI2.

The control signals BLSEN1 and BLSEN2 are set at the level "HIGH" to turn on the NMOS transistors 203 and 204. The potential at the node N6 of the second latch 2*a* is transferred to the node N2 of the first latch 1*a* via the NMOS transistors 203 and 204. The clocked converters CI1 and CI2 are activated in this order to store the transferred data.

Likewise, data transfer from the first latch 1*a* to the second latch 2*a* is performed after the latch 2*a* is deactivated.

After the data transfer, the programming pulse applying operation is performed (step S13 in FIG. 9A) in which the NMOS transistor 42*b* (FIG. 46) is turned on to transfer the data at the node N1 of the first latch 1*a* to a selected bit line. The control signal BLCD to be applied to the gate of the NMOS transistor 42*b* is preferably set at a potential boosted from Vdd for transferring the level "LOW" (0V) or "HIGH" (Vdd) at the node N1 with no decrease in level.

After programming, a voltage Vv10 (FIG. 43B) is supplied to the selected bit line to perform Verify 10 (step S14) retrieval for programming verification. FIG. 48 shows potential change when the data "LOW" has been clamped at the node N1 of the first latch 1*a*.

The NMOS transistor 47*b* for pre-charging is turned on and then the clamp NMOS transistor 41*b* is turned on to pre-charge the selected bit line for retrieval for programming verification.

Bit line-data sensing is performed with the NMOS transistor 41*b* like the foregoing embodiment.

The resetting operation shown in FIG. 48 is required for usual retrieval operation, to reset the latch before loading a sensed data to the latch whereas it is not required for retrieval for programming verification.

An amplified and retrieved data potential appeared at the node N4*b* is stored in the first latch 1*a* as a two-level data via the NMOS transistor 203 that is turned on by the control signal BLSEN1 set at the level "HIGH". In detail, a potential at the node N4*b* close to Vdd turns on the sensing NMOS transistor 201, thus the potential at the node N2 is lowered to the level "LOW" via the NMOS transistors 203 and 201.

On the other hand, a low potential at the node N4*b* does not turn on the NMOS transistor 201 (which may exhibit high turn-on resistance), thus the potential at the node N2 being clamped in the first latch 1*a*.

The foregoing operations are performed while the first latch 1*a* is active. To ensure such operations, transistor sizes are determined so that turn-on resistance for the NMOS transistors 201 to 204 are considerably lower than that for the PMOS transistors 11, 13, 15 and 17 of the first latch 1*a*.

A retrieval operation is performed to a selected cell, and then programming pulses are applied to raise the threshold level on the memory cell, thus a bit line being not discharged and clamped at the level "HIGH". This allows loading the level "LOW" at the node N2 of the first latch 1*a*, thus the programming being completed.

On the other hand, the bit line is discharged when the threshold level of the memory cell is low even after the programming pulse application, thus the node N2 of the first latch 1a is clamped at the level "HIGH" in retrieval for programming verification. The programming pulse application and the retrieval for programming verification are repeated until the node N2 is set at the level "LOW".

Contrary to FIG. 48, FIG. 49 shows potential change when the data "HIGH" ("1"-programming, or non-programming) has been clamped at the node N1 of the first latch 1a, which neglects the result of retrieval for programming verification because programming pulses do not change the threshold level of a selected memory cell. The Node N2 of the latch 1a has initially been set at the level "LOW" for loading the sensed data on a selected bit line to the latch 1a.

Like the foregoing embodiment, the programming pulse application and the retrieval for programming verification are repeated until the nodes N2 and N1 are set at the levels "LOW" and "HIGH", respectively, for all page buffers in simultaneous 1-page programming. It is determined whether programming to all cells are completed (step S15 in FIG. 9A), if so, the programming operation ends.

Disclosed next is the upper (first) bit programming with reference to FIG. 9B.

In each page buffer, the upper bit data is loaded into the second latch 2a (FIG. 46) through the data signal lines "io" and "ion" (step S21), and then transferred to the first latch 1a (step S22), followed by the internal data loading (step S23). As already disclosed, the internal data loading retrieves the lower-bit data stored in selected memory cells to the latch 2a.

Like the foregoing embodiments, the first- and the second-bit data to be programmed into one memory cell correspond to the first and the second row addresses, respectively, for multilevel operation, the two addresses selecting the same word line and memory cell.

FIG. 50 shows potential change in internal data loading.

The second latch 2a is reset within a period from bit line pre-charging to bit line potential sensing. In detail, the resetting NMOS transistor 84 (FIG. 46) is turned on to reset the nodes N5 and N6 at the levels "LOW" and "HIGH", respectively. A retrieval voltage Vr10 (FIG. 43B) is then applied to a selected word line to retrieve a bit line potential to the node N4b. The control signal BLSEN2 is set at the level "HIGH" to turn on the NMOS transistor 204, thus a sensed result at the node N4b being stored in the second latch 2a. Data "11" in a selected cell results in the level "LOW" at the node N5 whereas "10" results in the level "HIGH".

After the programming pulse applying operation (step S24 in FIG. 9B), retrieval "Verify00" for programming verification to "00" (step S25) is executed, followed by retrieval "Verify01" for programming verification to "01" (step S26).

FIG. 51 shows potential change in "0"-programming to the first bit of "11"-programmed memory cell.

The node N1 of the first latch 1a has been set at the level "LOW" for starting "0"-programming. A selected bit line is pre-charged from the node N5 of the second latch 2a in the retrieval "Verify00" via the NMOS transistors 30b and 41b. A boosted potential enough for transferring a "HIGH"-level Vdd is applied to the gate of the NMOS transistors 30b to turn on. A potential Vpre for determining a bit line pre-charge potential for retrieval is applied to the gate of the NMOS transistor 41b to turn on.

The level "LOW" has been clamped at the node N5 when the data "11" is retrieved from a selected cell in the foregoing internal data loading, thus the selected bit line is pre-charged to 0V. The retrieval "Verify00" thus results in the level "LOW" appearing at the node N4b as a result of bit line potential sensing, with no change in the data stored in the first latch 1a even though the NMOS transistor is turned on.

The succeeding retrieval "Verify01" is performed with pre-charging the selected bit line via the NMOS transistor 47b with the potential Vdd at the node N4b, like pre-charging for a usual retrieval operation. The retrieval "Verify01" results in a bit line potential appearing at the node N4b, which corresponds to the threshold level of a selected cell after programming pulses have been applied. A result of the retrieval is loaded into the first latch 1a.

The "01"-programming to the "11"-programmed cell is completed when the node N1 of the first latch 1a is set at the level "HIGH" in the retrieval "Verify01".

FIG. 52 shows potential change in "0"-programming to the first bit of "10"-programmed memory cell.

The node N1 of the first latch 1a has been set at the level "LOW" for starting "0"-programming. A selected bit line is pre-charged from the node N5 of the second latch 2a in the retrieval "Verify00" via the NMOS transistors 30b and 41b. Like the foregoing disclosure, the potential Vpre is applied to the gate of the transistor 41b.

Different from the programming to "11"-programmed cell, the level "HIGH" has been clamped at the node N5 in programming to "01"-programmed cell, for bit line pre-charging like the usual retrieval operation. The bit-line potential is then clamped at the node N4b in accordance with the threshold level of a selected cell after the programming pulse applying operation, the clamped data being loaded into the first latch 1a via the NMOS transistor 203.

The "00"-programming to the "10"-programmed cell is completed when the node N1 of the first latch 1a is set at the level "HIGH" in the retrieval "Verify00".

The succeeding retrieval "verify01" is performed with a high retrieval voltage Vv01 (FIG. 43B) on the selected word line. The "00"-programmed cell is turned on in the retrieval "verify01" to set the level "LOW" on the bit line, thus the sensed data "LOW" appearing at the node N4b with no change even though the data is stored in the first latch 1a.

Accordingly, in the retrieval "Verify01", the level "HIGH" is clamped at the node N1 for the memory cells to which programming has been completed whereas the level "LOW" is clamped at the node N1 for the memory cells under programming.

FIGS. 53 and 54 show potential change in "1"-programming to the first bit of "11"- and "10"-programmed cells, respectively.

Like the "0"-programming, the retrieval "Verify00" and "verify01" are sequentially executed while the levels "HIGH" and "LOW" have been clamped at the nodes N1 and N2, respectively, of the first latch 1a with no change even though the NMOS transistor 203 (FIG. 46) is turned on.

The programming and retrieval for programming verification are repeated until the node N1 for all page buffers is set at the level "HIGH" (step S27 in FIG. 9B), and if so, the programming ends.

Disclosed next is a usual multilevel-data retrieval operation using the page buffer 140b shown in FIG. 46 with reference to FIG. 55 showing potential change in first-bit retrieval and FIG. 47B showing a flow chart for first-bit retrieval in selection of the first row address for multilevel operation.

A retrieval voltage Vr00 (FIG. 43B) is applied to a selected word line for a retrieval operation (step S41). During the period from bit line pre-charging to bit line-potential sensing, the control signal BLSEN0 is set at the level "HIGH" to turn on the NMOS transistor 202, with the NMOS transistor 201 being turned on via the pre-charging transistor 47b, thus the first latch 1a being reset in which the nodes N1 and N2 are set at the levels "LOW" and "HIGH", respectively.

After the bit line potential is sensed, the node N4b is set at the level "HIGH" or "LOW" which is then loaded into the first latch 1a via the NMOS transistor 203 that is turned on by the control signal BLSEN1 at the level "HIGH".

The node N4b is set at the level "LOW" as a result of bit line-potential sensing when data "11" or "10" has been stored in a selected cell. This results in no discharging from the node N2 via the NMOS transistors 201 and 203, thus the level "LOW" being clamped at the node N1 of the first latch 1a, which is retrieved as data "1".

On the other hand, the node N4b is set at the level "HIGH" as a result of bit line-potential sensing when data "00" or "01" has been stored in a selected cell. This results in discharging from the node N2 via the NMOS transistors 201 and 203, thus the level "HIGH" being clamped at the node N1, which is retrieved as data "0".

Data retrieval via the data input/output terminals I/O is performed such that the data on the first latch 1a is transferred to the second latch 2a (step S42) for column address selection via the column-gate transistors 51 and 52.

FIGS. 56 to 58 show potential change in the second bit retrieval in accordance with the flow chart in FIG. 47A.

FIG. 56 shows potential change in the first retrieval "Read10" of the two retrieval operations "Read10" (step S31') and "Read01" (step S32') in FIG. 47A for the second bit retrieval operation in selection of the second row address for multilevel operation.

The first retrieval "Read10" applies a retrieval voltage Vr10 shown in FIG. 43B to a selected word line. The retrieval voltage is the only difference between the retrieval "Read10" and the retrieval "Read00" shown in FIG. 47B.

The retrieval operation results in the level "LOW" at the first latch 1a from "11"-programmed cells whereas the level "HIGH" from "10"-, "00"- and "10"-programmed cells.

In the succeeding retrieval "Read01", a retrieval voltage Vr01 shown in FIG. 43B is applied to the selected word line, which causes potential change shown in FIGS. 57 and 58. FIG. 57 shows potential change when the node N1 of the first latch 1a has been set at the level "LOW" ("11") in the first retrieval operation in "Read01". On the other hand, FIG. 58 shows potential change when the node N1 has been set at the level "HIGH" ("10", "00" or "10") in the first retrieval operation in "Read01".

The second retrieval "Read01" requires no resetting operation before bit line-potential sensing, thus the result of the first retrieval "Read10" has been stored in the first latch 1a. The result of bit line-sensing clamped at the node N4b is loaded into the latch 1a via the NMOS transistor 202 that is turned on by the "HIGH"-level control signal BSSEN0.

When "11"-programmed cells are selected, the level "LOW" has been clamped at the node N1 of the first latch 1a (FIG. 57) without respect to the potential at the node N4b.

When "10"- or "00"-programmed cells are selected, a selected word line potential is set at Vr01 (FIG. 43B) to turn on the selected cell, thus the sensed data "LOW" appearing at the node N4b. This results in a high-impedance state for the NMOS transistor 201 even though it is turned on (or off), thus the potential at the node N1 being unchanged even the NMOS transistor 202 is turned on to hold the data retrieved in the former retrieval "Read00" (FIG. 58).

When "01"-programmed cells are selected, they will not be turned on at a selected word line voltage Vr01, with no discharging from the bit line, the level "HIGH" is set at the node N4b after bit line-potential sensing. The NMOS transistor 201 is then turned on to lower the node N1 to the level "LOW" when the NMOS transistor 202 is turned on (FIG. 58).

As disclosed above, the retrieved data is stored in the first latch 1a such that the node N1 is set at the level "LOW" when the second bit is "1" whereas "HIGH" when the second bit is "0".

The data in the first latch 1a is then transferred to the second latch 2a (step S33), and output via the data input/output terminals I/O.

The multilevel retrieval operation is achieved as disclosed.

The two-level retrieval operation is achieved with the second latch 2a as a cache memory. The re-programming/retrieval circuit 10 having the first latch 1a is a main buffer. The two-level operation performs data transfer only through the second latch 2a. The retrieval operation applies a retrieval voltage within the two-level data threshold level distribution to a selected word line to perform the operation same as the retrieval "Read00" shown in FIGS. 47B and 55. The programming operation is performed like shown in FIG. 9A.

As disclosed in the foregoing embodiment, the retrieval operation moves onto the succeeding page retrieval using the main page buffer 10 after the anterior retrieved data has been transferred from the first latch 1a to the second latch 2a. The programming operation loads the data to be programmed on the succeeding page address to the second latch 2a after the anterior data to be programmed has been transferred from the second latch 2a to the first latch 1a. These retrieval/programming operations achieve a caching function.

The transistor size of the NMOS transistors 201 to 204 used for inversion of data stored in an active first latch 1a is one of the important factors in FIG. 46. In FIG. 46, different from FIG. 2, the result of bit line-data sensing "HIGH" or "LOW" is supplied to the gate of the NMOS transistor 201. The level "HIGH" at the sense node N4b while data sensing corresponds to Vdd whereas the level "LOW" is almost equal to bit line potential after being discharged when a selected cell is turned on. The NMOS transistor 201 must meet the requirements in that it is turned on in a considerably low impedance state when the sense node N4b is set at the level "HIGH" whereas it is turned off or at least in a considerably high impedance state when the node N4b is set at the level "LOW". Another important requirement is a small turn-on resistance for the NMOS transistors 201 to 203 for ensuring inversion of data stored in the first latch 1a.

A sufficiently wide margin of sensing is, however, hard to achieve only by design of transistor size discussed above. It is achieved by potential control at the node N4b with capacitance-coupling using the capacitor 48 shown in FIG. 46 in addition to the design of transistor size. In detail, after bit line pre-charging via the NMOS transistor 47b, a positive potential, for example, is applied to the terminal CAPG to boost the sense node N4b so that the channel resistance ratio of the NMOS transistor 201 between the "HIGH" and "LOW" output, thus attaining a wide margin of sensing.

As already disclosed, in the page buffer 140 shown in FIG. 2, the main buffer 10 having the first latch 1a is made up of a sense amplifier. NAND-type flash memories are easy to assemble for mass storage whereas they produce a small current from their cells, thus being inferior to NOR type on high-speed retrieval. NAND-type flash memories thus usually simultaneously retrieve 1-page memory cell data, for example, 512 bytes, selected through one word line, and serially transfer out the retrieved data. These operations require sense amplifiers for 512 bytes to 512-byte memory cells.

The sense amplifier performs bit line-potential clamping and pre-sensing operation using the clamp transistor 41 shown in FIG. 2, to achieve high-speed retrieval as high as possible. The clamping operation, however, results in a narrow margin of "0" or "1"-data sensing. The lower the power supply voltage, or the lower the threshold level of the first latch 1a, the narrower the margin of sensing.

Figure 59:
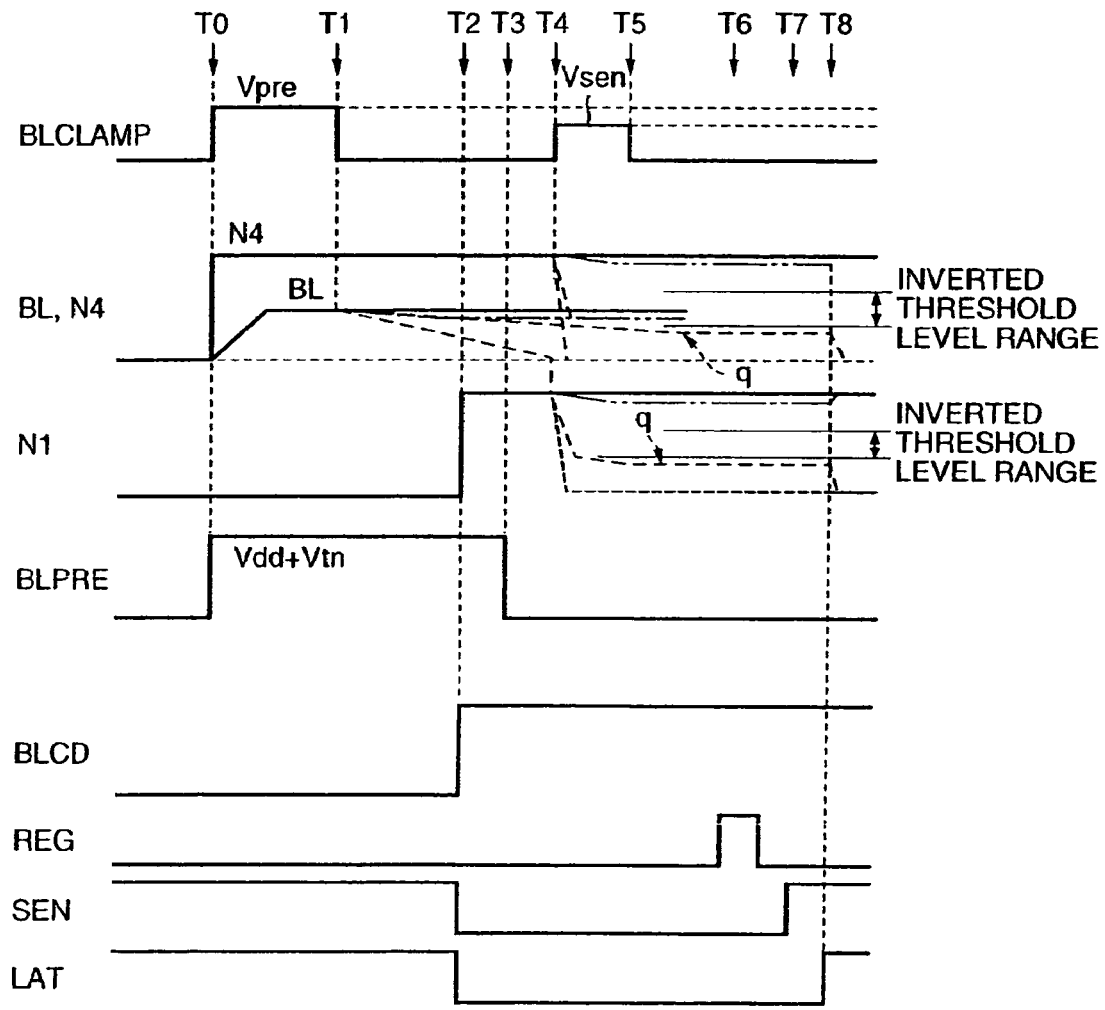
FIG. 59 illustrates signal waveforms in data retrieval.

Such a narrow margin of sensing is discussed in detail with respect to FIG. 59 illustrating several sensing waveforms.

In retrieval, a retrieval voltage is applied to a selected word line connected to a NAND-type cell block whereas a retrieval "pass"-voltage is applied to the other non-selected word lines, for handling series-connected cells as "pass" transistors. Here, "pass" means completion of a data programming as already explained.

Bit line discharging through the source-side gate-selection line SGS (FIG. 3) of a NAND-type cell is performed as follows:

The drain-side gate selection line SGD is always on whereas the source-side gate-selection line SGS is always off to perform bit line pre-charging (from moments T0 to T1 in FIG. 59). In other words, the clamp transistor 41 and the pre-charging transistor 47 (FIG. 2) are turned on to perform pre-charging.

As shown in FIG. 59, a potential BLPRE (Vdd+Vtn) boosted from the power supply voltage Vdd is applied to the gate of the pre-charging transistor 47 to apply Vdd to the sense node N4. Moreover, the potential BLCLAMP at the gate of the clamp transistor 41 is set at Vpre to re-charge the bit line to (Vpre−Vtn). The potential Vtn is a threshold level of NMOS transistors.

The potential BLCLAMP is then returned to 0V to turn on the source-side gate-selection line SGS, thus the bit line is discharged or holding the pre-charged potential instead, in accordance with the data of a selected cell.

At a moment T2 (FIG. 59), the potentials SEN and LAT are set at the level "LOW" to deactivate the first latch 1a, and then the NMOS transistor 42 is turned on to connect the sense node N4 and the node N1 of the first latch 1a, thus pre-charging the node N1 at Vdd.

At a moment T3, the pre-charging transistor 47 is turned on to bring the node N1 in a floating state. The potential BLCLAMP at the gate of the clamp transistor 47 is set at a retrieval potential Vsen during the period from moments T4 and T5 while the node N1 is being set in the floating state.

When data programmed in a selected cell is "1", the bit line potential has been lowered below (Vsen−Vtn), thus the nodes N1 and N4 being lowered to the bit line potential while the clamp transistor 41 being turned on.

On the other hand, when data programmed in a selected cell is "0", the bit line holds the pre-charged potential, the nodes N1 and N4 holding the pre-charge potential Vdd while the clamp transistor 41 is being turned off.

As a result, for a "1"-programmed cell, the bit line voltage (Vpre−Vsen) is amplified to Vdd−(Vpre−Vsen) at the nodes N1 and N4 and retrieved. For example, a 0.7V-bit line pre-charged potential and about a 0.25V-bit line-retrieval voltage produce the potential at the nodes N1 and N4 amplified to about 2V.

After the clamping operation, the potential at the node N1 is set at the level "HIGH" or "LOW" and stored in the first latch 1a. A usual retrieval operation activates the clocked inverter CI2 (FIG. 2) of the first latch 1a at a moment T7, and then activates the clocked inverter CI1 at a moment T8, for data retrieval.

Accordingly, after bit line amplification by clamping operation, the "LOW"-level potential (waveform "q" in FIG. 59) appearing at the nodes N1 and N4 is required to be lower than the threshold level of the first latch 1a. In other words, the threshold level of the first latch 1a is required to be higher than the potential, the level "LOW", appearing at the nodes N1 and N4. Therefore, the levels "HIGH" and "LOW" on the bit line in retrieval meet a requirement that a threshold level of the clocked inverters dropped to a lowest level due to decrease in power supply voltage will not cause a retrieval error.

On the other hand, the lower the bit line pre-charging potential in retrieval, the smaller the cell current because a cell current depends on drain voltage, thus the longer the retrieval time. Increase in turn-on current of a "1"-programmed cell for high-speed retrieval will be restricted by a threshold level of the first latch 1a, thus requiring sense amplifier circuit configuration in which the threshold level of sense amplifier will not restrict bit line pre-charging potential or voltage.

Disclosed next are modifications to a sense amplifier applicable to the main page buffer 10 (FIG. 2) in consideration of the requirements discussed above.

The modifications to the sense amplifier disclosed below are applicable to the foregoing embodiments for achieving a multilevel operation and caching function, and also to usual two-level NAND-type flash memories.

Moreover, the modifications are applicable to any non-volatile memories that perform data storing in accordance with existence of a bit line current or its level, in addition to electrically erasable non-volatile memories.

The modifications will be disclosed as being used in two-level data retrieval in NAND-type flash memories.

(First Modification)

Figure 60:
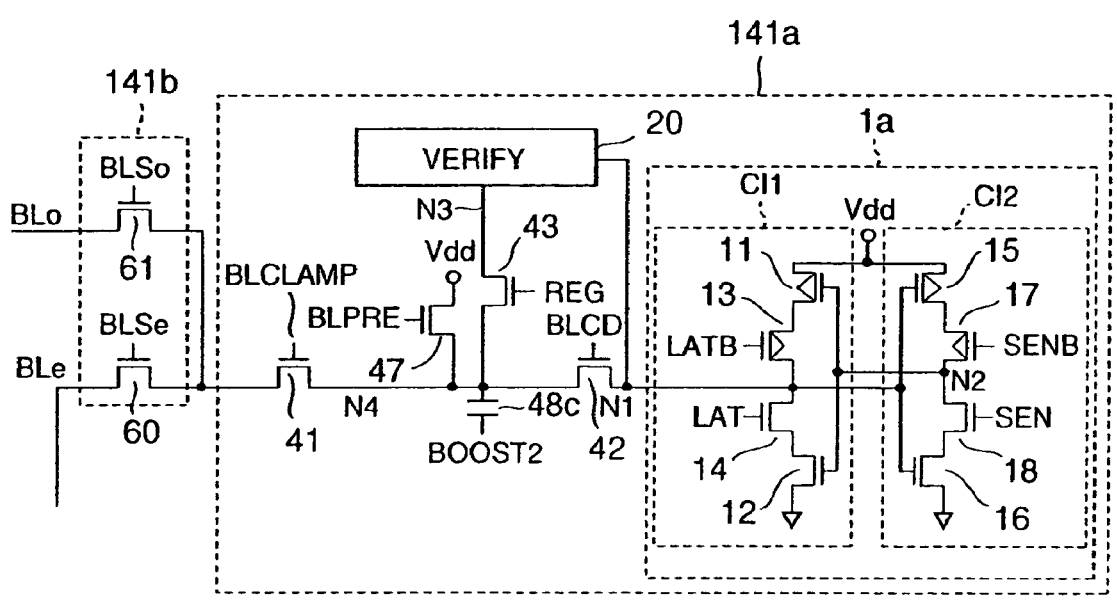
FIG. 60 shows a circuit diagram of the first modification to a sense amplifier according to the present invention.

FIG. 60 shows a circuit diagram of the first modification to sense amplifier, which is applicable to the page buffer 10 shown in FIG. 2.

A bit line selection switch 141b selects either the bit line BLo or BLe to be connected to a sense amplifier 141a. The first latch 1a having the clocked inverters CI1 and CI2 stores retrieved 1-page memory cell data until serial transfer for data output. In programming, the latch 1a stores data to be programmed for each page until the programming is completed.

Figure 61:
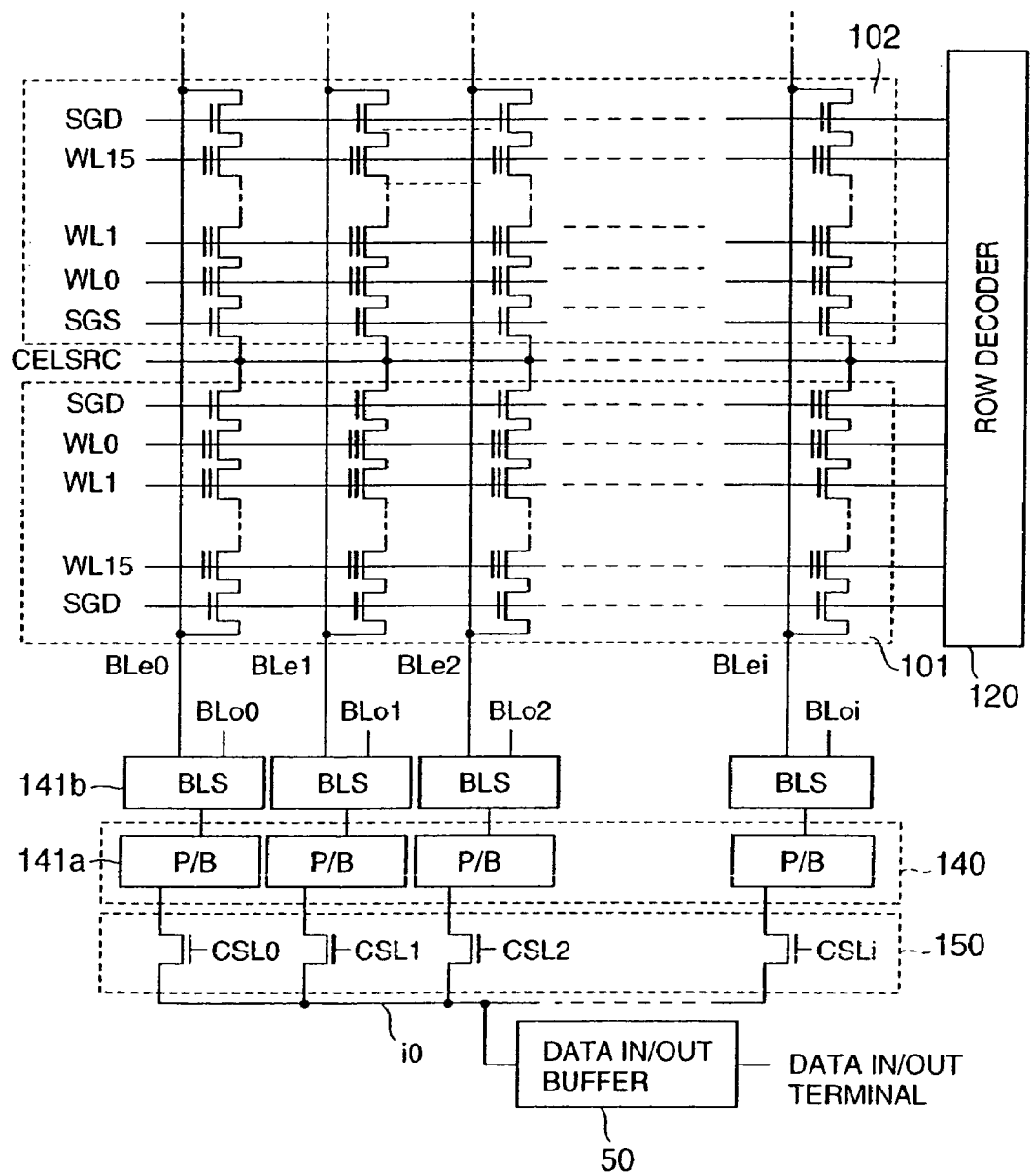
FIG. 61 is a block diagram of a flash EEPROM using the sense amplifier shown in FIG. 60.

FIG. 61 illustrates the connection of the sense amplifier 141a and a cell array having two NAND cell blocks 101 and 102.

Sense amplifiers (P/B) 141a each for one page are connected to the bit line BLo or BLe via corresponding selection switches (BLS) 141b. The sense amplifiers 141a are connected to the data input/output buffer 50a via the column gate 150. The data stored in the sense amplifiers 141a are converted into serial data for retrieval by the column gate 150 that is switched by a column address.

Like shown in FIG. 2, the sense node N4 is connected to a selected bit line via the clamp NMOS transistor 41, the pre-charging NMOS transistor 47 is connected to the node N4, and the transfer NMOS transistor 42 is provided between the node N4 and the node N1 (the input terminal of the clocked inverter CI2) of the first latch 1a. A verify circuit 20 corresponds to the transistors 44 to 46 and the capacitor 49 in FIG. 2.

Connected to the sense node N4 is a capacitor 48c having a terminal BOOST2 used for potential control of the node n4 with capacitance-coupling in data sensing.

Figure 62:
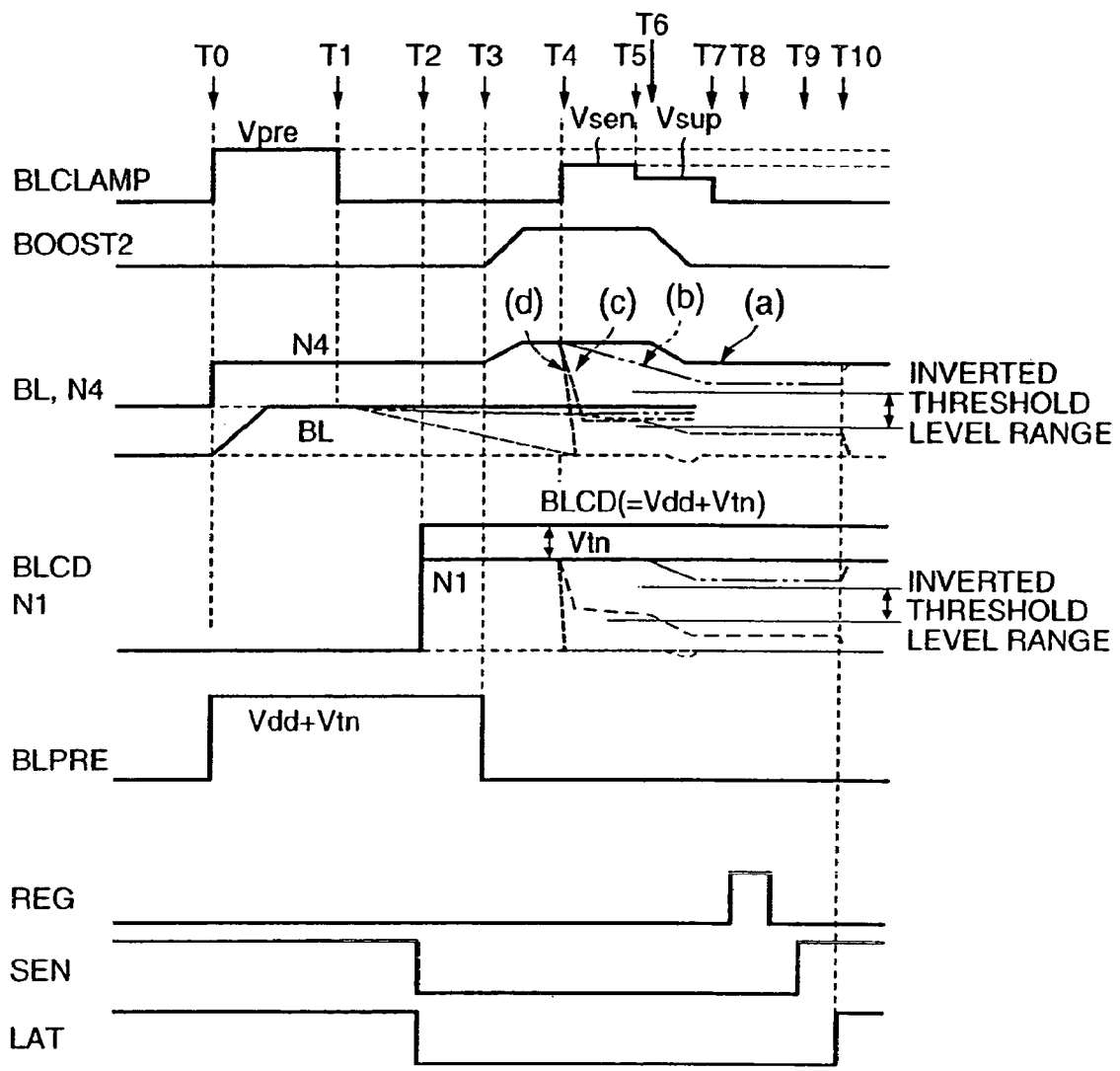
FIG. 62 illustrates signal waveforms in the sense amplifier shown in FIG. 60.

FIG. 62 illustrates waveforms in data sensing by the sense amplifier 141a.

At a moment T0, the potential BLPRE at the gate of the pre-charging transistor 47 is set at (Vdd+Vtn) and simultaneously the potential BLCLAMP at the gate of the clamp transistor 41 is set at Vpre, to pre-charge a selected bit line from the sense amplifier 141a while the transistor 42 is being turned off, the first latch 1a being active. This pre-charging operation sets the sense node N4 in the sense amplifier 141a at Vdd and the selected bit line at (Vpre−Vtn).

At a moment T2, the clamp transistor 41 is turned off to turn on a selection gate of a NAND cell to discharge the bit line in accordance with data of the selected cell. Also at the moment T2, the potential BLCD at the gate of the NMOS transistor 42 is set at (Vdd+Vtn) to turn on the transistor 42 after bit line discharging has been started. Moreover, the potentials SEN and LAT at the gates of the NMOS transistors 18 and 14, respectively, are set at the level "LOW" to deactivate the first latch 1a, thus the node N1 being charged to Vdd.

At a moment T3, the potential BLPRE at the gate of the NMOS transistor 47 is set at 0V to turn off the pre-charging transistor 47 while the first potential at the terminal BOOST of the capacitor 48c is being raised to the second potential, for example, from 0V to 1V.

Since the node N4 has been in a floating state, the potential at the node N4 is raised due to capacitance-coupling. This potential increase is determined in accordance with a capacitance ratio between the capacitor 48c and the node N4.

On the other hand, the potential at the node N1 is raised at most by Vdd because the potential BLCD at the gate of the transistor 42 has been set at (Vdd+Vtn), thus the potential increase due to capacitance-coupling is not allowed.

A capacitor that corresponds to the capacitor 48c is generally used for suppressing leak current or parasitic capacitance when the node N4 is held in a floating state but not for voltage boosting like this modification.

At a moment T4, the potential BLCLAMP at the gate of the clamp transistor 41 is set at Vsen to connect a selected bit line and the sense node N4.

Potential change (a) to (d) at the sense node N4 is illustrated in FIG. 62, which corresponds to bit line potential change in accordance with data of a selected cell.

The change (a) indicates potential change at the node N4 to programmed data "0" for which the selected cell has a considerably high threshold level, in which the bit line potential is almost clamped at a pre-charging potential, thus the clamp transistor 41 is not turned on to clamp a boosted potential at the node N4.

The change (b) indicates potential change at the node N4 to programmed data "0" for which the selected cell has a threshold level close to a selected word line potential, in which a sub-threshold current flows, the bit line potential and also the potential at the node N4 is slightly lowered.

The change (c) indicates potential change at the node N4 to programmed data "1" for which the selected cell has a high threshold level, in which bit line discharging is delayed, the potential at the node N4 is at an intermediate level like on a selected bit line.

Moreover, the change (d) indicates potential change at the node N4 to programmed data "1" for which the selected cell has a considerably low threshold level, in which the node N4 is connected to a selected bit line, the potential on which is discharged to almost 0V, thus the node N4 is discharged to almost 0V like the bit line.

The operation at the moment T4 is one of the features of this modification in which bit line potential is amplified with a high potential at the node N4.

At a moment T5, the potential BLCLAMP at the gate of the clamp transistor 41 is varied to Vsup that is slightly lower than Vsen but higher than the threshold level, to turn on the transistor 41 almost at 0V. This potential change does not allow the node N4 to be connected to the selected bit line unless the potential on the bit line is lower than when the potential Vsen is applied.

At a moment T6, the potential at the terminal BOOST2 is returned to 0V. The decrease in gate voltage to the clamp transistor 41 makes it hard for the node N4 to be connected to the selected bit line, thus the node n4 being easily brought into a floating state.

In the change (a) to (c), the potential at the node N4 is lowered in accordance with the potential drop at the terminal BOOST2. On the other hand, in the change (d) in which the potential at the node N4 is set at almost 0V after the moment T4, the node N4 would be lowered to a negative potential, if the node N4 is in the floating state, which is, however, protected from being lowered to a negative level because a current flows to the node N4 from the selected line via the clamp transistor 41. Such protection of potential decrease is achieved by the capacitor 48c whose capacitance is smaller than the bit line capacitance.

As disclosed above, in "0"-data retrieval in accordance with the change (a), the potential at the node N1 returns to Vdd that is the potential before boosting by the capacitor 41. On the other hand, in "1"-data retrieval in accordance with the change (c) for which bit line discharging is slow, the potential at the node N1 is dropped to a potential lower than the bit line potential.

Accordingly, the sense amplifier in this modification performs not only amplifying the potential at the node N1 higher than the bit line voltage but also to lower the potential which is equivalent to amplification to a lower potential, thus achieving a big difference between levels "HIGH" and "LOW" at the node N1.

At a moment T7, the potential BLCLAMPO at the gate of the clamp transistor 41 is set at 0V to completely disconnect the node N4 from the bit line.

At a moment T9, the clocked inverter CI2 is activated, and at a moment T10, the clocked inverter CI1 is activated, to load two-level data "HIGH" and "LOW" at the node N1 to the first latch 1a.

FIG. 62 indicates the range of threshold level (inverted threshold level) of the CMOS clocked inverters CI1 and CI2 of the first latch 1a in consideration of variation in power supply Vdd and process.

In this modification (FIG. 60), the potential at the node N4 is boosted via the capacitor 48c to sense a bit line data by a clamping operation, and then the potential at the node N4 is lowered in which the level "LOW" at the node N4 in retrieval of "1"-programmed cell is lowered below the lit line potential level.

The modification, thus, achieves correct retrieval with no error even the potential level "LOW" on the bit line is higher than the threshold level the clocked inverters CI1 and CI2 of the first latch 1a.

A higher voltage level to the capacitor 48c offers higher set values for "HIGH"-level pre-charging potential on the bit line and the potential for "LOW"-level retrieval, etc.

In FIG. 60, the potential BLCD to be applied at the gate of the NMOS transistor 42 connected between the nodes N1 and N4 is set at (Vdd+Vtn) to boost the potential only at the node N4 because the node N1 is connected to the drain of the PMOS transistor 13 of the first latch 1a.

This potential application is one requirement for the first modification because if the potentials at the nodes N1 and N4 were simultaneously boosted, it would bring the pn-junction of the PMOS transistor 13 into a forward-biased state so that the potential at the node N4 is not boosted.

Another requirement for this modification is that the voltage BLCD applied to the gate of the NMOS transistor 42 is higher than the threshold level of the clocked inverters CI1 and CI2 of the first latch 1a for transferring a voltage lower than Vdd, in other words, not necessarily be (Vdd+Vtn).]

A control signal REG to be applied at a moment T8 in FIG. 62 is used for retrieval operation, such as, retrieval for pro-gramming verification. In FIG. 60, the control signal REG is applied to the gate of the NMOS transistor 43 connected between the node N4 and the verify circuit 20.

In detail, the control signal REG is used in repeated pro-gramming pulse applying operation and retrieval operation for programming verification to keep the threshold range of data to be programmed in a given range for data programming per page in NAND-type flash memories.

For each bit on which programming has been completed, data is set for prohibiting programming at the succeeding programming pulse applying operation.

In detail, at "0"-data programming, a selected bit line is pre-charged at the level "LOW" at the node N1. The node N1 is set at the level "HIGH" in retrieval for programming veri-fication on a "0"-programmed bit when "0"-programming (electron injection to the floating gate) has been sufficient. The level "HIGH" at the node N1 prohibits the succeeding programming. Insufficient "0"-programming will result in the level "LOW" at the node N1, thus "0"-programming is performed again to a bit on which "0"-programming has been insufficiently performed.

On the other hand, at "1"-data programming (for prohibi-tion of programming), a selected bit line is pre-charged at the level "HIGH" at the node N1 and held at the level. The retrieval operation for programming verification results in the level "LOW" at the node N1. Bit line pre-charging at this level for the succeeding programming results in "0"-programming. This requires inversion of the data at the node N4 to the level "HIGH" (programming prohibition) in retrieval operation for programming verification.

These potential control at the nodes N1 and N4 are per-formed by the verify circuit 20. The circuit 20 sets the level "HIGH" at the nodes N1 and N4 when the level "HIGH" is applied as the control signal REG to the gate of the NMOS transistor 43 only when the potential at the node N1 is "HIGH" at the moment of programming pulse applying operation.

(Second Modification)

Figure 63:
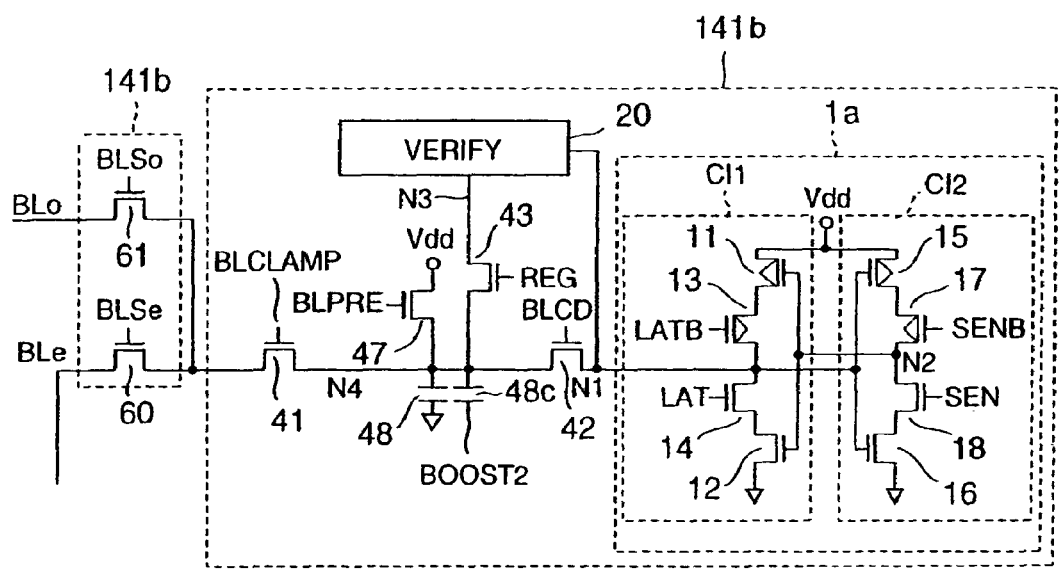
FIG. 63 shows a circuit diagram of the second modification to a sense amplifier according to the present invention.

FIG. 63 shows a circuit diagram of the second modification to the sense amplifier.

Elements in this modification that are the same as or analo-gous to elements in the first modification (FIG. 60) are refer-enced by the same reference numbers and will not be explained in detail.

The difference between the first and the second modifica-tions is that the latter is provided with a capacitor 48a, one of the terminals thereof being grounded, in addition to the capacitor 48c for applying a boosted potential to the sense node N4.

The second modification requires a drive voltage to be applied to the terminal BOOST2 of the capacitor 48c higher than that for the first modification to attain the same boosted voltage at the Node N4 because capacitance at the node N4 is larger than that for the capacitor 48a when the potential at the node N4 is boosted.

In other words, in FIG. 60, an intermediate drive voltage is required for attaining a desired boosted voltage at the node N4 whereas, in FIG. 63, the power supply voltage Vdd can be used as a boosting drive voltage which depends on selection of capacitance to the capacitors 48a and 48c. A voltage range from 0V to Vdd to the terminal BOOST2 of the capacitor 48c offers simple circuit configuration.

(Third Modification)

Figure 64:
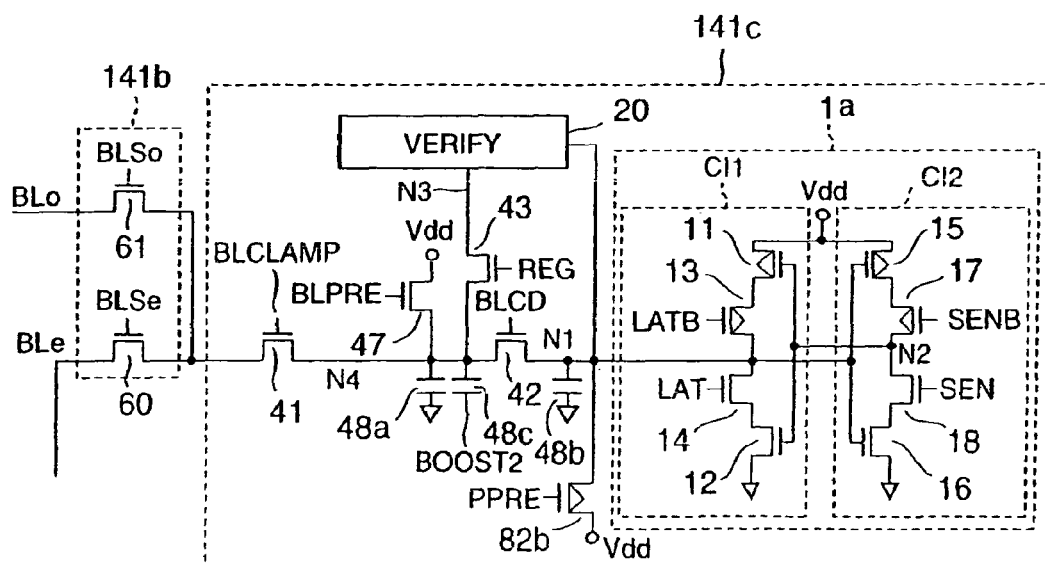
FIG. 64 shows a circuit diagram of the third modification to a sense amplifier according to the present invention.

FIG. 64 shows a circuit diagram of the third modification to sense amplifier.

Elements in this modification that are the same as or analo-gous to elements in the foregoing modifications are refer-enced by the same reference numbers and will not be explained in detail.

The difference between the second and the third modifica-tions is that the latter is provided with a PMOS transistor 82b (as a pre-charging circuit) that is controlled by a control signal PPRE applied to its gate and a capacitor 48b connected to the Node N1, one of the terminals being grounded, for clamping a potential at the node N1.

In FIG. 60, the voltage (Vdd+Vtn) is applied to the gate of the NMOS transistor 42 in boosting the potential at the node N4 under the control at the terminal BOOST2 of the capacitor 48c, so as not to raise the potential at the node N1.

The voltage (Vdd+Vtn) must be precise, otherwise the pn-junction of the PMOS transistor 13 of the first latch 1a will be brought into a forward-biased state, which obstructs the potential at the node N4 to be boosted. This requires a con-trolled voltage BLCD applied to the gate of the NMOS tran-sistor 42 to attain the potential at the node N1 lower than Vdd but higher than the threshold level of the first latch 1a.

Contrary to the first modification, the third modification (FIG. 64) enables pre-charging of the node N1 with no rela-tion to the node N4 for simplified control of the NMOS transistor 42 as discussed above. The voltage BLCD applied to the gate of the transistor 42 may be a voltage for transfer-ring the potential at the node N4, which appears when the node N4 is connected to a selected bit line by the clamping operation, to the node N1, or higher than Vsen applied to the gate of the NMOS transistor 41. The power supply voltage Vdd is, for example, applied as the voltage BLCD to the gate of the transistor 42 at a given timing.

Figure 65:
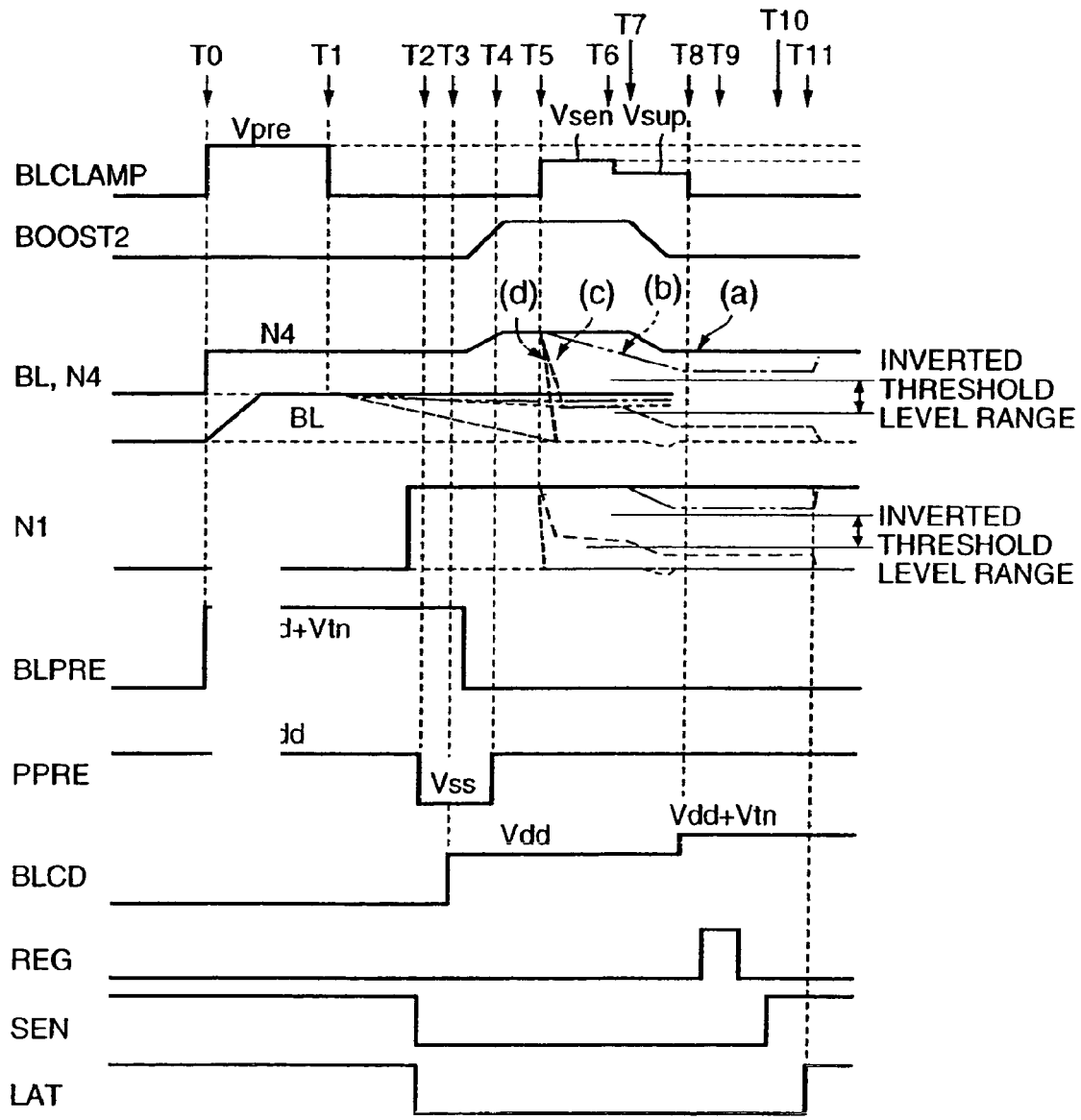
FIG. 65 illustrates signal waveforms in the sense amplifier shown in FIG. 64.

FIG. 65 illustrates signal waveforms in the third modifica-tion.

The bit line pre-charging operation for the period from a moment T0 to T1 is the same for the first modification in FIG. 60. At a moment T2, the control signal PPRE at the gate of the PMOS transistor 82b (FIG. 64) is set at "LOW" (Vss) to pre-charge the node N1 to Vdd while the signal BLCD at the gate of the NMOS transistor 42 is the level "LOW", thus the node N1 being pre-charged with no relation to the node N4. At a moment T3, the signal BLCD is set at a level, Vdd, etc., higher than Vsen applied to the gate of the NMOS transistor 41. The NMOS transistor 42 is turned off when the signal BLCD and the potentials at the nodes N1 and N4 are all Vdd while the potential at the node N4 is being boosted via the terminal BOOST2 of the capacitor 48c.

In FIG. 64, like shown in FIG. 63, the two capacitors 48a and 48c are used for boosting the potential at the node N4, however, the capacitor 48c only is essential like shown in FIG. 60.

At a moment T4 in FIG. 65, the pre-charging control signal PPRE is set at the level "HIGH" to stop pre-charging to the node N1, thus the node N1 is in a floating state. This operation offers a sharp cut-off characteristic to the NMOS transistor 42 to stably raise the potential at the node N4.

At a moment T8, the signal BLCD applied to the gate of the NMOS transistor 42 is raised to (Vdd+Vtn) before activating the first latch 1a, for re-charging the potentials at the nodes N1 and N4 to the level "HIGH" after they are discharged, in retrieval for verification of "0"-programming.

(Fourth Modification)

Figure 66:
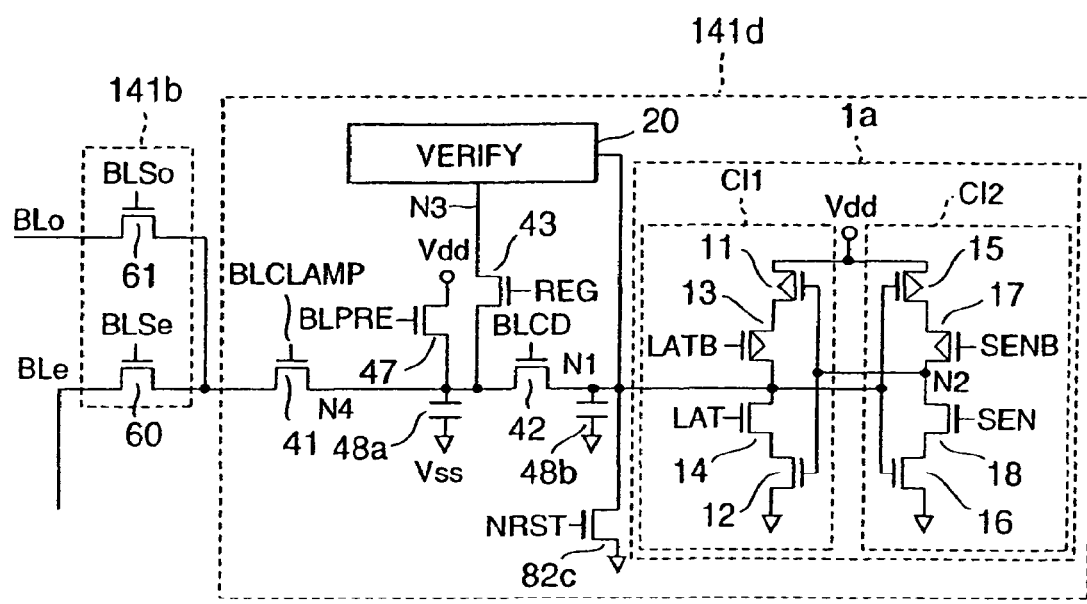
FIG. 66 shows a circuit diagram of the fourth modification to a sense amplifier according to the present invention.

FIG. 66 shows a circuit diagram of the fourth modification to sense amplifier.

Elements in this modification that are the same as or analogous to elements in the foregoing modifications are referenced by the same reference numbers and will not be explained in detail.

The fourth modification requires no potential boosting at the node N4. The capacitors 48a and 48b are connected to the nodes N4 and N1, respectively. One of the terminals of each capacitor is grounded. Also connected to the node N1 is a resetting NMOS transistor 82c.

Figure 67:
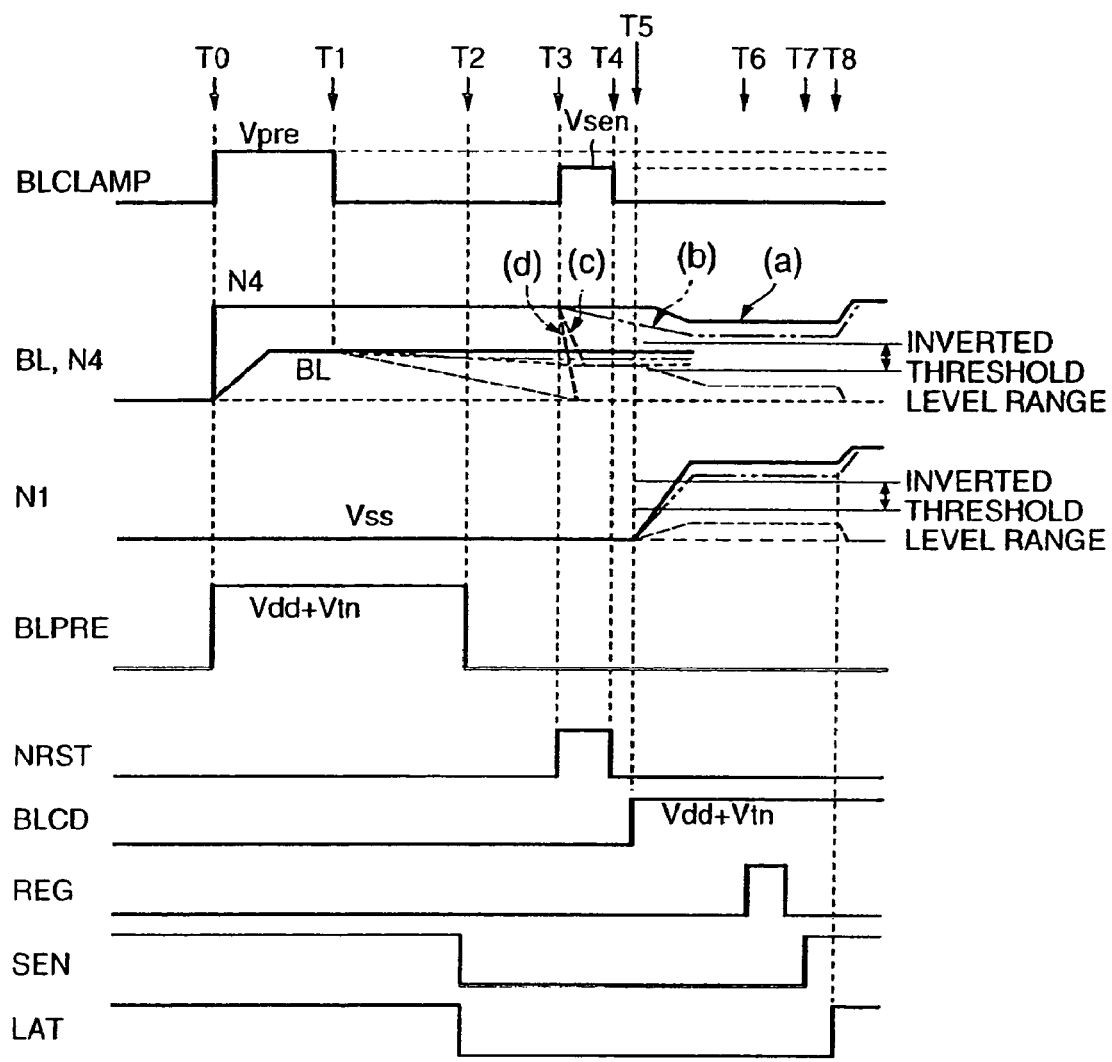
FIG. 67 illustrates signal waveforms in the sense amplifier shown in FIG. 66.

FIG. 67 illustrates signal waveforms in the fourth modification.

Bit line-data sensing is performed by the bit line pre-charging and clamping operation in this modification with no boosting of the potential at the node N4 while the signal BLCD is 0V, thus the NMOS transistor 42 is turned off. The node N4 and a selected bit line is connected by the clamping operation.

After a bit line potential appears at the node N4, the voltage (Vdd+Vtn) is applied as the signal BLCD to the gate of the NMOS transistor 42 at a moment T5. Before the moment T5, a resetting signal NRST has been set at the level "HIGH" to reset the node N1 to 0V.

Under the control disclosed above, the NMOS transistor 42 is turned on to distribute charges stored in the capacitor 48a to the capacitor 48b. This charge distribution lowers the potential at the node N4 while raising the potential at the node N4, thus the level "LOW". The bit line-data, can be retrieved at the node N4 as "LOW" even though the level "LOW" is higher than the threshold level of the first latch 1a.

The sense amplifier 141d in the fourth embodiment is simple in its operation compared to the sense amplifiers 141a, 141b and 141c in FIGS. 60, 63 and 64, respectively.

On the other hand, at the moment T5 in FIG. 67, a level "HIGH" at the node N1 decided by charge distribution from the node N4 too low, or lower than the threshold level of the first latch 1a results in failure in "0"-data retrieval. Thus, compared to the circuits in FIGS. 60, 63 and 64, the sense amplifier 141d in FIG. 66 has a low flexibility in bit line potential settings for retrieval operation.

(Fifth Modification)

Figure 68:
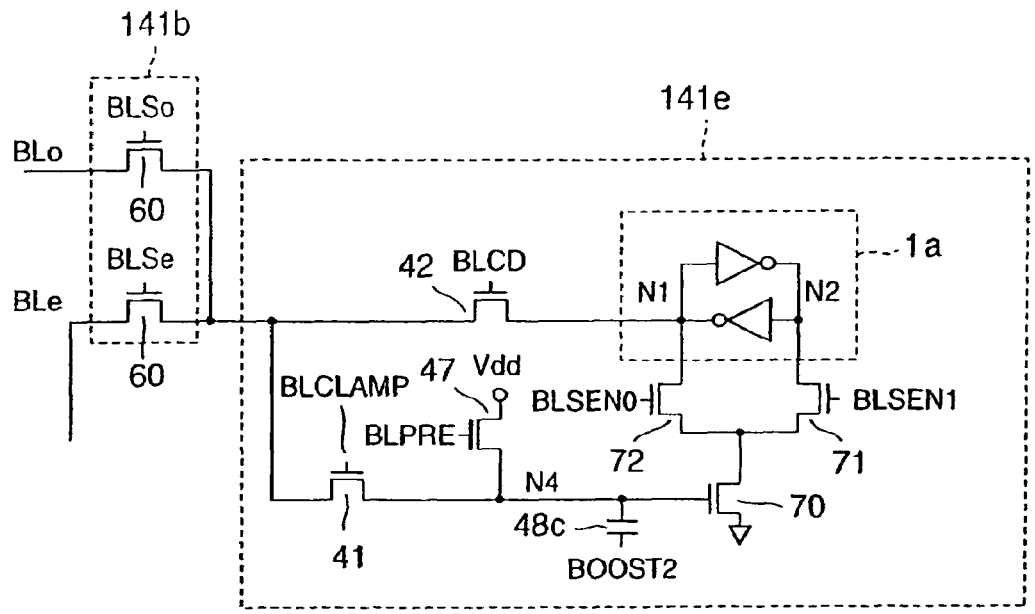
FIG. 68 shows a circuit diagram of the fifth modification to a sense amplifier according to the present invention.

FIG. 68 shows a circuit diagram of the fifth modification to the sense amplifier.

Elements in this modification that are the same as or analogous to elements in the foregoing modifications are referenced by the same reference numbers and will not be explained in detail.

In the foregoing modifications in FIGS. 60, 63, 64 and 66, the data at the node N4 is directly transferred to the node N1 of the first latch 1a via the NMOS transistor 42.

On the other hand, in FIG. 68, the node N4 is connected to the gate of a sense transistor NMOS 70, thus the data at the node N4 is transferred to the node N1 via the transistor 70. The source of the transistor 70 is grounded while the drain is connected to the nodes N1 and N2 via switching transistors 71 and 72.

Also connected to the node N4 is the boosting capacitor 48c having the terminal BOOST2, like shown in FIG. 60.

Figure 69:
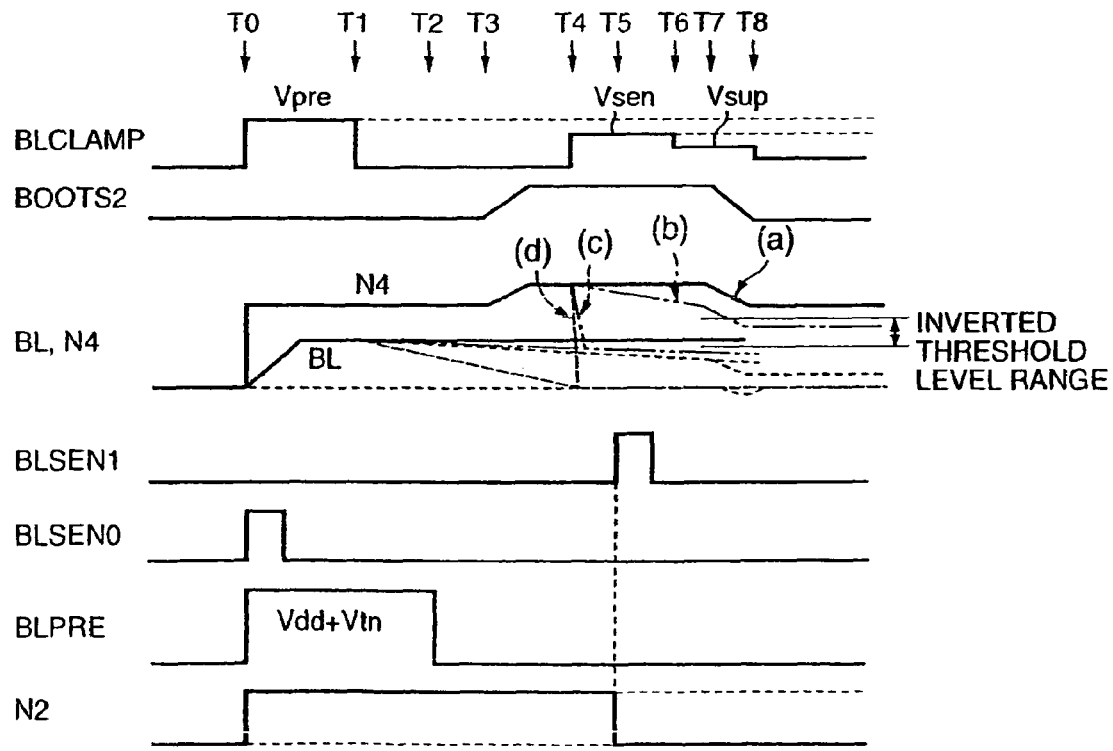
FIG. 69 illustrates signal waveforms in the sense amplifier shown in FIG. 68.

A usual retrieval operation in this modification is explained with respect to FIG. 69 illustrating signal waveforms.

At a moment T0, the voltage (Vdd+Vtn) is applied as the potential BLPRE at the gate of the discharging NMOS transistor 47 while applying Vpre as the potential BLCLAMP at the gate of the clamp transistor 41, to pre-charge a selected bit line to (Vpre−Vtn), thus Vdd appearing at the node N4. A control signal BLSEN0 is simultaneously set at Vdd to reset the potentials at the nodes N1 and N2 of the first latch 1a at the levels "HIGH" and "LOW", respectively.

Bit line pre-charging is completed at a moment T1. Then, a selection gate of a NAND cell block is turned on in which the selected bit line is hard to discharge, which depends on data of a selected cell, thus the bit line holds the pre-charged potential. The pre-charging transistor 47 has been turned on by a moment T2. It is then turned off, and at a moment T3, the potential at the terminal BOOST2 of the capacitor 48c is raised by, for example, 1V, to boost the potential at the node N4 by capacitance-coupling.

At a moment T4, the potential BLCLAMP at the gate of the clamp transistor 41 is set at Vsen to retrieve bit line potential in the range of (Vpre−Vsen) while the potential at the node N4 indicates potential change (a) to (d), compared to those shown in FIG. 62.

In this modification, the NMOS transistor 72 is turned on in the change (a) and (b) while turned off in the change (c) and (d).

The control signal BLSEN1 is set at Vdd to turn on the NMOS transistor 71, thus the node N1 of the first latch 1a is inverted to the level "LOW" in the change (a) and (b) while the node N2 is clamped at the level "HIGH" in the change (c) and (d).

The potential at the node N4 is boosted in data sensing in the sense amplifier of this modification. This potential control offers a small size for the transistors 70 to 72 which may otherwise tend to be large due to forcible inversion of the first latch 1a.

The fifth modification loads data into the first latch 1a while the potential at the node N4 is being boosted as indicated in FIG. 69. However, like the first modification of FIG. 60, data may be loaded into the first latch 1a after the potential at the node N4 is released from boosting. Moreover, like the second modification of FIG. 63, besides the boosting capacitor 48c, another capacitor (one of the terminals being grounded) may be connected to the node N4.

Figure 70A:
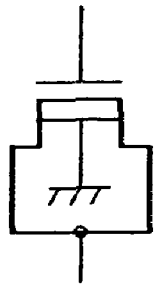
FIGS. 70A to 70C illustrate capacitors used in the foregoing modifications.
Figure 70B:
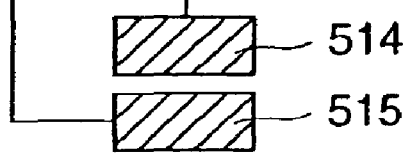
Figure 70C:
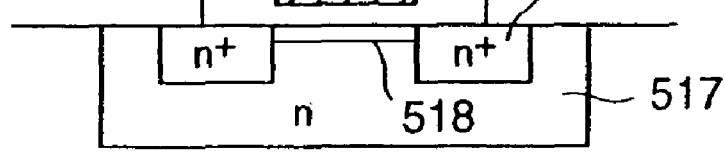

FIGS. 70A to 70C illustrate the capacitors 48c, 48a and 48b, respectively, used in the foregoing modification.

Illustrated in FIG. 70A is a MOS capacitor using a D-type NMOS transistor. The gate may be connected to the node N4 or N1 and the drain and source are both connected as the terminal BOOST2 or ground terminal in the foregoing modifications. It is preferable that the transistor is turned on even when the potential at the terminal BOOST2 is raised from 0V to a positive potential.

Illustrated in FIG. 70B is a capacitor formed between a first layer-polycrystal silicon 515 and a second layer-polycrystal silicon 514. This type of capacitor is applicable to non-volatile memory cells because these cells usually have a stacked-gate structure.

Illustrated in FIG. 70C is a capacitor formed between an n-type well 517 and an electrode 515 formed over the well via an insulating film. The n-type well 517 is formed with an $n^+$-type diffusion layer 516 that is connected to the terminal BOOST2 in the foregoing modifications. It is preferable that an n-type layer 518 of density higher than the n-type well 517 is formed thereon to attain a stable capacitance without respect to the potential at the terminal BOOST2.

As disclosed above, according to the present invention, a re-programming/retrieval circuit (page buffer) having two latches achieves high-speed programming speed by a caching function and large storage capacity by a multilevel function in flash EEPROMs.

The invention claimed is:

1. A method of operating the non-volatile semiconductor memory, the non-volatile semiconductor memory including a string of a plurality of memory cells, a selection transistor coupled to the string of the memory cells, a bit line coupled to the string of the memory cells through the selection transistor, a plurality of word lines coupled to the memory cells, respectively, a first transistor coupled between the bit line and a sense node, a first register coupled to the sense node, and a second transistor coupled between the sense node and a source of a power voltage, the method comprising:

storing data in the first register;

supplying a voltage corresponding to the stored data to the bit line;

applying a program voltage to a selected word line among the word lines, after supplying the voltage corresponding to the stored data;

electrically connecting the bit line to the source of the power voltage through the first and second transistors by applying a first control voltage to the gate of the first transistor, after applying the program voltage to the selected word line;

isolating the bit line from the sense node by applying a second control voltage to the gate of the first transistor, after applying the first control voltage to the gate of the first transistor;

applying a verify read voltage to a selected word line while isolating the bit line from the sense node;

electrically connecting the bit line to the sense source node by applying a third control voltage to the gate of the first transistor so that a voltage on the bit line is reflected to a voltage on the sense node, after isolating the bit line from the sense node;

outputting, to the outside of the non-volatile semiconductor memory, a ready signal indicating that an input of data to the non-volatile semiconductor memory is enable, while applying the program voltage to the selected word line.

2. The method according to claim 1 further comprising:
storing data corresponding to the voltage on the sense node in the first register, while applying the third control voltage to the first transistor.

3. The method according to claim 1 further comprising:
receiving data from the outside of the non-volatile semiconductor memory, while applying the program voltage to the selected word line.

4. The method according to claim 1 further comprising:
outputting an internal busy signal indicating that the non-volatile semiconductor memory is undergoing an operation, while applying the program voltage to the selected word line.

5. The method according to claim 1, wherein
the first transistor is an N-channel transistor;
the first control voltage is higher than the third control voltage; and
the third control voltage is higher than the second control voltage.

6. The method according to claim 1, wherein the first control voltage causes the first transistor to charge the bit line to a voltage lower than the power voltage.

7. The method according to claim 1, wherein the first control voltage causes the first transistor to charge the bit line to a voltage lower than the power voltage.

8. The method according to claim 1 further comprising:
electrically connecting the sense node to the source of the power voltage through the second transistor while applying the verify read voltage to the selected word line.

9. The method according to claim 1 further comprising:
electrically connecting the sense node to the source of the power voltage through the second transistor while isolating the bit line from the sense node.

10. The method according to claim 1 further comprising:
switching the voltage applied to the gate of the first transistor from the third control voltage to a fourth control voltage, the fourth control voltage being different from the second and third control voltages.

11. The method to claim 1, wherein the non-volatile semiconductor memory further includes;
a second register; and
a third transistor coupled between the first and second registers.

12. The method according to claim 11, wherein the non-volatile semiconductor memory further includes;
a data line; and
a selection circuit configured to receive data through the data line and to store, in the second register, data corresponding to the received data, in response to a column selection signal.

13. The method according to claim 11, wherein the step of storing the data in the first register includes
transferring the data stored in the second register from the second register to the first register through the third transistor.

14. The method according to claim 1, wherein the memory is configured to store n bits of data (n being a natural number equal to or larger than two).

15. The method according to claim 1 further comprising:
receiving first and second commands from the outside of the non-volatile semiconductor memory, while outputting the ready signal.

16. The method according to claim 15, wherein the first command is "80H".

17. The method according to claim 15, wherein the second command is "10H".

18. A method of operating the non-volatile semiconductor memory, the non-volatile semiconductor memory including a string of a plurality of memory cells, a selection transistor coupled to the string of the memory cells, a bit line coupled to the string of the memory cells through the selection transistor, a plurality of word lines coupled to the memory cells, respectively, a first transistor coupled between the bit line and a sense node, a first register coupled to the sense node, and a second transistor coupled between the sense node and a source of a power voltage, the first transistor being an N-channel transistor, the method comprising:

storing data in the first register;

supplying a voltage corresponding to the stored data to the bit line;

applying a program voltage to a selected word line among the word lines, after supplying the voltage corresponding to the stored data;

applying a first control voltage to the gate of the first transistor, after applying the program voltage to the selected word line, thereby electrically connecting the bit line to the source of the power voltage through the first and second transistors;

applying a second control voltage to the gate of the first transistor, after applying the first control voltage to the gate of the first transistor, the first control voltage being higher than the second control voltage;

applying a verify read voltage to a selected word line among the word lines while applying the second control voltage to the gate of the first transistor; and outputting, to outside of the non-volatile semiconductor memory a ready signal indicating that an input of data to the non-volatile semiconductor memory is enable, while applying the program voltage to the selected word line.

19. The method according to claim 18, the method further comprising:

storing data corresponding to a voltage on the sense node in the first register, while applying the verify read voltage to the selected word line.

20. The method according to claim 18, the method further comprising:

receiving data from the outside of the non-volatile semiconductor memory, while applying the program voltage to the selected word line.

21. The method according to claim 18, the method further comprising:

outputting an internal busy signal indicating that the non-volatile semiconductor memory is undergoing an operation, while applying the program voltage to the selected word line.

22. The method according to claim 18, wherein the first control voltage causes the first transistor to charge the bit line to a voltage lower than the power voltage.

23. The method according to claim 18, wherein the first control voltage causes the first transistor to charge the bit line to a voltage lower than a voltage on the sense node.

24. The method according to claim 18, wherein the non-volatile semiconductor memory further includes;

a second register; and a third transistor coupled between the first and second registers.

25. The method according to claim 24, wherein the non-volatile semiconductor memory further includes;

a data line; and a selection circuit configured to receive data through the data line and to store, in the second register, data corresponding to the received data, in response to a column selection signal.

26. The method according to claim 24, wherein the step of storing data in the first register includes;

transferring the data stored in the second register from the second register to the first register through the third transistor.

27. The method according to claim 18, wherein the memory is configured to store n bits of data (n being a natural number equal to or larger than two).

28. The method according to claim 18, the method further comprising:

receiving first and second commands from the outside of the non-volatile semiconductor memory, while outputting the ready signal.

29. The method according to claim 28, wherein the first command is "80H".

30. The method according to claim 28, wherein the second command is "10H".

* * * * *